US007864086B2

(12) United States Patent
Monro

(10) Patent No.: US 7,864,086 B2
(45) Date of Patent: Jan. 4, 2011

(54) MODE SWITCHED ADAPTIVE COMBINATORIAL CODING/DECODING FOR ELECTRICAL COMPUTERS AND DIGITAL DATA PROCESSING SYSTEMS

(76) Inventor: Donald Martin Monro, 6, The Lays, Goose Street, Beckington, Somerset BA 11 6RS (GB)

( * ) Notice: Subject to any disclaimer, the term of this patent is extended or adjusted under 35 U.S.C. 154(b) by 150 days.

(21) Appl. No.: 12/246,426

(22) Filed: Oct. 6, 2008

(65) Prior Publication Data

US 2010/0085221 A1 Apr. 8, 2010

(51) Int. Cl.
*H03M 7/00* (2006.01)
(52) U.S. Cl. .......................................... 341/107; 382/247
(58) Field of Classification Search .................. 341/107, 341/106, 65, 67, 50, 51; 382/233, 234, 239, 382/247, 303, 304; 348/387
See application file for complete search history.

(56) References Cited

U.S. PATENT DOCUMENTS

| 4,168,513 | A | 9/1979 | Hains et al. |
| 4,509,038 | A | 4/1985 | Hirano |
| 4,558,302 | A | 12/1985 | Welch |
| 4,675,809 | A | 6/1987 | Omoda et al. |
| 4,908,873 | A | 3/1990 | Philbert et al. |
| 5,218,435 | A | 6/1993 | Lim et al. |
| 5,315,670 | A | 5/1994 | Shapiro |
| 5,321,776 | A | 6/1994 | Shapiro |
| 5,365,237 | A | 11/1994 | Johnson et al. |
| 5,412,741 | A | 5/1995 | Shapiro |
| 5,539,207 | A | 7/1996 | Wong |
| 5,559,931 | A | 9/1996 | Shindou et al. |
| 5,585,852 | A | 12/1996 | Agarwal |
| 5,635,932 | A | 6/1997 | Shinagawa et al. |
| 5,699,121 | A | 12/1997 | Zakhor et al. |
| 5,748,786 | A | 5/1998 | Zandi et al. |
| 5,754,704 | A | 5/1998 | Barnsley et al. |
| 5,768,437 | A | 6/1998 | Monro et al. |
| 5,819,017 | A | 10/1998 | Akeley et al. |
| 5,873,076 | A | 2/1999 | Barr et al. |
| 5,910,999 | A | 6/1999 | Mukohzaka |
| 5,956,429 | A | 9/1999 | Burns |

(Continued)

FOREIGN PATENT DOCUMENTS

CA 2539040 A1 3/2005

(Continued)

OTHER PUBLICATIONS

Anonymous, "Conversion Between Different Number Systems", Internet Article, [Online] Nov. 11, 2002, XP002494744, URL: http://www.cstc.org/data/resources/60/convexp.html>.

(Continued)

*Primary Examiner*—Joseph Lauture
(74) *Attorney, Agent, or Firm*—Berkeley Law & Technology Group, LLP

(57) ABSTRACT

Embodiments described herein may include example embodiments of a method, article and apparatus for compressing data utilizing adaptive combinatorial encoding with either specified occurrences or specified data length which may be used for communicating between two or more components connected to an interconnection medium (e.g., a bus) within a single computer or digital data processing system, and/or for communication between computing platforms via a network or other interconnection medium.

20 Claims, 4 Drawing Sheets

U.S. PATENT DOCUMENTS

| | | | |
|---|---|---|---|
| 6,026,198 A * | 2/2000 | Okada | 382/247 |
| 6,029,167 A | 2/2000 | Evans | |
| 6,037,883 A | 3/2000 | Forbes | |
| 6,052,416 A | 4/2000 | Koga | |
| 6,078,619 A | 6/2000 | Monro et al. | |
| 6,086,706 A | 7/2000 | Brassil et al. | |
| 6,125,348 A | 9/2000 | Levine | |
| 6,144,835 A | 11/2000 | Inoue | |
| 6,148,106 A | 11/2000 | Impagliazzo | |
| 6,208,744 B1 | 3/2001 | Ishige et al. | |
| 6,225,925 B1 | 5/2001 | Bengio et al. | |
| 6,272,241 B1 | 8/2001 | Tattersall | |
| 6,281,817 B2 | 8/2001 | Bengio et al. | |
| 6,336,050 B1 | 1/2002 | Amin et al. | |
| 6,353,244 B1 | 3/2002 | Yamazaki et al. | |
| 6,373,411 B1 | 4/2002 | Shoham | |
| 6,434,542 B1 | 8/2002 | Farmen et al. | |
| 6,476,740 B1 | 11/2002 | Bengio et al. | |
| 6,480,547 B1 | 11/2002 | Chen et al. | |
| 6,489,902 B2 | 12/2002 | Heath | |
| 6,522,785 B1 | 2/2003 | Kondo et al. | |
| 6,549,148 B2 | 4/2003 | Satoh | |
| 6,556,719 B1 | 4/2003 | Monro | |
| 6,563,438 B2 | 5/2003 | Satoh | |
| 6,587,507 B1 | 7/2003 | Chui | |
| 6,614,847 B1 | 9/2003 | Das | |
| 6,625,213 B2 | 9/2003 | Bottreau et al. | |
| 6,654,503 B1 | 11/2003 | Sudharsanan et al. | |
| 6,661,839 B1 | 12/2003 | Ishida et al. | |
| 6,703,596 B1 | 3/2004 | Moran | |
| 6,707,400 B2 | 3/2004 | Christofferson et al. | |
| 6,714,147 B2 | 3/2004 | Huber et al. | |
| 6,747,736 B2 | 6/2004 | Takahashi | |
| 6,777,684 B1 | 8/2004 | Volkov et al. | |
| 6,782,132 B1 | 8/2004 | Fogg | |
| 6,810,144 B2 | 10/2004 | McGee et al. | |
| 6,816,605 B2 | 11/2004 | Rowe et al. | |
| 6,820,079 B1 | 11/2004 | Evans | |
| 6,847,966 B1 | 1/2005 | Sommer | |
| 6,870,619 B1 | 3/2005 | Tenhunen et al. | |
| 6,982,742 B2 | 1/2006 | Adair | |
| 6,985,965 B2 | 1/2006 | Hannu et al. | |
| 6,990,145 B2 | 1/2006 | Monro et al. | |
| 7,003,039 B2 | 2/2006 | Zakhor et al. | |
| 7,006,567 B2 | 2/2006 | Frossard | |
| 7,015,837 B1 | 3/2006 | Malvar | |
| 7,019,682 B1 | 3/2006 | Louberg et al. | |
| 7,030,789 B1 | 4/2006 | Cideciyan et al. | |
| 7,079,986 B2 | 7/2006 | Sieracki | |
| 7,082,483 B2 | 7/2006 | Poo | |
| 7,124,043 B2 | 10/2006 | Stein et al. | |
| 7,147,153 B2 | 12/2006 | Rowe et al. | |
| 7,155,445 B1 | 12/2006 | Kling et al. | |
| 7,172,563 B2 | 2/2007 | Takiguchi et al. | |
| 7,230,551 B2 | 6/2007 | Moriya et al. | |
| 7,242,812 B2 | 7/2007 | Hwang | |
| 7,265,691 B2 | 9/2007 | Tomic | |
| 7,310,055 B2 | 12/2007 | Odagiri | |
| 7,336,811 B2 | 2/2008 | Takeo | |
| 7,340,013 B2 | 3/2008 | Ammer et al. | |
| 7,352,298 B2 | 4/2008 | Monro | |
| 7,436,884 B2 | 10/2008 | Chen | |
| 7,508,325 B2 | 3/2009 | Monro | |
| 7,511,638 B2 | 3/2009 | Monro | |
| 7,511,639 B2 | 3/2009 | Monro | |
| 7,518,538 B1 | 4/2009 | Schneider | |
| 7,545,291 B2 | 6/2009 | Monro | |
| 7,548,176 B2 | 6/2009 | Monro | |
| 7,602,316 B2 | 10/2009 | Monro | |
| 7,671,767 B2 | 3/2010 | Monro | |
| 7,707,213 B2 | 4/2010 | Monro | |
| 7,707,214 B2 | 4/2010 | Monro | |
| 7,786,903 B2 | 8/2010 | Monro | |
| 7,786,907 B2 | 8/2010 | Monro | |
| 7,791,513 B2 | 9/2010 | Monro | |
| 2002/0067480 A1 | 6/2002 | Takahashi | |
| 2002/0069206 A1 | 6/2002 | Bergman et al. | |
| 2002/0071594 A1 | 6/2002 | Kool et al. | |
| 2003/0058943 A1 | 3/2003 | Zakhor et al. | |
| 2003/0103523 A1 | 6/2003 | Frossard et al. | |
| 2003/0108101 A1 | 6/2003 | Frossard et al. | |
| 2003/0223621 A1 | 12/2003 | Rowe et al. | |
| 2004/0028135 A1 | 2/2004 | Monro | |
| 2004/0126018 A1 | 7/2004 | Monro | |
| 2004/0165737 A1 | 8/2004 | Monro | |
| 2004/0218836 A1 | 11/2004 | Kanatsu | |
| 2004/0240712 A1 | 12/2004 | Rowe et al. | |
| 2005/0043630 A1 | 2/2005 | Buchert | |
| 2005/0049877 A1 | 3/2005 | Agranat | |
| 2005/0084014 A1 | 4/2005 | Wang et al. | |
| 2005/0149296 A1 | 7/2005 | Sieracki | |
| 2005/0192516 A1 | 9/2005 | Takiguchi et al. | |
| 2005/0092191 A1 | 10/2005 | Canon et al. | |
| 2006/0054824 A1 | 3/2006 | Federici et al. | |
| 2006/0064260 A1 | 3/2006 | Stein et al. | |
| 2006/0097176 A1 | 5/2006 | Szu | |
| 2006/0128311 A1 | 6/2006 | Tesfai | |
| 2006/0255277 A1 | 11/2006 | Cole et al. | |
| 2006/0273255 A1 | 12/2006 | Volkov et al. | |
| 2007/0016414 A1 | 1/2007 | Mehrotra et al. | |
| 2007/0029483 A1 | 2/2007 | James et al. | |
| 2007/0030115 A1 | 2/2007 | Itsuji et al. | |
| 2007/0030177 A1 | 2/2007 | Monro | |
| 2007/0052558 A1 | 3/2007 | Monro | |
| 2007/0053434 A1 | 3/2007 | Monro | |
| 2007/0053597 A1 | 3/2007 | Monro | |
| 2007/0053603 A1 | 3/2007 | Monro | |
| 2007/0065034 A1 | 3/2007 | Monro | |
| 2007/0164882 A1 | 7/2007 | Monro | |
| 2007/0210956 A1 | 9/2007 | Hillis et al. | |
| 2007/0211950 A1 * | 9/2007 | Shima | 382/246 |
| 2007/0237365 A1 | 10/2007 | Monro | |
| 2007/0252733 A1 | 11/2007 | Thebault et al. | |
| 2007/0258654 A1 | 11/2007 | Monro | |
| 2007/0262257 A1 | 11/2007 | Monro | |
| 2007/0271250 A1 | 11/2007 | Monro | |
| 2007/0282933 A1 | 12/2007 | Monro | |
| 2007/0290800 A1 | 12/2007 | Fuller | |
| 2007/0290898 A1 | 12/2007 | Monro | |
| 2007/0290899 A1 | 12/2007 | Monro | |
| 2008/0005648 A1 | 1/2008 | Monro | |
| 2008/0014580 A1 | 1/2008 | Alfano et al. | |
| 2008/0056346 A1 | 3/2008 | Monro | |
| 2008/0058619 A1 | 3/2008 | Monro | |
| 2008/0084924 A1 | 4/2008 | Monro | |
| 2008/0086519 A1 | 4/2008 | Monro | |
| 2008/0097183 A1 | 4/2008 | Monro | |
| 2008/0161674 A1 | 7/2008 | Monro | |
| 2008/0205505 A1 | 8/2008 | Monro | |
| 2008/0205523 A1 | 8/2008 | Monro | |
| 2009/0016452 A1 | 1/2009 | Monro | |
| 2009/0016453 A1 | 1/2009 | Monro | |
| 2009/0019070 A1 | 1/2009 | Monro | |
| 2009/0019071 A1 | 1/2009 | Monro | |
| 2010/0085219 A1 | 4/2010 | Monro | |
| 2010/0085221 A1 | 4/2010 | Monro | |
| 2010/0085224 A1 | 4/2010 | Monro | |

FOREIGN PATENT DOCUMENTS

| | | |
|---|---|---|
| DE | 10153407 A1 | 2/2003 |
| EP | 0595599 A2 | 5/1994 |
| EP | 0836325 A1 | 4/1998 |
| EP | 0939554 A2 | 9/1999 |

| | | |
|---|---|---|
| EP | 1545010 A1 | 6/2005 |
| EP | 1610560 A1 | 12/2005 |
| EP | 1868005 A2 | 12/2007 |
| GB | 1488712 A | 10/1977 |
| GB | 2293733 A | 4/1996 |
| GB | 2311368 A | 9/1997 |
| GB | 2409943 A | 7/2005 |
| JP | 60098335 A | 6/1985 |
| JP | 2004265353 A | 9/2004 |
| JP | 2005172775 A | 6/2005 |
| RO | 70605 A2 | 5/1982 |
| RU | 2066117 C1 | 9/1996 |
| UA | 78022 C2 | 2/2007 |
| WO | WO96/17546 A | 6/1996 |
| WO | WO97/16029 | 5/1997 |
| WO | WO98/11730 | 3/1998 |
| WO | WO99/08449 | 2/1999 |
| WO | WO01/63935 A1 | 2/2001 |
| WO | WO01/15456 A1 | 3/2001 |
| WO | WO01/48681 A2 | 7/2001 |
| WO | WO02/13538 A1 | 2/2002 |
| WO | WO02/084605 A2 | 10/2002 |
| WO | WO2004/031954 A2 | 4/2004 |
| WO | WO2004/051863 A1 | 6/2004 |
| WO | WO2004/086939 A2 | 10/2004 |
| WO | WO2005/026833 A3 | 3/2005 |
| WO | WO2005/027049 A1 | 3/2005 |
| WO | WO2005/064799 A1 | 7/2005 |
| WO | WO2005/067661 A2 | 7/2005 |
| WO | WO2005/092191 A1 | 10/2005 |
| WO | WO2005/119581 A1 | 12/2005 |
| WO | WO2006/082550 A1 | 8/2006 |
| WO | WO2007/030702 A2 | 3/2007 |
| WO | WO2007/030784 A2 | 3/2007 |
| WO | WO2007/030785 A2 | 3/2007 |
| WO | WO2007/030788 A2 | 3/2007 |
| WO | 2007/008864 | 4/2007 |
| WO | WO2007/084336 A2 | 7/2007 |
| WO | WO2007/118219 A2 | 10/2007 |
| WO | WO2007/118220 A2 | 10/2007 |
| WO | WO2007/145875 A2 | 12/2007 |
| WO | WO2007/149358 A1 | 12/2007 |
| WO | WO2007/149383 A2 | 12/2007 |
| WO | WO2007/149384 A2 | 12/2007 |
| WO | WO2008/013704 A3 | 1/2008 |
| WO | WO2008/027450 A2 | 3/2008 |
| WO | WO2008/030425 | 3/2008 |
| WO | WO2008/030426 A2 | 3/2008 |
| WO | WO2008/030427 | 3/2008 |
| WO | WO2008/045280 | 4/2008 |
| WO | WO2008/045281 | 4/2008 |
| WO | WO2008/085398 | 7/2008 |
| WO | WO2008/103321 | 8/2008 |
| WO | WO2008/103322 | 8/2008 |
| WO | WO2008/103348 | 8/2008 |
| WO | WO2008/143991 | 11/2008 |
| WO | WO2009/009574 | 1/2009 |
| WO | WO2009/009577 | 1/2009 |
| WO | WO2009/009599 | 1/2009 |
| WO | WO2009/009602 | 1/2009 |

OTHER PUBLICATIONS

Bao, et. al, "A New Text Feature Extraction Model and its Application in Document Copy Detection", Machine Learning and Cybernetics, 2003, International Conference on Nov. 2-5, 2003, Piscataway, NJ, USA, IEEE, vol. 1, Nov. 2, 2003, pp. 82-87.

Bose, et. al, "Lee Distance Gray Codes", Information Theory, 1995, Proceedings 1995 IEEE International Symposium, Whistler, BC, Canada, Sep. 17-22, 1995, New York, NY, IEEE, US, Sep. 17, 1995, p. 236, XP010192708.

Brin, et. al, "Copy Detection Mechanisms for Digital Documents", Proceedings of the 1995 ACM SIGMOD International Conference on Management of Data SIGMOD '95, vol. 24, ACM Press, May 1995, pp. 398-409.

Cancedda, et. al, "Word Sequence Kernels", Mar. 2003, MIT Press, Journal of Medicine Learning Research, vol. 3, Special Edition, pp. 1059-1082.

Cotter, et. al, "Application of Tree-Based Searches to Matching Pursuit", 2001 IEEE International Conference on Acoustics, Speech, and Signal Processing, New York, NY, vol. 6, May 2001, pp. 3933-3936.

Cover, et. al, "Elements of Information Theory", Copyright Jon Wiley & Sons, Inc., p. 96, 1991.

Czerepinski, et. al, "Matching Pursuits Video Coding: Dictionaries and Fast Implementation" IEEE Trans Circuit Systems Video Technology, vol. 10, No. 7, pp. 1103-1115, Oct. 2000.

Database WPI Week 200547, Derwent Publications Ltd., London, GB; AN 2005-462389 & JP 2005-172775 (ZH Handotai Kenkyu Shinkokai) Jun. 30, 2005.

Daubechies, "Orthonormal Bases of Compactly Supported Wavelets", Comm. Pure Appl. Math., vol. 41, pp. 909-996, 1988.

DeNatale, et. al, A Mesh-Interpolation Scheme for Very-Low Bitrate Coding of Video Sequences, European Transactions on Telecommunications, vol. 9, No. 1, pp. 47-55, 1998.

DeVleeschouwer, et. al, "Subband Dictionaries for Low-cost Matching Pursuits of Video Residues", IEEE Transactions on Circuits and Systems for Video Technology, vol. 9, Issue 7, pp. 984-993, Oct. 1999.

Figueras, et. al, "Color Image Scalable Coding with Matching Pursuit", IEEE Int. Conference Acoustics Speech Signal Process, pp. III-53-56, May 2004.

Frossard, et. al, "High Flexibility Scalable Image Coding", Proceedings of VCIP 2003, Jul. 2003.

Gamito, et. al, "Lossless Coding of Floating Point Data with JPEG 2000 Part 10", Proceedings of the SPIE, SPIE, Bellingham, VA, US, vol. 5558, Aug. 2, 2004, pp. 276-287.

Globus, et. al, "Submillimeter-Wave Fourier Transform Spectroscopy of Biological Macromolecules", Journal of Applies Physics, vol. 91, No. 9, May 1, 2002, pp. 6105-6115.

Globus, et. al, "Terahertz Fourier Transform Characterization of Biological Materials in a Liquid Phase", Journal of Physics D. Applied Physics, Institute of Physics Publishing, Bristol, GB, vol. 39, No. 15, Aug. 7, 2006, pp. 3405-3413.

Golomb, S.B., "Run-length Encodings", IEEE Trans Information Theory, Jul. 1966, 12(3):399-401.

Horst, et. al, "Mupcos: A Multi-Purpose Coding Scheme", Signal Processing: Image Communication 5, pp. 75-89, 1993.

Hosang, M., "A Character Elimination Algorithm for Lossless Data Compression", Data Compression Conference, Proceedings DCC, IEEE Computer Society Press, Los Alamitos, CA, US, Apr. 2, 2002, pp. 1-10.

Huffman, David A., "A Method for the Construction of Minimum-Redundancy Codes", Pro. Inst. Radio Eng., 1952, 9(40), pp. 1098-1101.

Hull, Jonathan J., "Document Image Matching and Retrieval with Multiple Distortion Invariant Descriptors", International Association for Pattern Recognition Workshop on Document Analysis Systems, Series in Machine Perception and Artificial Intelligence, vol. 14, published by World Scientific Publishing Co. Pte. Ltd. 1995, pp. 379-396.

Ju, Jing, See "Millimeter Wave Absorption Spectroscopy of Biological Polymers", PhD Thesis, Stevens Institute of Technology, 92 pgs., 2001.

Larsson, N.J., "The Context Trees of Block Sorting Compression", In Proceedings of the IEEE Data Compression Conference, Snowbird, Utah, Mar. 30-Apr. 1, pp. 189-198, IEEE Computer Society Press, 1998.

Liu, et. al, "A Low-Cost Video Encoder with Matching Pursuit", Intelligent Multimedia, Video and Speech Processing, May 2, 2001, pp. 502-505.

Mallat, "A Theory for Multiresolution Signal Decomposition: The Wavelet Representation", IEEE Trans. Pattern Anal. Mach. Intel., vol. 11, No. 7, Jul. 1989.

Mallat, et. al, "Matching Pursuits with Time-Frequency Dictionaries", IEEE Trans. Signal Processing, vol. 41, No. 12, pp. 3397-3415, Dec. 1993.

Marusic, et. al, "A Matching Pursuit Enhanced Three-Dimensional Wavelet Transform Coder", Electrotechnical Conference, 2000, MELECON 2000, 10th Mediterranean, Publication Date: 2000, vol. 2, On pp. 482-485.

Monro, "Basis Picking for Matching Pursuits Image Coding", IEEE International Conference on Image Processing, pp. 2495-2498, Sep. 2004.

Monro, et. al, "Alignment Blur in Coherently Averages Images", IEEE Transactions on Signal Processing, vol. 4, No. 6, pp. 1596-1601, Jun. 1996.

Monro, et. al, "Bases for Low Complexity Matching Pursuits Image Coding", Dept. of Electronic & Electrical Engineering., Bath University, UK, 2005, IEEE International Conference on Image Processing, Publication Date Sep. 11-14, 2005, vol. 2, pp. 249-252. www.http://dmsun4.bath.ac.uk.

Monro, et. al, "Improved Coding of Atoms in Matching Pursuits", IEEE Int. Conf. Image Process, vol. 2, Sep. 2003.

Monro, et. al, "Subband Adaptive Dictionaries for Wavelet/Matching Pursuits Image Coding", Oct. 8, 2006, Image Processing, p. 2136.

Monro, et. al, "Visual Embedding of Wavelet Transform Coefficients", IEEE International Conference Image Process, pp. 186-189, Sep. 2000.

Moschetti, et.al, "New dictionary and fast atom searching method for matching pursuit representation of displaced frame difference," in Proceedings of International Conference on Image Processing (ICIP '02), vol. 3, pp. 685-688, Rochester, NY, USA, Sep. 2002.

Neff, et. al, "Very Low Bit-Rate Video Coding Based on Matching Pursuits", IEEE Trans. Circuits and Systems for Video Tech., vol. 7, No. 1, pp. 158-171, Feb. 1997.

Neff, et. al, "Matching Pursuit Video Coding-Part I: Dictionary Approximation", IEEE Trans. Circuits System Video Technology, vol. 12, No. 1, pp. 13-26, Jan. 2002.

Park, et. al, "Lost Motion Vector Recovery Algorithm", Circuits and Systems, IEEE International Symposium on London, vol. 3, 1994, pp. 229-232.

Peng, et. al, "Matching Pursuits Low Bit Rate Video Coding with Codebooks Adaptation", Jun. 5, 2000, Acoustics, Speech, and Signal Processing, pp. 408-411.

Poh, et. al, "Comparison of Residual Compression Methods in Motion Compensated Video", IEEE Int. Workshop on Multimedia Signal Processing, pp. 109-112, Dec. 2002.

Rabiee, et. al, "Low-bit-rate Subband Image Coding with Matching Pursuits", Visual Communications and Image Processing, vol. 3309, 1998, pp. 875-880.

Rabiee, et. al, "Scalable Subband Image Coding with Segmented Orthogonal Matching Pursuit", Oct. 4, 1998, Image Processing, pp. 774-777.

Ramchandran, et. al, "Best Wavelet Packet Bases in a Rate-Distortion Sense", IEEE Transactions on Signal Processing, vol. 2, No. 2, pp. 160-175, Apr. 1993.

Rice, R.F., "Some Practical Universal Noiseless Coding Techniques", Jet Propulsion Laboratory, Pasadena, California, JPL Publication 79-22, Mar. 1979.

Said, et. al, "A New, Fast, and Efficient Image Codec Based on Set Partitioning in Hierarchical Trees", IEEE Transactions on Circuits and Systems for Video Technology, vol. 5, No. 3, pp. 243-250, Jun. 1996.

Salomon, "Data Compression: The Complete Reference", Springer, XP002464409 pp. 32-33, 1998.

Sayood, Khalid, "Introduction to Data Compression", Morgan Kaufmann Publishers, Inc., San Francisco, CA, USA, 1996, pp. 27-32.

Sayood, Khalid, "Introduction to Data Compression", Morgan Kaufmann Publishers, Inc., San Francisco, CA, USA, 1996, pp. 98-99.

Schleimer, et. al, "Data Security Protection: Winnowing: Local Algorithms for Document Fingerprinting", 2003 ACM SIGMOD International Conference on Management of Data (SIGMOD '03), ACM Press, Jun. 2003, pp. 76-85.

Schmid-Saugeon, et. al, "Dictionary Design for Matching Pursuit and Application to Motion-Compensated Video Coding", 2004, IEEE Transactions on Circuits and Systems for Video Technology, pp. 880-886.

Sekharan, "Identification of Skull from its Suture Pattern", Forensic Science International, Mar. 1985, vol. 27, No. 3, pp. 205-214.

Shapiro, "Embedded Image Coding Using Zerotrees of Wavelet Coefficients", IEEE Transactions on Signal Processing, vol. 41, No. 12, pp. 3445-3462, Dec. 1993.

Shoa et. al, "Tree Structure Search for Matching Pursuit", Image Processing, 2005, vol. 3, 11, pp. 908-911.

Steffen, et. al, "Theory of Regular M-band Wavelet Bases", IEEE Transactions on Signal Processing, vol. 41, No. 12, pp. 3497-3511, Dec. 1993.

Teuhola, J., "A Compression Method for Clustered Bit-Vectors", Information Processing Letters, Amsterdam, NL, vol. 7, No. 6, pp. 308-311, Oct. 1978.

Tian, et. al, "Image Data Processing in the Compressed Wavelet Domain", Proceedings of ICSP '96, pp. 978-981, 1996.

Tredwell, et. al, "A Sequential Vector Selection Algorithm for Controllable Bandwidth Motion Description Encoding", IEEE Symposium Intell. Multimedia. Video & Speech Process, May 2001.

Trott, et. al, "Wavelets Applied to Lossless Compression and Progressive Transmission of Floating Point Data in 3-D Curvilinear Grids", IEEE Proceedings of the Visualization Conference, Oct. 27, 1996, 385-388.

Van Zandt, et. al, "Millimeter-Microwave Spectrum of DNA: Six Predictions for Spectroscopy", Phys. Rev. A, vol. 39, Issue 5, pp. 2672-2674, Mar. 1, 1989.

Woolard, et. al, "Millimeter Wave-Induced Vibrational Modes in DNA as a Possible Alternative to Animal Tests to Proble for Carcinogenic Mutations", Journal of Applied Toxicology, Wiley Heyden LTD, GB, vol. 17, No. 4, Aug. 1997, pp. 243-246.

Yuan, et. al, "3D Wavelet Video Coding with Replicated Matching Pursuits", Sep. 11, 2005, Image Processing, pp. 69-72.

Yuan, et. al, "Improved Matching Pursuits Image Coding", IEEE International Conference on Acoustics, Speech and Signal Processing ICASSP 2005, pp. II-201-204, Mar. 2005.

Yuan, et. al, "Low Complexity Separable Matching Pursuits", IEEE Int. Conference Acoustics Speech Signal Process, pp. III-725-728, May 2004.

Zhang, et. al, "A Hybrid Video Coder Based on H.264 with Matching Pursuits", Acoustics, Speech and Signal Processing, 2006, p. 889.

Zhang, et. al, "A Rate Estimation Framework for Matching Pursuits Video Coding", Journal of Multimedia, pp. 36-45, vol. 2, No. 3, Academy Publisher, Jun. 2007.

U.S. Appl. No. 11/222,656 / 20070065034: Jan. 19, 2010 Amendment, 18 pages.

U.S. Appl. No. 11/222,656 / 20070065034: Jan. 22, 2009 Amendment, 21 pages.

U.S. Appl. No. 11/222,656 / 20070065034: Feb. 18, 2010 Non-final office action, 19 pages.

U.S. Appl. No. 11/222,656 / 20070065034: Feb. 19, 2009 Final office action, 15 pages.

U.S. Appl. No. 11/222,656 / 20070065034: Apr. 16, 2009 Amendment, 17 pages.

U.S. Appl. No. 11/222,656 / 20070065034: Apr. 16, 2010 Examiner interview summary, 4 pages.

U.S. Appl. No. 11/222,656 / 20070065034: May 8, 2009 Advisory action, 4 pages.

U.S. Appl. No. 11/222,656 / 20070065034: Jul. 22, 2008 Non-final office action, 36 pages.

U.S. Appl. No. 11/222,656 / 20070065034: Aug. 19, 2009 RCE, 18 pages.

U.S. Appl. No. 11/222,656 / 20070065034: Oct. 19, 2009 Non-final office action, 17 pages.

U.S. Appl. No. 11/222,656 / 20070065034: Dec. 31, 2009 Office action appendix and Examiner interview summary, 7 pages.

U.S. Appl. No. 11/222,665 / 20070053597: Jan. 13, 2010 Examiner interview summary, 4 pages.

U.S. Appl. No. 11/222,665 / 20070053597: Jan. 22, 2010 Amendment, 11 pages.

U.S. Appl. No. 11/222,665 / 20070053597: Feb. 23, 2009 Final office action, 17 pages.
U.S. Appl. No. 11/222,665 / 20070053597: Mar. 9, 2010 Final office action, 15 pages.
U.S. Appl. No. 11/222,665 / 20070053597: Apr. 23, 2009 Amendment, 12 pages.
U.S. Appl. No. 11/222,665 / 20070053597: May 1, 2009 Advisory action, 3 pages.
U.S. Appl. No. 11/222,665 / 20070053597: May 21, 2009 RCE, 1 page.
U.S. Appl. No. 11/222,665 / 20070053597: Jul. 22, 2008 Non-final office action, 29 pages.
U.S. Appl. No. 11/222,665 / 20070053597: Jul. 23, 2009 Non-final office action, 16 pages.
U.S. Appl. No. 11/222,665 / 20070053597: Oct. 20, 2009 Examiner interview summary, 4 pages.
U.S. Appl. No. 11/222,665 / 20070053597: Nov. 22, 2009 Amendment, 13 pages.
U.S. Appl. No. 11/222,667 / 20070053434: Jan. 13, 2010 Examiner interview summary, 4 pages.
U.S. Appl. No. 11/222,667 / 20070053434: Jan. 26, 2009 Amendment, 14 pages.
U.S. Appl. No. 11/222,667 / 20070053434: Feb. 3, 2010 Amendment, 12 pages.
U.S. Appl. No. 11/222,667 / 20070053434: Feb. 23, 2009 Final office action, 20 pages.
U.S. Appl. No. 11/222,667 / 20070053434: Mar. 17, 2010 Examiner interview summary, 3 pages.
U.S. Appl. No. 11/222,667 / 20070053434: Mar. 24, 2010 Final office action, 15 pages.
U.S. Appl. No. 11/222,667 / 20070053434: Apr. 14, 2010 Examiner interview summary, 4 pages.
U.S. Appl. No. 11/222,667 / 20070053434: Apr. 23, 2009 Amendment, 11 pages.
U.S. Appl. No. 11/222,667 / 20070053434: Jul. 24, 2008 Non-final office action, 29 pages.
U.S. Appl. No. 11/222,667 / 20070053434: Aug. 24, 2009 RCE with amendment, 11 pages.
U.S. Appl. No. 11/222,667 / 20070053434: Nov. 3, 2009 Nonfinal office action, 17 pages.
U.S. Appl. No. 11/222,670 / 20070053603: Jan. 13, 2010 Examiner interview summary, 4 pages.
U.S. Appl. No. 11/222,670 / 20070053603: Jan. 22, 2009 Amendment, 13 pages.
U.S. Appl. No. 11/222,670 / 20070053603: Feb. 8, 2010 RCE with amendment, 14 pages.
U.S. Appl. No. 11/222,670 / 20070053603: Feb. 23, 2009 Non-final office action, 21 pages.
U.S. Appl. No. 11/222,670 / 20070053603: Mar. 24, 2010 Non-final office action, 18 pages.
U.S. Appl. No. 11/222,670 / 20070053603: Jul. 23, 2008 Non-final office action, 30 pages.
U.S. Appl. No. 11/222,670 / 20070053603: Aug. 24, 2009 Amendment, 10 pages.
U.S. Appl. No. 11/222,670 / 20070053603: Oct. 7, 2009 Final office action, 18 pages.
U.S. Appl. No. 11/255,090 / 20070271250: Jan. 14, 2010 Advisory action and affidavits, 4 pages.
U.S. Appl. No. 11/255,090 / 20070271250: Jan. 16, 2009 Examiner interview summary, 4 pages.
U.S. Appl. No. 11/255,090 / 20070271250: Feb. 6, 2008 Non-final office action, 20.pages.
U.S. Appl. No. 11/255,090 / 20070271250: Feb. 22, 2010 Notice of appeal and prebrief conference request, 7 pages.
U.S. Appl. No. 11/255,090 / 20070271250: Feb. 27, 2009 Amendment, 14 pages.
U.S. Appl. No. 11/255,090 / 20070271250: Apr. 21, 2010 Prebrief appeal conference decision, 2 pages.
U.S. Appl. No. 11/255,090 / 20070271250: May 6, 2008 Amendment, 11 pages.
U.S. Appl. No. 11/255,090 / 20070271250: Jun. 25, 2009 Amendment, 15 pages.
U.S. Appl. No. 11/255,090 / 20070271250: Sep. 3, 2008 Final office action, 29 pages.
U.S. Appl. No. 11/255,090 / 20070271250: Oct. 20, 2009 Final office action, 18 pages.
U.S. Appl. No. 11/255,090 / 20070271250: Oct. 31, 2008 Amendment, 13 pages.
U.S. Appl. No. 11/255,090 / 20070271250: Nov. 14, 2008 Advisory action, 3 pages.
U.S. Appl. No. 11/255,090 / 20070271250: Dec. 3, 2008 RCE with amendment, 21 pages.
U.S. Appl. No. 11/255,090 / 20070271250: Dec. 9, 2009 Amendment, 16 pages.
U.S. Appl. No. 11/255,090 / 20070271250: Dec. 15, 2008 Non-final office action, 18 pages.
U.S. Appl. No. 11/255,090 / 20070271250: Dec. 15, 2009 Advisory action and affidavits, 4 pages.
U.S. Appl. No. 11/255,090 / 20070271250: Dec. 29, 2009 Amendment, 16 pages.
U.S. Appl. No. 11/332,777 / 20070164882: Feb. 18, 2010 Prebrief conference decision, 2 pages.
U.S. Appl. No. 11/332,777 / 20070164882: Feb. 18, 2010 Prebrief conference decision, 4 pages.
U.S. Appl. No. 11/332,777 / 20070164882: Feb. 26, 2009 Non-final office action, 15 pages.
U.S. Appl. No. 11/332,777 / 20070164882: Mar. 18, 2010 Appeal brief, 30 pages.
U.S. Appl. No. 11/332,777 / 20070164882: Mar. 31, 2009 Examiner interview summary, 8 pages.
U.S. Appl. No. 11/332,777 / 20070164882: May 7, 2009 Amendment, 22 pages.
U.S. Appl. No. 11/332,777 / 20070164882: May 21, 2008 Amendment, 24 pages.
U.S. Appl. No. 11/332,777 / 20070164882: Aug. 7, 2009 Final office action, 16 pages.
U.S. Appl. No. 11/332,777 / 20070164882: Aug. 13, 2008 Final office action, 24 pages.
U.S. Appl. No. 11/332,777 / 20070164882: Oct. 14, 2008 Amendment, 20 pages.
U.S. Appl. No. 11/332,777 / 20070164882: Oct. 24, 2008 Advisory action, 7 pages.
U.S. Appl. No. 11/332,777 / 20070164882: Oct. 27, 2009 Amendment, 21 pages.
U.S. Appl. No. 11/332,777 / 20070164882: Nov. 3, 2009 Advisory action, 7 pages.
U.S. Appl. No. 11/332,777 / 20070164882: Dec. 7, 2009 Notice of appeal and prebrief conference request, 7 pages.
U.S. Appl. No. 11/332,777 / 20070164882: Dec. 15, 2008 RCE with amendment, 22 pages.
U.S. Appl. No. 11/332,777 / 20070164882: Dec. 21, 2007 Non-final office action, 9 pages.
U.S. Appl. No. 11/378,662 / 20070052558: Feb. 5, 2010 Non-final office action, 23 pages.
U.S. Appl. No. 11/378,662 / 20070052558: Mar. 30, 2009 Amendment, 13 pages.
U.S. Appl. No. 11/378,662 / 20070052558: Jun. 20, 2008 Non-final office action, 29 pages.
U.S. Appl. No. 11/378,662 / 20070052558: Jul. 8, 2009 Final office action, 19 pages.
U.S. Appl. No. 11/378,662 / 20070052558: Sep. 8, 2009 Amendment, 12 pages.
U.S. Appl. No. 11/378,662 / 20070052558: Sep. 22, 2008 Amendment, 14 pages.
U.S. Appl. No. 11/378,662 / 20070052558: Sep. 23, 2009 Advisory action, 4 pages.
U.S. Appl. No. 11/378,662 / 20070052558: Oct. 8, 2009 RCE with amendment, 13 pages.
U.S. Appl. No. 11/378,662 / 20070052558: Dec. 29, 2008 Non-final office action, 23 pages.
U.S. Appl. No. 11/399,752 / 20070237365: Jan. 14, 2010 Non-final office action, 15 pages.
U.S. Appl. No. 11/399,752 / 20070237365: Mar. 17, 2010 Amendment, 13 pages.

U.S. Appl. No. 11/399,752 / 20070237365: Aug. 25, 2009 Non-final office action, 35 pages.
U.S. Appl. No. 11/399,752 / 20070237365: Oct. 28, 2008 Preliminary amendment, 9 pages.
U.S. Appl. No. 11/399,752 / 20070237365: Oct. 29, 2009 Amendment, 14 pages.
U.S. Appl. No. 11/399,752 / 20070237365: Dec. 10, 2007 Preliminary amendment, 7 pages.
U.S. Appl. No. 11/399,753 / 20070258654: Mar. 9, 2010 Amendment, 16 pages.
U.S. Appl. No. 11/399,753 / 20070258654: Apr. 29, 2009 Preliminary amendment, 11 pages.
U.S. Appl. No. 11/399,753 / 20070258654: May 30, 2008 Preliminary amendment, 11 pages.
U.S. Appl. No. 11/399,753 / 20070258654: Jun. 2, 2009 Non-final office action, 46 pages.
U.S. Appl. No. 11/399,753 / 20070258654: Aug. 13, 2009 Amendment, 14 pages.
U.S. Appl. No. 11/399,753 / 20070258654: Dec. 10, 2009 Non-final office action, 35 pages.
U.S. Appl. No. 11/425,137 / 20080005648: Feb. 26, 2010 RCE with amendment, 10 pages.
U.S. Appl. No. 11/425,137 / 20080005648: Mar. 29, 2010 Notice of allowance, 16 pages.
U.S. Appl. No. 11/425,137 / 20080005648: May 26, 2009 Non-final office action, 36 pages.
U.S. Appl. No. 11/425,137 / 20080005648: Aug. 25, 2009 Amendment, 16 pages.
U.S. Appl. No. 11/425,137 / 20080005648: Dec. 1, 2009 Notice of allowance, 14 pages.
U.S. Appl. No. 11/425,137 / 20080005648: Dec. 26, 2007 Preliminary amendment, 16 pages.
U.S. Appl. No. 11/425,138 / 20070290898: Feb. 7, 2008 Preliminary amendment, 20 pages.
U.S. Appl. No. 11/425,138 / 20070290898: Feb. 19, 2010 Non-final office action, 32 pages.
U.S. Appl. No. 11/425,142 / 20070290899: Jan. 16, 2008 Notice of allowance, 25 pages.
U.S. Appl. No. 11/425,142 / 20070290899: Mar. 2, 2009 Final office action, 33 pages.
U.S. Appl. No. 11/425,142 / 20070290899: Mar. 18, 2010 Final office action, 36 pages.
U.S. Appl. No. 11/425,142 / 20070290899: Mar. 20, 2007 Non-final office action, 18 pages.
U.S. Appl. No. 11/425,142 / 20070290899: Apr. 15, 2008 RCE with amendment, 15 pages.
U.S. Appl. No. 11/425,142 / 20070290899: Apr. 29, 2009 Amendment, 17 pages.
U.S. Appl. No. 11/425,142 / 20070290899: May 16, 2008 Notice of allowance, 35 pages.
U.S. Appl. No. 11/425,142 / 20070290899: May 21, 2009 Advisory action, 3 pages.
U.S. Appl. No. 11/425,142 / 20070290899: Jun. 9, 2009 RCE with amendment, 2 pages.
U.S. Appl. No. 11/425,142 / 20070290899: Jun. 20, 2007 Amendment, 14 pages.
U.S. Appl. No. 11/425,142 / 20070290899: Jul. 31, 2008 RCE, 1 page.
U.S. Appl. No. 11/425,142 / 20070290899: Aug. 4, 2009 Non-final office action, 33 pages.
U.S. Appl. No. 11/425,142 / 20070290899: Sep. 16, 2008 Non-final office action, 30 pages.
U.S. Appl. No. 11/425,142 / 20070290899: Sep. 18, 2007 Final office action, 24 pages.
U.S. Appl. No. 11/425,142 / 20070290899: Oct. 17, 2007 Notice of allowance, 2 pages.
U.S. Appl. No. 11/425,142 / 20070290899: Oct. 20, 2009 Amendment, 15 pages.
U.S. Appl. No. 11/425,142 / 20070290899: Nov. 27, 2007 RCE with amendment, 13 pages.
U.S. Appl. No. 11/425,142 / 20070290899: Dec. 16, 2008 Amendment, 15 pages.
U.S. Appl. No. 11/433,073 / 20070262257: Feb. 13, 2009 Notice of abandonment, 2 pages.
U.S. Appl. No. 11/433,073 / 20070262257: Mar. 10, 2008 Non-final office action, 22 pages.
U.S. Appl. No. 11/433,073 / 20070262257: May 8, 2008 Amendment, 18 pages.
U.S. Appl. No. 11/433,073 / 20070262257: Jul. 24, 2008 Final office action, 27 pages.
U.S. Appl. No. 11/433,073 / 20070262257: Sep. 23, 2008 Amendment, 21 pages.
U.S. Appl. No. 11/433,073 / 20070262257: Nov. 28, 2008 Advisory action, 4 pages.
U.S. Appl. No. 11/433,073 / 20070262257: Dec. 26, 2007 Preliminary amendment, 15 pages.
U.S. Appl. No. 11/469,198 / 20080056346: Feb. 14, 2010 Issue fee payment, 1 page.
U.S. Appl. No. 11/469,198 / 20080056346: Mar. 10, 2010 Issue notification, 1 page.
U.S. Appl. No. 11/469,198 / 20080056346: Apr. 25, 2008 Preliminary amendment, 52 pages.
U.S. Appl. No. 11/469,198 / 20080056346: Sep. 4, 2009 Non-final office action, 44 pages.
U.S. Appl. No. 11/469,198 / 20080056346: Sep. 24, 2009 Amendment, 27 pages.
U.S. Appl. No. 11/469,198 / 20080056346: Nov. 2, 2009 Final office action, 13 pages.
U.S. Appl. No. 11/469,198 / 20080056346: Nov. 13, 2009 Amendment and terminal disclaimer, 21 pages.
U.S. Appl. No. 11/469,198 / 20080056346: Dec. 1, 2009 Notice of allowance, 16 pages.
U.S. Appl. No. 11/470,609 / 20080058619: Jan. 9, 2009 Amendment, 22 pages.
U.S. Appl. No. 11/470,609 / 20080058619: Jan. 20, 2010 Final office action, 27 pages.
U.S. Appl. No. 11/470,609 / 20080058619: Feb. 16, 2010 Examiner interview summary, 3 pages.
U.S. Appl. No. 11/470,609 / 20080058619: Mar. 18, 2010 RCE with amendment, 13 pages.
U.S. Appl. No. 11/470,609 / 20080058619: Apr. 7, 2010 Notice of allowance, 17 pages.
U.S. Appl. No. 11/470,609 / 20080058619: Apr. 28, 2008 Preliminary amendment, 36 pages.
U.S. Appl. No. 11/470,609 / 20080058619: Apr. 28, 2009 Final office action 17 pages.
U.S. Appl. No. 11/470,609 / 20080058619: Jun. 17, 2009 Amendment, 13 pages.
U.S. Appl. No. 11/470,609 / 20080058619: Jun. 30, 2009 Non-final office action, 15 pages.
U.S. Appl. No. 11/470,609 / 20080058619: Sep. 23, 2009 Amendment, 12 pages.
U.S. Appl. No. 11/470,609 / 20080058619: Oct. 9, 2008 Non-final office action, 29 pages.
U.S. Appl. No. 11/470,615 / 20080097183: Jan. 5, 2010 Final office action, 23 pages.
U.S. Appl. No. 11/470,615 / 20080097183: Feb. 16, 2010 Examiner interview summary, 3 pages.
U.S. Appl. No. 11/470,615 / 20080097183: Apr. 5, 2010 RCE with amendment, 16 pages.
U.S. Appl. No. 11/470,615 / 20080097183: Apr. 25, 2008 Preliminary amendment, 41 pages.
U.S. Appl. No. 11/470,615 / 20080097183: Jun. 19, 2009 Non-final office action, 50 pages.
U.S. Appl. No. 11/470,615 / 20080097183: Sep. 9, 2009 Amendment, 23 pages.
U.S. Appl. No. 11/539,164 / 20080086519: Apr. 28, 2008 Preliminary amendment, 51 pages.
U.S. Appl. No. 11/539,165 / 20080084924: Apr. 17, 2008 Preliminary amendment, 16 pages.
U.S. Appl. No. 11/618,613 / 20080161674: Apr. 17, 2008 Preliminary amendment, 16 pages.
U.S. Appl. No. 11/678,004 / 20080205505: Apr. 21, 2008 Preliminary amendment, 21 pages.

U.S. Appl. No. 11/678,479 / 20080205523: Apr. 21, 2008 Preliminary amendment, 20 pages.
U.S. Appl. No. 11/777,130 / 20090019070: Jan. 11, 2010 Amendment, 11 pages.
U.S. Appl. No. 11/777,130 / 20090019070: Feb. 1, 2010 Notice of allowance, 21 pages.
U.S. Appl. No. 11/777,130 / 20090019070: Apr. 22, 2009 Preliminary amendment, 9 pages.
U.S. Appl. No. 11/777,130 / 20090019070: Apr. 30, 2010 Issue fee payment, 2 pages.
U.S. Appl. No. 11/777,130 / 20090019070: Oct. 14, 2009 Non-final office action, 20 pages.
U.S. Appl. No. 11/777,230 / 20090019071: May 5, 2009 Preliminary amendment, 9 pages.
U.S. Appl. No. 11/777,239 / 20090016452: Apr. 30, 2009 Preliminary amendment, 7 pages.
U.S. Appl. No. 11/777,256 / 20090016453: May 5, 2009 Preliminary amendment, 7 pages.
U.S. Appl. No. 12/246,357 / 20100085219: Mar. 8, 2010 Non-final office action, 5 pages.
U.S. Appl. No. 12/246,357 / 20100085219: Apr. 30, 2010 Amendment, 9 pages.
U.S. Appl. No. 12/246,409 / 20100085224: Dec. 30, 2009 Notice of allowance, 38 pages.
U.S. Appl. No. 12/246,409 / 20100085224: Mar. 30, 2010 RCE, 3 pages.
PCT/US2006/035002 / WO2007/030702 Sep. 13, 2007 International search report and written opinion, 8 pages.
Notice of Allowance and Notice of Allowability dated Jun. 10, 2010 in co-pending U.S. Appl. No. 12/246,357, 26 pages.
Notice of Allowance and Notice of Allowability dated Jun. 10, 2010 co-pending U.S. Appl. No. 12/246,392, 32 pages.
Notice of Allowance and Notice of Allowability dated Jun. 1, 2010 in co-pending U.S. Appl. No. 12/246,409, 21 pages.

* cited by examiner

MODE SWITCHED ADAPTIVE COMBINATORIAL CODING/DECODING FOR ELECTRICAL COMPUTERS AND DIGITAL DATA PROCESSING SYSTEMS

BACKGROUND

1. Field

The present description relates to data compression, and more specifically data compression utilizing combinatorial coding within electrical computers and digital data processing systems. Subject matter described herein may relate to processes or apparatus for transferring data from one or more peripherals to one or more computers or digital data processing systems for the latter to process, store, and/or further transfer and/or for transferring data from the computers or digital data processing systems to such peripherals. Subject matter disclosed herein may relate to processes or apparatus for interconnecting or communicating between two or more components connected to an interconnection medium a within a single computer or digital data processing system. Subject matter described herein may relate to processes or apparatus for transferring data from one computer or digital processing system to another computer or digital processing system via a network or other interconnection medium.

2. Background Information

In recent years it has become common for persons to share data over networks; however, transmission of data has a cost in terms of bandwidth utilization. Therefore, large amounts of data, for example, are often compressed. Compression may also be used, for example, in storing data on magnetic or other media, in transferring data from one component to another within a computing platform, and/or in transferring data to and/or from a peripheral device to and/or from a computing platform.

BRIEF DESCRIPTION OF THE DRAWINGS

Subject matter is particularly pointed out and distinctly claimed in the concluding portions of the specification. Claimed subject matter, however, both as to organization and the method of operation, together with objects, features and advantages thereof, may be best understood by reference to the following detailed description if read with the accompanying drawings in which:

DETAILED DESCRIPTION

Figure 1:
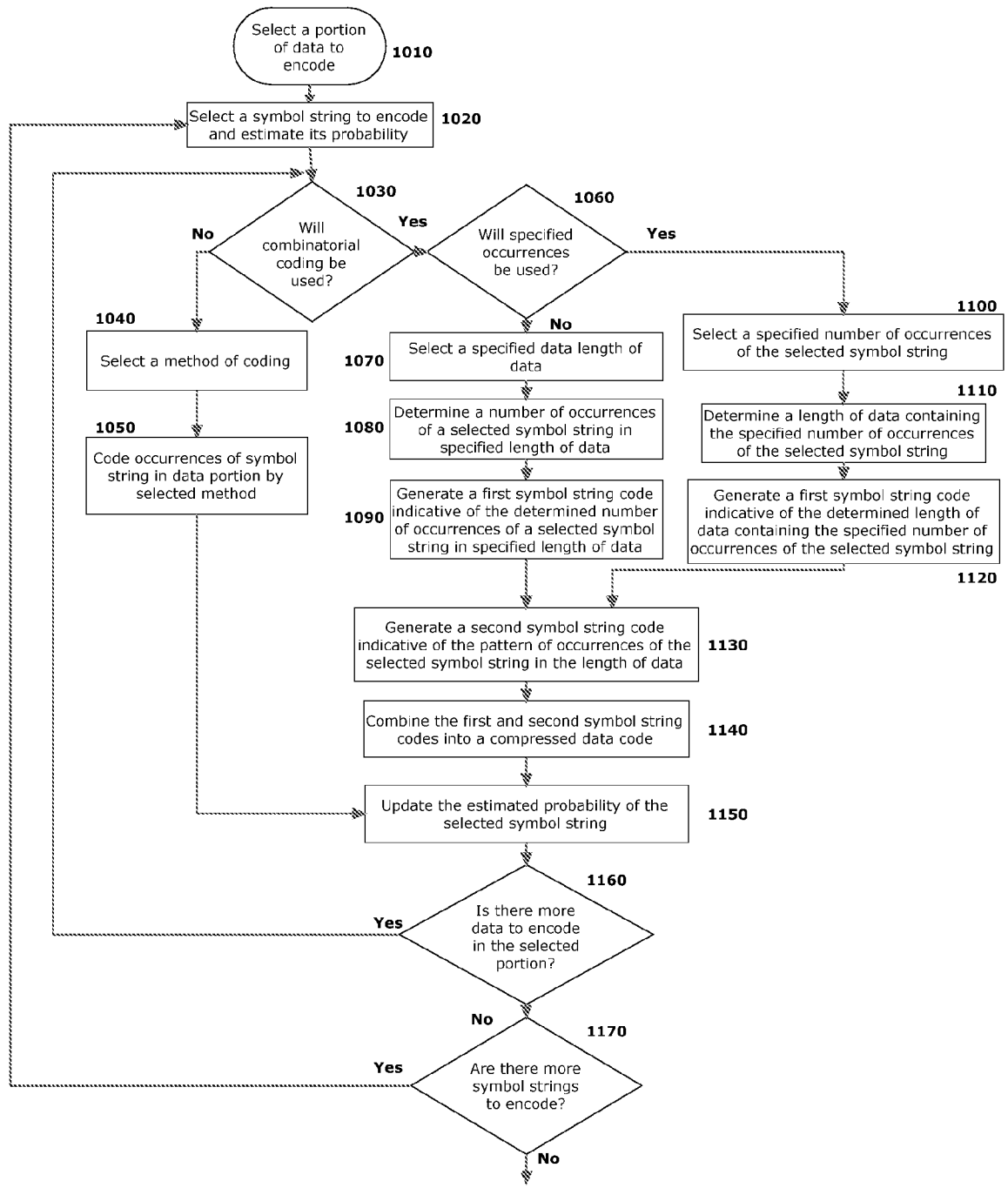
FIG. 1 is a flow diagram illustrating an example embodiment of a mode switched adaptive combinatorial coding scheme.

In the following detailed description, numerous details are set forth in order to provide a thorough understanding of claimed subject matter. However, it will be understood by those skilled in the art that claimed subject matter may be practiced without these specific details. In other instances, well-known methods, procedures, components, and circuits have not been described in detail so as to not obscure claimed subject matter.

Various operations may be described as multiple discrete operations in turn, in a manner that may be helpful in understanding embodiments of claimed subject matter; however, the order of description should not be construed to imply that these operations are order dependent.

For the purposes of the description, a phrase in the form "A/B" means A or B. For the purposes of the description, a phrase in the form "A and/or B" means "(A), (B), or (A and B)". For the purposes of the description, a phrase in the form "at least one of A, B, and C" means "(A), (B), (C), (A and B), (A and C), (B and C), or (A, B and C)". For the purposes of the description, a phrase in the form "(A)B" means "(B) or (AB)" that is, A is an optional element.

For purposes of the description, a phrase in the form "below", "above", "to the right of", etc. are relative terms and do not require that claimed subject matter be used in any absolute orientation.

Reference in the specification to a processing and/or digital "device" and/or "appliance" means that a particular feature, structure, or characteristic, namely device operable connectivity, such as the ability for the device to be execute or process instructions and/or programmability, such as the ability for the device to be configured to perform designated functions, is included in at least one embodiment of the digital device as used herein. Accordingly in one embodiment, digital devices may include general and/or special purpose computing devices, connected personal computers, network printers, network attached storage devices, voice over internet protocol devices, security cameras, baby cameras, media adapters, entertainment personal computers, and/or other networked devices suitably configured for practicing claimed subject matter in accordance with at least one implementation; however these are merely a few examples of processing devices and/or computing platforms to which claimed subject matter is not limited.

The description may use the phrases "in an embodiment," or "in embodiments," which may each refer to one or more of the same or different embodiments. Furthermore, the terms "comprising," "including," "having," and the like, as used with respect to embodiments of claimed subject matter, are synonymous.

Some portions of the detailed description which follow are presented in terms of algorithms and/or symbolic representations of operations on data bits and/or binary digital signals stored within a computing system, such as within a computer and/or computing system memory. These algorithmic descriptions and/or representations are the techniques used by those of ordinary skill in the data processing arts to convey the substance of their work to others skilled in the art. An algorithm is here, and generally, considered to be a self-consistent sequence of operations and/or similar processing leading to a desired result. The operations and/or processing may involve physical manipulations of physical quantities. Typically, although not necessarily, these quantities may take the form of electrical and/or magnetic signals capable of being stored, transferred, combined, compared and/or otherwise manipulated. It has proven convenient, at times, principally for reasons of common usage, to refer to these signals as bits, data, values, elements, symbols, characters, terms, numbers, numerals and/or the like. It should be understood, however, that all of these and similar terms are to be associated with appropriate physical quantities and are merely convenient labels. Unless specifically stated otherwise, as apparent from the following discussion, it is appreciated that throughout this specification discussions utilizing terms such as "processing", "computing", "calculating", "determining" and/or the like refer to the actions and/or processes of a computing platform, such as a computer or a similar electronic computing device, that manipulates and/or transforms data represented as physical electronic and/or magnetic quantities and/or other physical quantities within the computing platform's processors, memories, registers, and/or other information storage, transmission, and/or display devices.

Embodiments described herein relate to encoding data comprising symbol strings into one or more compressed data codes. In one implementation, a first portion of a compressed data code may represent a length of data containing a specified number of occurrences of a selected symbol string while a second portion of the compressed data code may represent a pattern of occurrences of the symbol string. However, this is merely an example embodiment and claimed subject matter is not limited in this respect.

Combinational Coding

Two versions of combinatorial coding have been previously disclosed. In the combinatorial encoder disclosed by Monro in U.S. patent application Ser. No. 11/777,256 a length of data n to be encoded is specified and the number of occurrences r of a symbol string is determined and used as a first part of a code. In a co-pending application Monro discloses that in an alternative combinatorial encoder with specified occurrences, a number of occurrences r of a symbol string is specified and a length of data n containing exactly r occurrences is determined and used as a first part of a code.

In either version, the data length n and the number of occurrences r specify that there are $_nC_r$ possible combinations or patterns of the r occurrences in the length n of data. In both versions an index or pattern code s is used as a second part of the code to select a pattern of n symbols containing r occurrences of the selected symbol string. If the probability of occurrence of the symbol string is constant, or substantially constant, or reasonably constant, then as will be known to one skilled in the art, the theoretical minimum cost of coding s is $\log_2(_nC_r)$. The pattern code s may vary from one to $_nC_r$ or alternatively 0 to $_nC_r-1$, or any other suitable mapping of the $_nC_r$ possible combinations, and the present subject matter is not limited to any particular mapping from actual patterns to s. The pattern code s is a key element of both versions of combinatorial encoding The subject matter disclosed herein teaches how the two versions of combinatorial encoding may be used in combination. Accordingly the two versions of combinatorial encoding may be regarded as two modes of encoding. The version in which the data length n is specified may be referred to as Mode N, and the version in which the number of occurrences r is specified may be referred to as mode R. In either mode, the data length n and the number of occurrences r specify that there are $_nC_r$ possible combinations or patterns of the r occurrences in the length n of data. In both modes an index or pattern code s is used as a second part of the code to select a pattern of n symbols containing r occurrences of the selected symbol string.

Depending on the statistics of a symbol string being encoded, and taking account of limitations, the best or most suitable mode of combinatorial encoding may be selected. Alternatively, in extreme situations the statistics of a symbol string may suggest that an alternative method of coding may be used, such as when a symbol string may occur with probability very close to 0.5, or at the opposite extreme when a symbol string may be either extremely rare or equivalently non occurrence of a symbol string may be extremely rare. Alternatively or additionally, the choice of encoding scheme and its parameters may be changed adaptively as encoding proceeds in response to changing statistics or better knowledge of statistics of a symbol string. The discussion which follows will reveal the flexibility of this approach through theoretical evaluation and exemplary embodiments.

FIG. 1 illustrates an embodiment of a mode switched adaptive combinatorial coding process in accordance with claimed subject matter. Although claimed subject matter is not limited in scope in this respect, one particular embodiment of a method of compressing data is described hereinafter. Action 1010 illustrates that, in one embodiment, a portion of data may be selected to encode. In some embodiments, this may facilitate the portioning of long data sequences into more manageable or efficient portions for example. Action 1020 illustrates that, in one embodiment, a symbol or symbol string may be selected that occurs within a portion, block, set, and/or grouping of data to be compressed.

According to an embodiment, any one of several encoding techniques may be used for encoding a symbol string selected at action 1020 based upon one more conditions such as, for example, an estimate of the probability of occurrence of the selected symbol string. Here, in certain conditions, along with non-combinatorial encoding techniques, one or more types of combinatorial encoding may be used for encoding the selected symbol string.

Action 1030 illustrates that a decision may be made to select combinatorial encoding for the selected portion of data. If combinatorial encoding is not selected by action 1030, then action 1040 illustrates that, in one embodiment, a different method of coding may be selected. In general if a symbol string is either very infrequent, or very frequent, or occurring with probability very close to 0.5, combinatorial encoding may not be selected. This is merely a non-limiting illustration of an instance in which a combinatorial encoding may not be selected and claimed subject matter is not limited to any method of deciding whether to use combinatorial encoding including circumstances where combinatorial encoding is always used and accordingly, in one embodiment, actions 1030, 1040 and 1050 may not occur. Here, accordingly, action 1030 may select from among two or more encoding techniques, including combinatorial encoding and non-combinatorial encoding techniques based, at least in part, on an estimated probability of a symbol string to be encoded.

To continue with the description of FIG. 1, if at 1030, in one embodiment, the decision is that combinatorial encoding may not be used, action 1040 illustrates, in one embodiment, that a different method of coding may be used, including but not limited to, arithmetic coding, Huffman coding, Golomb coding, Golomb coding with VLC exponent, Huffman/Golomb hybrid coding, no coding (e.g., sending the occurrences of a symbol string uncoded), and adaptive coding. Following the selection of an encoding scheme, action 1050 illustrates, in one embodiment, that occurrences of a symbol string in the portion of data may be coded by a method selected at 1040.

In both modes of the presently illustrated combinatorial encoder, a first symbol string encoder is used to encode a first symbol string code as will be described in more detail for specific illustrative embodiments below. The selection of a first symbol string encoding method may, at least in part, depend on the expected probability of occurrence of a symbol string selected at 1020, although other considerations may apply and claimed subject matter is not limited to any method of selecting a first symbol string encoding method.

In embodiments where combinatorial encoding has been selected, as for example by action 1030, action 1060 illustrates, in one embodiment, that a choice may be made between the two modes of combinatorial encoding.

As illustrated in detail below according to particular embodiments, a first combinatorial encoding technique denoted "Mode R" may include selection of a specified number of occurrences of a selected symbol string, followed by generation of a symbol string code indicative of a length of data containing the specified number of occurrences of the selected symbol string. This is illustrated in connection with a particular embodiment with reference to actions 1100, 1110 and 1120. Also, a second combinatorial encoding technique denoted "Mode N" may include selection of a specified length of data, followed by generation of a symbol string code indicative of a number of occurrences of a selected symbol string in the specified length of data. This is illustrated in connection with a particular embodiment with reference to actions 1070, 1080 and 1090. If Mode R of combinatorial encoding with specified occurrences is selected by action 1060, processing in one embodiment continues with action 1100. Otherwise, Mode N of combinatorial encoding with specified data length is used and processing continues in one embodiment at action 1070

Actions 1070 to 1090, in one embodiment, illustrate actions undertaken in Mode N of combinatorial encoding with specified data length. Action 1070 illustrates that, in one embodiment, a specified length of data, or block size may be selected or determined (hereafter 'n'). In some embodiments this may involve consideration of the statistics of the occurrences of the selected symbol string, although claimed subject matter is not so limited. In some embodiments, this may facilitate the portioning of long data sequences into more manageable or efficient portions, although claimed subject matter is not limited to any method of determining a specified length of data. Action 1080 illustrates that, in one embodiment, a number of occurrences of a selected symbol string may be determined in the specified length of data n. Action 1090 illustrates that a first symbol string code (hereafter 'r') indicative of the number of occurrences of the symbol string within the length of data n to be compressed may be generated.

Actions 1100 to 1120, in one embodiment, illustrate actions undertaken in Mode R of combinatorial encoding with specified occurrences. Action 1100 illustrates that, in one embodiment, a specified number of occurrences of the selected symbol string may be selected or determined (hereafter 'r'). In some embodiments this may involve consideration of the statistics of the occurrences of the selected symbol string, although claimed subject matter is not limited to any method of determining a specified number of occurrences. Action 1110 illustrates that, in one embodiment, a length of data (hereafter 'n') may be determined which contains the specified number of occurrences r of the selected symbol string. Below is discussed how, in some embodiments, n may be determined when there are not as many as r occurrences of a selected symbol string code in a selected portion of data. Also discussed is how, in some embodiments, n may be chosen if a range of lengths may be available. Action 1120 illustrates that a first symbol string code may be generated indicative of the determined length of data n containing the specified number of occurrences r of the selected symbol string. Actions 1130 to 1150 are common to both modes of the combinatorial encoder and may be performed in any order. Claimed subject matter is not limited to any particular order of performing actions 1130 to 1150.

Action 1130 illustrates that a second symbol string code may be generated indicative of the pattern of occurrences of the selected symbol string code in the length of data. Throughout this application, a second symbol string code indicitave of a pattern of occurrences of a selected symbol string code may be called s. Action 1140 illustrates that the first and second symbol string codes may be combined into a compressed data code. Circumstances may arise as discussed below under which a compressed data code may not require a second symbol string code, essentially whenever there are either zero or one possible patterns of occurrences of a selected symbol string code in a length of data Action 1150 illustrates, in one embodiment, that following encoding of occurrences of a symbol string by any method, the estimated probability of the selected symbol string may be updated. Below are discussed means of updating this estimated probability.

In the presently illustrated embodiment, actions 1160 and 1170 are performed regardless of which encoder technique is selected at actions 1030 and 1060. Action 1160 illustrates, in one embodiment, that all or part of a compression technique between actions 1030 and 1160 may be repeated for additional lengths of data within the portion of data selected by action 1010. Subsequently, action 1170 illustrates, in one embodiment, that all or part of a compression technique between actions 1020 and 1170 may be repeated for additional symbols and/or symbol strings.

In an embodiment, with long sequences of data which have been partitioned into shorter portions and/or blocks, the process illustrated by FIG. 1 may be repeated with additional portions of data. Respective symbol string codes may then be combined to form a data code. A resulting data code is a compressed form of the set or grouping of data. In various embodiments, this data code may be transmitted or stored as desired.

In at least some embodiments described, compression may be lossless, although claimed subject matter is not limited in scope in this respect. For example, in some embodiments, a compressed data code may include information on positions of those symbol strings contained within the data to be compressed.

In various embodiments the illustrated technique may be particularly suitable if data to be encoded comprises a sequence of binary digits in which two states occur, such as, for example, 'on' and 'off', or 'red' and 'green' or 'guilty' and 'not guilty' and/or the like. Such binary data may in particular embodiments be represented as a series of the digits '0' and '1' for example.

Accordingly illustrated techniques may be used, in various embodiments, to encode runs or patterns of binary data and may be, in some instances, a viable alternative to previously known methods such as arithmetic encoding or Golomb coding. It may also in favourable circumstances be preferred to the combinatorial encoder disclosed by Monro in U.S. patent application Ser. No. 11/777,256. Such favourable circumstances may exist if the probabilities of occurrence of the binary symbols, e.g. '0' and '1' are greatly different, e.g., if one binary symbol is much more frequent than the other.

The illustrated technique is not, however, restricted to binary encoding and one particular embodiment may be to encode a sequence of different data symbols as will be described.

Action 1020 of FIG. 1 illustrates that, in one embodiment, a symbol and/or symbol string that occurs within a block, set, or grouping of data may be selected to be compressed. In one embodiment, symbols may comprise any type, form or format of data. For example, symbols may include items, such as, for example, records, files, sectors, clusters, groupings and/or portions thereof. Furthermore, in other embodiments, symbols may comprise words, bytes, bits, text, characters and/or the like. However, these are merely a few illustrative examples of symbols to which claimed subject matter is not limited in this respect. In one embodiment, symbol strings may comprise single or multiple symbols. Conversely, in other embodiments, such symbol strings may be fixed or variable in length.

In this particular context, any grouping, set, block and/or portion of associated data to be compressed may be treated as an ordered sequence of characters or other symbols. If, in one embodiment, such data is representative of text, for example, individual symbols may comprise one or more text characters, but, of course, claimed subject matter is not limited in that respect. In other embodiments many other symbols may also be represented. Symbols may be presented by bytes or other sized groupings of data, in various embodiments. It is also possible that, in some embodiments, longer or short portions of data could be used, which may or may not fit within a byte or digital word length, for example. If in a particular embodiment data is represented in binary form, a symbol could be represented, depending on the particular embodiment, as a single bit or multiple bits of fixed or variable length.

For one particular embodiment, symbol strings may be selected for encoding in a particular or a substantially predetermined order, although, again, this is merely an example embodiment and claimed subject matter is not limited in scope in this respect. Alternatively or in addition, rather than encoding in an order, in another embodiment, symbol strings may be encoded in any order. In such an embodiment a symbol string code may be prefixed by some other code indicative of the particular symbol string, for example, although claimed subject matter is of course not limited in scope to this example embodiment. Likewise, for one particular embodiment, the approach employed may be switchable between different modes for selecting symbol strings, such as a mode in which symbol string codes are transmitted or stored in a predetermined order, and a mode in which such an order is not predetermined, but in which, in this latter mode, some code representative of a corresponding symbol string is transmitted before or as part of a symbol string code.

Furthermore, in various embodiments, side or additional information about all or some symbol strings may also be included in the compressed data code. In one particular embodiment, additional information relating to a particular symbol string may be transmitted at the end of or otherwise associated with a corresponding symbol string code. Alternatively, in another embodiment, additional information may be transmitted or stored after transmitting or storing symbol string codes. More generally, in various embodiments, additional information may be provided at any time or in any manner so that a decoder is capable of associating that information with a corresponding symbol string. In one embodiment, a list or table of symbol strings to be used may be predetermined, preconfigured, and/or predefined, for example. Alternatively or in an additional embodiment, said list or table of symbol strings may be compiled based at least in part on symbol strings which occur in data to be compressed, for example.

Initially, for example, in one particular embodiment, a list or table of symbol strings that may occur within a set of data may be established. Added to this list might be, in one embodiment, an initial list of symbol strings based at least in part on a priori knowledge or information regarding statistics for the data. For example, for an embodiment involving text, a common symbol string might comprise "ee", frequently occurring words such as "and" or "or", or a punctuation symbol followed by a blank, to provide some simple examples. Of course, claimed subject matter is not limited in scope to these examples or to this particular embodiment. Many possible variations are also intended to be included within the scope of claimed subject matter.

In another embodiment, a particular set of data, as another example, might be examined before encoding begins to identify symbol strings that occur commonly. Alternatively, or in addition, if partitioning is applied, these partitions, for example, may be handled separately or independently using an initial list of symbol strings. This initial list may have been determined, for example, at least in part from symbol strings which may have been found in earlier data partitions, for example.

Alternatively, symbol strings may be added as coding proceeds, as occurs in Lempel-Ziv-Welch (LZW) coding, as an example. However, in one embodiment example, encoding symbol strings, as described below, may be different from the approach used in LZW coding. In LZW, a symbol string is encoded by substitution of another, longer symbol or string. For that reason, LZW may, at times, not compress sets of data and, in some cases, may produce longer sets of data. In contrast, embodiments in accordance with claimed subject matter may result in compression.

A specific embodiment and illustration of selecting a symbol string is described in detail below. It is understood that this is merely one non-limiting illustrative embodiment, and claimed subject matter is not limited by these illustrative examples.

As illustrated by Action 1020, to compress a grouping or a set of data, a first symbol string may be selected from a list of available symbol strings. In either mode of combinatorial encoding, occurrences of that string in the data may be located by actions 1070 to 1090 for Mode N, or by actions 1100 to 1120 for Mode R. Positions of the first symbol string within the data may be retained for encoding by action 1130 which is common to both modes of combinatorial encoding, and also for reference in encoding further symbol strings. This process, in one embodiment, may be repeated for additional symbol strings for the data so as to specify the set or grouping. Data comprising symbol strings may be processed in any order, although sequentially from beginning to end of the set or grouping of data may be one convenient approach.

In particular embodiments, encoding may be carried out by a hardware or software coder. In one possible embodiment, an encoder may be arranged to transmit data, after being coded, across a communications channel to a decoder which may be arranged, in real time or otherwise, to use received encoded data to reconstruct the set of data. For a particular embodiment, encoded data may be transferred between components in a computing platform.

Figure 2:
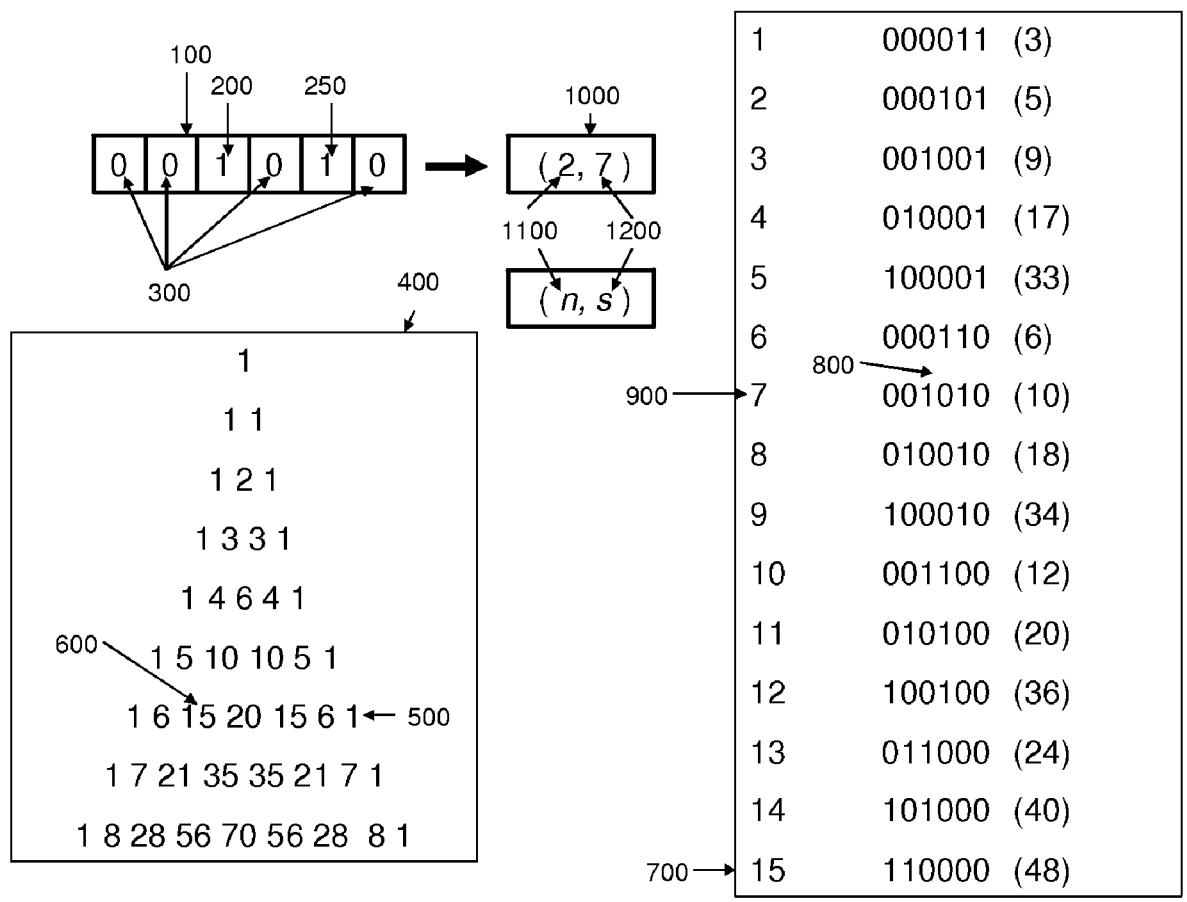
FIG. 2 is a diagram illustrating an example embodiment of a mode switched adaptive combinatorial coding scheme.

Again, claimed subject matter is not limited in scope to a particular embodiment. Therefore, the embodiments described previously or hereinafter are intended simply as examples for purposes of illustration. Many other approaches and/or embodiments are intended to be included within the scope of claimed subject matter other than these specific examples. Nonetheless, continuing with these examples, reference is now made to FIG. 2 to describe a first example in which a sequence of binary data may be coded by either of the two modes of combinatorial encoding. FIG. 2 is a schematic diagram of one potential embodiment in accordance with claimed subject matter.

First Example

FIG. 2 illustrates one specific, non-limiting, illustrative first example embodiment involving a process of encoding of a portion of data comprising a sequence of six binary bits, 100, although any length might be used and claimed subject matter is not limited in that respect. Of course, claimed subject matter is not limited to this example embodiment or to any one particular embodiment. This example is simply an illustration for explanatory purposes. Many other potential embodiments are intended to be included within the scope of claimed subject matter.

First Example Mode N

Firstly the encoding of binary data 100 by Mode N will be described, and then the encoding by Mode R will be described. For purposes of illustration of Mode N, in which a data length n is specified, a specified length determined by action 1070 will be taken as six bits, although any length could be specified and claimed subject matter is not limited to any specific choice of n.

The binary sequence 100 includes a pattern which contains '0' bits in certain positions 300 and '1' bits in other positions 200 and 250. In one embodiment, the coder may examine the binary sequence 100 as by action 1080 and in particular determines that there are two '1' bits 200 and 250 in the pattern. Action 1090 of FIG. 1 illustrates that, in one embodiment, a first symbol string code (hereafter 'r') indicative of the number of occurrences of the symbol string within the grouping of data to be compressed may be generated. Although there are $2^6=64$ different patterns of six bits there is a certain lesser number of possible patterns or combinations of six bits which include only two '1' bits which is much less than 64. Here, fifteen possible combinations of 6 bits which include only two '1' bits may be expressed as $_6C_2=15$. The Table of numbers 400 is well known as Pascal's triangle, and lists all the values of $_nC_r$ for row n from zero to eight with r counting across each row starting from zero. Each number in the triangle is the sum of the two immediately above it, and the sum of the numbers across row n is $2^n$, i.e. the number of different patterns of n bits. To encode binary sequence 100, the number of '1' bits is two and it is noted in Pascal's triangle 400 in row six that for r=2 at 600 there are fifteen patterns corresponding to r=2.

Action 1130 illustrates that, in one embodiment, a second symbol string code (hereafter 's') indicative of the pattern of occurrences of the symbol string code may be generated. In FIG. 2, the fifteen possible patterns of six bits which include only two '1' bits are listed in table 700, from which it is found at 800 that pattern number 7 at 900 is the one corresponding to the data 100. In FIG. 2, the code 1000 for data 100 is therefore the two symbols (r,s) at 1100 and 1200, which in this example of Mode N have the values (2, 7).

It is understood that various indexes may be assigned to the possible combinations or patterns of the n bit blocks which include only r occurrences of the selected symbol. In one embodiment, both the decoder and encoder may know such an index assignment a priori. Alternatively, in other embodiments data indicative of an index assignment may accompany the compressed data. Or, in yet another embodiment, each index may be independently derived. However, these are merely a few non-limiting examples of ways to assign index values to the combinations, and claimed subject matter is not limited in this respect.

Using Mode N therefore, the code to describe this sequence 100 of six bits is in two parts at 1000, a first code r 1100 that represents two and a second code s 1200 that represents seven in this example of Mode N. This code may contain fewer than six bits and if so the data 100 is compressed by the code 1000. In various embodiments, the symbols selected, per Action 1020 of FIG. 1 and described above, may comprise non-binary or larger binary symbols than illustrated by this specific, non-limiting, illustrative example of FIG. 2.

In a different embodiment, an encoder might have determined the number of '0' bits 300 as four, which would give four as the first code r and one of fifteen patterns with four zeros as the second code s, because $_6C_4$ is the same as $_6C_2=15$. Therefore, in this embodiment, the resulting compressed code 1000 would be (4, 7).

First Example Mode R

Returning to the first example of FIG. 2, encoding by Mode R of combinatorial encoding will now be described. For purposes of illustration of Mode R, in which a number of occurrences r is specified, the specified number of occurrences determined by action 1100 will be taken as two bits, although any length could be specified and claimed subject matter is not limited to any specific choice of r. In determining a length of data that contains two bits at action 1110, it is evident that the choice of n, to be encoded as a first symbol string code at action 1120, may to some degree be open. However there may be some advantage to choosing the shortest n that contains the specified r occurrences of the symbol '1' at 200 and 250, which is 5 in this example. If a decoder was aware that the shortest n would always be chosen, then it will always be the case that the final symbol would be a '1' which reduces the number of possible patterns. Knowing that there are r '1' symbols in n symbols, and that the last symbol is '1', the second symbol string code s generated by action 1130 may specify a pattern of n–1 bits containing r–1 '1' symbols. If the final symbol of n were always '1' then there would always be $_{n-1}C_{r-1}$ possible patterns instead of $_nC_r$ which is always less—sometimes substantially less—as can be seen from the Pascal triangle of FIG. 2. In the example of FIG. 2, if the first symbol string code n is generated by action 1120 to specify a data length of five, then the second symbol string code generated by action 1130 would specify a pattern of four bits with one '1' bit, and there are only four possible patterns $s_4$. If all patterns are equally likely or substantially equally likely as may often be the case, then $\log_2(4)=2$ bits may be used to encode the pattern $s_4$. This is substantially less than the $\log_2(15)=3.91$ bits to encode $s_{15}$ if n is six as was also true in the case of Mode N with this binary sequence described above. Therefore in many embodiments of Mode R of a combinatorial encoder with specified occurrences, it may be advantageous to choose n as the shortest sequence of data containing r occurrences to achieve this reduction in the cost of encoding the bit pattern s.

However, it will be evident to one skilled in the art that there may be situations where there are fewer than the specified r occurrences of the selected symbol string in a block or length of data for which n is to be determined and encoded. This can be dealt with by selecting a value of n that goes beyond the data length. A decoder that knows the length of data can be designed to recognize that a particular symbol string code n may carry it beyond such a length and interpret the code accordingly.

If the specified value of r were five in the present example, then encoding n as five greater than the data length could indicate in an embodiment that there were no occurrences of the symbol string. The pattern s in this case is not necessary because a decoder would deduce that there are no occurrences of the selected symbol string within the data to be encoded. Similarly a value of n that was four greater than the data length would indicate that there was one occurrence of the symbol string within the data. The pattern s needs only to specify where the one occurrence in n–4 symbols lies, and so on. If the encoded n does not exceed the length of data to be encoded, then at least the specified r occurrences of the selected symbol string are available within the data.

This method of dealing with this situation is one of many possible methods of encoding n if there are insufficient specified occurrences r of a selected symbol string, and claimed subject matter is not so limited. Nevertheless the present example employs this method to illustrate further the operation of claimed subject matter.

In some embodiments, a final occurrence of a selected symbol string may be a final position of a data length determined at 1110 in FIG. 1. A final symbol in this first example embodiment by Mode R based on FIG. 2 has been left unencoded. To encode this symbol, an encoder may move on from symbol 5 at 250 and attempt to determine a data length n which contains the specified r occurrences. In the present example, r is two, but there are no '1' bits to code. In this present example to continue beyond symbol 5 at 200, determining the first symbol string code n to be three would carry the coding past the final symbol in the data sequence by two positions, which is precisely the number needed to make up the specified r=2 '1' symbols. Furthermore the decoder can be arranged to detect this condition, and so in this example there is no need for a pattern to be specified. The decoder knows that the two '1' symbols are beyond the end of the data, so that the only possible pattern for symbol 6 of the data is '0'. Here, accordingly, an encoder may be adapted to encode beyond a data length determined at 1110 if there are fewer than a specified number of occurrences of a select symbol string present in the data length.

As described above, in both Mode N and Mode R of combinatorial encoding for various embodiments, an encoder and decoder may store lists of patterns s for different lengths of sequences n and different numbers r of a selected symbol (here the '1' bit) within these sequences. Alternatively, in other embodiments, such an encoder and decoder may have access to such lists or have the capability of generating such lists or selected portions of such lists. In particular embodiments, there may be $2^n$ different patterns of the data but only $_nC_r$ patterns with r bits, which is always less than $2^n$. The illustrated technique may utilize the fact, that $_nC_r$ is always less than $2^n$, to achieve compression. In Mode R, as described above, a further benefit may be obtained if the final symbol of data length n is always the same as the selected symbol string (here a '1' bit), if the number of patterns is $_{n-1}C_{n-1}$. In various embodiments, the lists of patterns may be ordered in any convenient way which enables an encoder and decoder to select the same pattern s. Alternatively, in other embodiments, such lists of patterns may be calculated by an encoder or decoder if advantageous. The described technique may be referred to as combinatorial encoding because it is based on selecting ordered combinations to describe the positions of symbol strings in the data, in this illustrative case shown by FIG. 2, the symbol string being the binary digit '1'. It should be understood, however, that this is merely one example illustration of combinatorial encoding according to a particular embodiment, and that claimed subject matter is not limited in this respect.

Equally, in other illustrative embodiments, an encoder and decoder might work with '0' bits, and may specify that n−r of such bits are to be encoded. A first code may comprise the identical value of n and the second code would indicate a pattern with n−r '0' bits. The number of patterns with n−r bits is $_nC_{n-r}$ which is always the same as $_nC_r$. Again, in Mode R, this may be reduced to $_{n-1}C_{r-1}$ by choosing n such that the final bit is a '0' bit.

As described earlier, there are two versions or modes of combinatorial encoding. In Mode N of combinatorial encoding disclosed by Monro in U.S. patent application Ser. No. 11/777,256 a length of data n to be encoded is specified and the number of occurrences r of a symbol string is determined and used as a first part of a code. In a co-pending application Monro discloses that in an alternative combinatorial encoder with specified occurrences, herein called Mode R, a number of occurrences r of a symbol string is specified and a length of data n containing exactly r occurrences is determined and used as a first part of a code. In either case, the data length n and the number of occurrences r specify that there are $_nC_r$ possible combinations or patterns of the r occurrences in the length n of data. One of n or r may be determined without encoding, for example from consideration of the statistics of occurrence of symbols in the data, and the other may be encoded by a first symbol string code. In either case an index or pattern code s is used as a second part of the code to select a pattern of n symbols containing r occurrences of the selected symbol string. If the probability of occurrence of the symbol string is constant, or substantially constant, or reasonably constant, then as will be known to one skilled in the art, the theoretical minimum cost of coding s is $\log_2(_nC_r)$. The pattern code s may vary from 1 to $_nC_r$ or alternatively 0 to $_nC_r-1$, or any other suitable mapping of the $_nC_r$ possible combinations, and claimed subject matter is not limited to any particular mapping from actual patterns to s. The pattern code s is a key element of both versions of combinatorial encoding. In Mode R, when the data length n is determined as the shortest length containing the specified r occurrences, the number of patterns to be encoded by s is reduced to $_{n-1}C_{r-1}$.

Equally, in other illustrative embodiments, an encoder and decoder may work with '0' bits, and might specify that n−r of them are to be encoded. The first code would be the identical value of n and the second code would indicate a pattern with n−r '0' bits. The number of patterns with n−r bits is $_nC_{n-r}$ which is always the same as $_nC_r$. The same amount of compression may be achieved although of course the ordering of the $_nC_r$ pattern codes 's' may be different if encoding the occurrences in the data of '0' rather than '1'. If n is the shortest value of n with n−r '0' bits, then the selection can be made from $_{n-1}C_{n-r-1}$ patterns which has again the same number of patterns as the equivalent $_{n-1}C_{r-1}$ when coding '1' bits.

The description now proceeds with observations and considerations of the performance and behaviour of combinatorial encoding. Firstly the behaviour and performance of Mode N of combinatorial encoding, if n is specified and r is encoded, as in actions 1070 to 1090 of FIG. 1, will be described at some length. In various embodiments, methods for choosing a good value of n and coding of r will be described. Then a similar description will follow for Mode R in which r is specified and n is encoded as in actions 1100 to 1120 of FIG. 1.

Considering both Mode N and Mode R of combinatorial encoding as illustrated herein, action 1010 of FIG. 1 illustrates that, in one embodiment, a portion of data may be selected or determined. In some embodiments, this may facilitate the portioning of long data sequences into more manageable or efficient portions. In one embodiment, data, such as stored as a file, a record or other unitary association of data, as one example, might be treated as a whole, or instead partitioned or divided into convenient lengths, long enough for symbol groupings, referred to here as symbol strings, to be coded with some amount of compression efficiency, but short enough to be conveniently processed. However, these are merely a few reasons that may be used to determine the portioning of the uncompressed data, and claimed subject matter is not limited by these illustrative examples.

Considering Mode N of combinatorial encoding, a specific embodiment and illustration of selecting a block or length of data as at action 1070 of FIG. 1 (hereafter, 'n') is described in detail below in which a probability is used at least in part to determine a block size or data length. It is understood that this is merely one non-limiting illustrative embodiment, and claimed subject matter is not limited by these illustrative examples In Mode N of combinatorial encoding, the number of occurrences r in a block of data of length n may, in one embodiment, be encoded efficiently by various techniques such as, for example, Huffman, Golomb, hybrid Huffman/Golomb as taught by Monro in U.S. patent application Ser. No. 11/422,316, arithmetic coding or any other technique. In some embodiments the hybrid Huffman/Golomb encoder may outperform Huffman encoding in some circumstances and it may even approach the efficiency of Huffman encoding with probability distributions that are ideal for Huffman encoding. As the hybrid Huffman/Golomb encoder is of low complexity, it may be used to code the number of bits r in an embodiment, although claimed subject matter is not so limited.

In an embodiment of Mode N, the pattern number s may similarly be coded at 1130 of FIG. 1 by various techniques such as, for example, Huffman, Golomb, hybrid Huffman/Golomb, arithmetic encoding or any other technique including techniques as yet undiscovered. It is a feature of various embodiments of the illustrated technique that once r is known, all the $_nC_r$ possible patterns are equally likely, as long as the probability of occurrence of a '1' bit is constant. In embodiments where $_nC_r$ is a power of two, an encoder may do no better than encode s by $\log_2(_nC_r)$ bits. Sometimes this may occur, and sometimes $_nC_r$ may be just less than a power of two. In both these instances, as they arise, an encoder, in one embodiment, may simply use $\log_2(_nC_r)$ bits (perhaps rounded up) without further encoding. Efficient encoding of $_nC_r$ equally probable outcomes if $_nC_r$ is not a power of two may be difficult or inconvenient in some instances.

Theory—Combinatorial Coding of Binary Data—Mode N

The mathematics in the binary case of Mode N may prove instructive. Working with '1' as the encoded digit, let the probability of occurrence of a '1' be q over both long and short blocks of binary data, i.e. q is stationary. In an embodiment, the theoretical cost, or entropy, of encoding of each bit from this data is $$e_q(1) = -q \log_2(q) - (1-q)\log_2(1-q)$$

In a block of n bits, then, the probability of r bits which are '1' may be expresses as $$p_q(r) = q^r(1-q)^{n-r}$$

The entropy or theoretical cost of encoding each bit by an efficient technique is $$e_q(n) = -\sum_{r=0}^{n} p_q(r)\log_2 p_q(r) \text{ bits.}$$

At n=1 this gives the identical result to $e_q(1)$, so that the theoretical total cost of encoding n bits is $ne_q(n)$ bits.

An encoder disclosed herein considers the different patterns that might occur. There may be $_nC_r$ possible patterns of r bits from n, where each is equally likely, so the probability of the occurrence of r bits from n is $c_q(n,r) = _nC_r p_q(r)$. The theoretical cost of using the technique described herein here may be calculated, in one embodiment of Mode N, as the cost of selecting a value of r and the cost of transmitting/storing the selected pattern s. Because each pattern of r bits is equally probable, encoding the pattern number s by a perfect technique may cost $\log_2(_nC_r)$ bits. Therefore using the probability of each value of r, the theoretical cost of using the technique to encode n bits in Mode N is $$e_q^*(n) = -\sum_{r=0}^{n} c_q(n, r)\log_2(c_q(n, r)) + \sum_{r=0}^{n} c_q(n, r)\log_2(_nC_r)$$

In an embodiment of Mode N, it may occur that $e_q^*(n) = ne_q(n)$, i.e. that a perfect technique of encoding r and s will achieve perfect encoding of the binary data. The technique illustrated may be therefore capable of perfect compression performance for embodiments or instances where q is constant. The same result would be obtained in embodiments of Mode N where Action 1020 of FIG. 1 resulted in using '0' as the binary digit whose occurrences are counted.

In some embodiments, the block size (data length) n may be chosen in order to optimize the compression technique. However, in other embodiments, other considerations may determine or affect the selection of the block size. An illustrative example is given below. This illustrative example embodiment of Mode N of combinatorial encoding focuses on binary data; however, it is understood that this is merely one form of data contemplated by claimed subject matter, and that claimed subject matter is not limited by this illustrative example.

This illustrative embodiment involves a technique of choosing the block size (a.k.a. binary data length, n), as illustrated by Action 1070 of FIG. 1, and attempting to select the compression technique or techniques used to encode the first binary symbol code for r and the second binary symbol code for s, as illustrated by Actions 1090 & 1130 of FIG. 1.

In one embodiment, to choose the most efficient value of the binary block length n for a given binary symbol probability q, the average cost in bits of encoding each bit of the binary sequence may be calculated and compared with the theoretical cost, or entropy. As given above, the theoretical entropy, in one embodiment, may be:

$$e_q(1) = -q \log_2(q) - (1-q)\log_2(1-q)$$

As given above, using one embodiment of Mode N of the combinatorial encoder, the theoretical cost may be:

$$e_q^*(n) = -\sum_{r=0}^{n} c_q(n, r)\log_2(c_q(n, r)) + \sum_{r=0}^{n} c_q(n, r)\log_2(_nC_r)$$

For a given encoding technique it may be possible to calculate how closely this theoretical cost may be approximated with real data. In an embodiment, this efficiency may depend on the particular encoding technique used, the binary symbol probability q and the binary block length n. In one embodiment, these calculations can be carried out independently of an encoder or, in another embodiment, can be carried out by an encoder or a decoder, and may, in various embodiments, be done for a range of values of q. In one embodiment, for each q the value of n which gives a predicted compression that is the closest approach to the theoretical may be noted, for example in a table or in some other way. However, it is understood that the scope of claimed subject matter is not to be limited by any particular technique of noting or expressing the relationship between q and the best or desired value of n. In one embodiment, these results may be referred to in order to decide what best or preferred or otherwise selected value of n to use for a given value of q.

In one embodiment, before encoding a particular sequence of data, the data may be examined to estimate a value or, in one embodiment, an initial value of q, the probability that the symbol string will occur in a given block. Alternatively, in another embodiment, q may be predicted from experience with similar kinds of data. In other embodiments, the value of q may be predicted or estimated or determined in another way and the scope of claimed subject matter is not limited by any particular technique of estimating q.

In one embodiment of Mode N of combinatorial encoding, utilizing, at least in part, the value of q, a best or preferred or otherwise selected value of n may be determined. In one embodiment, the desired value may be derived from the calculations carried out and noted earlier. In one embodiment, the desired value of n may be the value which gives the greatest compression or the closest compression to the theoretical. Alternatively, in another embodiment, the value of n may be modified or constrained, for example, in order to not be excessively large for, in some embodiments, reasons of computational cost or, in other embodiments, for any other reason. The value of n may, in some embodiments, be determined by reference to previously calculated results, or, in other embodiments, by a calculation carried out at the time, or in another way. It is understood that claimed subject matter is not to be limited by any particular technique of determining the value of n.

In one embodiment, an initial value of q may or may not be an efficient choice for real data that is to be or may be encoded. In some instances, even if an initial value is efficient, it may become inefficient as encoding progresses. In one embodiment, an encoder and decoder may estimate the changing value of q as symbol strings, or in more specific embodiments binary symbols, are encoded or decoded. The encoder and decoder may do said estimation, in various embodiments, according to a set of rules that may be known to both encoder and decoder. To do that said encoder and decoder may, in one embodiment, make synchronized decisions about q and accordingly, in some embodiments, about the word or block length n and first scheme for encoding the value r and the second scheme of encoding the value s.

In one or more embodiments, an encoder and decoder may operate correctly if they act in synchrony. Stated another way, in some embodiments, if a decoder comes to decode a particular portion of the encoded information, it attempts to invert the operations which were, or it assumes were, carried out by the coder to generate the particular portion of the compressed code. To do so, in one embodiment, both encoder and decoder may use the same method of encoding.

In the case of the present illustrative embodiment, this means that where the encoder and decoder are using Mode N of combinatorial encoding, they may use firstly the same value of n in response to the value of q, secondly the same techniques of encoding r, and thirdly the same technique of encoding s. As shown in this illustrative embodiment, these three factors (n, r, & s) may, in some embodiments, be changed in response to changing probability of occurrence of a symbol string. In one embodiment, these three factors may be changed in response to changes in the value of q, or estimates of the value of q. It is understood that this is merely one specific illustrative embodiment, and claimed subject matter is not so limited.

The discussion of the selection of r and methods of encoding for Mode R of combinatorial encoding follows many of the same arguments as for Mode N. Turning now to Mode R, action 1100 of FIG. 1 illustrates that, in one embodiment, a specified number of occurrences r may be selected or determined. A specific embodiment and illustration of selecting a number of occurrences (hereafter, 'r') is described in detail below in which a probability is used at least in part to determine a specified number of occurrences. It is understood that this is merely one non-limiting illustrative embodiment, and claimed subject matter is not limited by these illustrative examples.

In Mode R of combinatorial encoding, a number of occurrences r is specified as at action 1100 and a length of data n is determined as at action 1110 which contains exactly r occurrences of a selected symbol string. As was discussed previously, a portion of data which has been selected by action 1010, or which has been partly encoded by repeating actions 1100 to 1140, may contain fewer than r occurrences of a selected symbol string and so special actions may be required to deal with this situation. This is a special consideration that may apply only to Mode R of combinatorial encoding.

The data length n may, in one embodiment of Mode R of combinatorial encoding, be coded efficiently by various techniques such as, for example, Huffman, Golomb, hybrid Huffman/Golomb as taught by Monro in U.S. patent application Ser. No. 11/422,316, arithmetic encoding or any other method. In some embodiments the hybrid Huffman/Golomb encoder may outperform Huffman coding in some circumstances and it may even approach the efficiency of Huffman encoding with probability distributions that are ideal for Huffman encoding. As the hybrid Huffman/Golomb encoder is of low complexity, it may be used to encode the data length n in an embodiment, although claimed subject matter is not limited in this respect.

In one embodiment, the pattern number s may similarly be coded by various techniques such as, for example, Huffman, Golomb, hybrid Huffman/Golomb, arithmetic encoding or any other method including methods as yet undisclosed. However, as discussed in considering the first example embodiment of FIG. 2, a special feature of Mode R of combinatorial encoding is that n may be chosen so that the final occurrence of the symbol string is at the end of the data length n and the number of equally probable outcomes may be $_{n-1}C_{r-1}$. It is a feature of various embodiments of the illustrated technique that once n and r are known, all the $_nC_r$ (or $_{n-1}C_{r-1}$) possible patterns are equally likely, as long as the probability of occurrence of a '1' bit is constant. In embodiments where $_nC_r$ is a power of two, the coder may do no better than code s by $\log_2(_nC_r)$ (or $\log_2(_{n-1}C_{r-1})$) bits. Sometimes this may occur, and sometimes $_nC_r$ (or $_{n-1}C_{r-1}$) may be just less than a power of two. In both these instances, as they arise, the coder, in one embodiment, may simply use $\log_2(_nC_r)$ (or $\log_2(_{n-1}C_{r-1})$) bits (perhaps rounded up) without further encoding. Efficient encoding of $_nC_r$ (or $_{n-1}C_{r-1}$) equally probable outcomes when $_nC_r$ (or $_{n-1}C_{r-1}$) is not a power of two may be difficult or inconvenient in some instances.

Theory—Combinatorial Coding of Binary Data—Mode R

The mathematics in the binary case or embodiment of Mode R of combinatorial encoding may prove instructive. Working with '1' as the encoded digit, let the probability of occurrence of a '1' be a constant value q over both long and short blocks of binary data, i.e. q is stationary. In an embodiment, the theoretical cost, or entropy, of encoding of each bit from this data is known to those skilled in the field to be $$e_q(1) = -q \log_2(q) - (1-q)\log_2(1-q)$$

In a block of n bits the probability of each combination of r bits which are '1' may be expressed as $q^r(1-q)^{n-r}$. There are $_nC_r$ possible patterns of r bits from n, so that the probability $p_q(r)$ of having exactly r bits which are '1' in a block of n bits is calculated by multiplying by the number of combinations, $$p_q(r) = {_nC_r} q^r (1-q)^{n-r}$$

The entropy, or theoretical cost of encoding the block of n bits of data by an efficient method considers all the possible values of r:

$$e_q(n) = -\sum_{r=0}^{n} p_q(r) \log_2 p_q(r) \text{ bits.}$$

Embodiments of encoders using Mode R of combinatorial encoding disclosed herein may consider the different patterns that might occur. There may be $_nC_r$ possible patterns of r bits from n, where each is equally likely. The theoretical cost of using the technique described herein here can be calculated, in one embodiment, as the cost of encoding a value of the block or run length n and the cost of transmittion/storing the selected pattern S. An advantage may be gained in some embodiments by specifying not only the number of '1' bits which is called r, but also by specifying that the block length n is the shortest length of data containing r '1' bits, i.e. that the final bit of the run is a '1' bit. There are therefore r−1 '1' bits in the preceding n−1 bits of the block, and the number of combinations or patterns of those is $_{n-1}C_{r-1}$. Because each pattern of r bits is equally probable, encoding the pattern number s by a perfect method may cost $\log_2({_{n-1}C_{r-1}})$ bits. The probability of each pattern of r bits in a block of n is still $q^r(1-q)^{n-r}$, so that the probability $p_q^*(n)$ of having exactly r bits which are '1' in a block or run of n, while specifying that the final bit is a '1', is calculated by multiplying the probability of each pattern, $q^r(1-q)^{n-r}$, by the number of possible patterns or combinations, $$p_q^*(n) = {_{n-1}C_{r-1}} q^r (1-q)^{n-r}$$

Using the probability of each value of n, and summing over all possible values of n, the theoretical cost of using the method to encode n bits if the number of '1' bits is specified as r is $$e_q^*(n) = -\sum_{k=r}^{\infty} p_q^*(k) \log_2(p_q^*(k)) + \sum_{k=r}^{\infty} p_q^*(k) \log 2({_{k-1}C_{r-1}})$$

Those skilled in the field may recognize the first summation in the above equation as the cost of sending n and the second summation as the cost of encoding the pattern s. By writing a computer program it can be verified that $e_q^*(n) = e_q(n)$, i.e. that an embodiment is capable of perfect encoding provided the encoding of n and s are perfect.

Mode R of combinatorial encoding as illustrated is therefore capable of perfect compression performance for embodiments or instances where q is stationary. Exactly the same result would be obtained in embodiments where Action 1020 of FIG. 1 resulted in using '0' as the binary digit whose occurrences are counted.

Clearly, in this theoretical discussion, n≧r, although in practice using Mode R of combinatorial encoding, situations may arise when there are fewer than r occurrences available for any value of n. Means of dealing with this will be described further in examples to follow.

In some embodiments of Mode R of combinatorial encoding, a specified number of occurrences r may be chosen in order to optimize the compression technique. However, in other embodiments, other objectives may determine or affect the selection of the specified number of occurrences. An illustrative example is given below. This illustrative example embodiment focuses on binary data; however, it is understood that this is merely one form of data contemplated by claimed subject matter, and that claimed subject matter is not limited by this illustrative example.

This illustrative embodiment of Mode R of combinatorial encoding involves a technique of choosing the number of occurrences r of a selected symbol string, as illustrated by Action 1100 of FIG. 1, and selecting the compression technique or techniques used to encode the first binary symbol code for r and the second binary symbol code for s, as illustrated by Actions 1120 & 1130 of FIG. 1.

In one embodiment of Mode R of combinatorial encoding, to choose the most efficient value of the specified number of occurrences r for a particular binary symbol with probability q, the average cost in bits of encoding each bit of the binary sequence by particular methods may be calculated and compared with the theoretical cost, or entropy. As given above, the theoretical entropy, in one embodiment, may be:

$$e_q(1) = -q \log_2(q) - (1-q) \log_2(1-q)$$

As given above, using one embodiment of Mode R of the combinatorial encoder, the theoretical cost may be expressed as:

$$e_q^*(n) = -\sum_{k=r}^{\infty} p_q^*(k) \log_2(p_q^*(k)) + \sum_{k=r}^{\infty} p_q^*(k) \log 2({_{k-1}C_{r-1}})$$

Those skilled in the field may recognize the first summation in the above equation as the cost of sending n and the second summation as the cost of encoding the pattern s.

Equally, in other illustrative embodiments, the encoder and decoder might work with '0' bits, and might specify that n−r of them are to be encoded. The first code would be the identical value of n and the second code would indicate a pattern with n−r '0' bits. The number of patterns with n−r bits is $_nC_{n-r}$ which is always the same as $_nC_r$. The compression achieved is exactly the same although of course the ordering of the $_nC_r$ pattern codes 's' might be different if encoding the occurrences in the data of '0' rather than '1'. If n is the shortest value of n with n−r '0' bits, then the selection can be made from $_{n-1}C_{n-r-1}$ patterns which has again the same number of patterns as the equivalent $_{n-1}C_{r-1}$ if encoding '1' bits.

In an embodiment of either mode of combinatorial encoding, for some values of q, such as, for example very small values, an encoder or decoder may decide in synchrony, such as by actions 1030 and 1060 of FIG. 1, to cease to use a particular mode of combinatorial encoding, at least temporarily, and switch to either another mode of combinatorial encoding, or to some completely different technique of coding the occurrences of a symbol string, such as for example Golomb encoding or Arithmetic encoding. Similarly, in one embodiment, the coder and decoder which are both using the same alternative technique of coding may decide in synchrony to switch to either Mode N or Mode R of combinatorial encoding, such as by actions 1030 and 1060 of FIG. 1, in response to a value of q.

An encoder may commence encoding of a set of data using some technique, in one embodiment, predetermined by default or, in another embodiment, in response to some instruction or data signalled to an encoder, or in other embodiments, different techniques. For example, in one embodiment, an encoder may commence encoding with the value of q assumed or specified to be 0.5. The coder may, in such a case, commence encoding binary data by simply sending bits, in one embodiment. Alternatively, in another embodiment, an encoder may commence encoding with the value of q assumed or specified to be 0.2 using a selected mode of the combinatorial encoder with a certain value of n in the case of Mode N, or with a certain value of r in the case of Mode R, with the first and second symbol string codes generated by certain techniques. It is understood that claimed subject matter is not to be limited to any particular starting combination.

In various embodiments, as encoding proceeds both an encoder and a decoder may count, or otherwise monitor, the actual occurrences of a symbol string, or in some embodiments, the binary symbols and may, in response, estimate a value of q. In one embodiment, said estimation may occur at a predetermined time. In another embodiment said estimation may occur dynamically. Or, in yet other embodiments, said estimation may utilize another technique.

In some embodiments, it may not be possible, or convenient, or desirable, to estimate the value of q until an occurrence of a symbol string, or in some embodiments a binary symbol, is first coded. However, if the initial data indicates runs of non-occurrences of the binary symbol, an encoder and decoder may estimate an upper bound on q, in various embodiments. For example if the data commences with a run of 20 non-occurrences it is likely that q is 0.05 or less, and during that run both encoder and decoder may have several times reduced their estimate of q and changed n and/or encoding techniques for r and s accordingly before any occurrence of a binary symbol has been received. It is understood that this is merely one non-limiting embodiment of claimed subject matter.

In one specific embodiment, an encoder and a decoder may count the number of occurrences, a, of a binary symbol over some number of encoded data values, v. An estimated value of q may then, in this embodiment, comprise a/v. If either a or v are too small, the estimate may be inaccurate. Such an encoder and decoder may, in one embodiment, have a common policy as to how large v should be at any time in response to the latest estimate of q. In this way the technique of estimating q may be made adaptive. It is understood that other techniques may be used in various embodiments to allow the estimation of the value for q.

Another embodiment may utilize another technique of estimating q by utilizing, at least in part, a filter. In one embodiment, a new estimate q' might be based on the previous value of q and the values of a and v, for example by utilizing the following formula:

$q'=k*q+(1-k)*a/v$

In one embodiment, the value k may comprise a value between 0 and 1 and may control how fast the filter responds. In one embodiment, a value of k close to 0 may give a rapid response to changing conditions and, in another embodiment, a value of k close to 1 may give a slow response. In this way both v and k may be adjusted, in one embodiment, by the encoder and decoder in response to the value of q to adapt slowly or rapidly.

In one embodiment, if the values of a and v are always the same then eventually this filter will settle to a steady value of:

$q'=a/v$

It is understood that there are many other ways of filtering the changing value of q contemplated within the current claimed subject matter and claimed subject matter is not to be limited by any particular technique.

In an alternative embodiment, a technique of estimating q which may be used is to form a histogram of the rates of occurrence of the presence and absence of the symbol string or binary symbol. For example, in one specific embodiment, if there are a total of a occurrences of the binary symbol and b non-occurrences, an estimate of q may be again a/(a+b). In some embodiments, at various times the histogram may be rescaled, such as, for example by dividing the numbers a and b by some common divisor d whenever a or b reach some threshold and rounding a and/or b either up or down or to the nearest whole number. In other embodiments, an estimate of q may still be obtained as a/(a+b), but by resealing frequently. Or, conversely, in other embodiments the value of q may be made to adapt more quickly than if it is rescaled infrequently. Thus in this way d and the threshold, or alternatively in various embodiments how often the resealing is carried out, may be adjusted in response to an estimate of q to make the estimate of q vary slowly or rapidly as may be desired. Thus, in one embodiment, the value of q may be used to adapt the technique of estimating q. In some embodiments, this may be done by having both encoder and decoder follow the same rules as to what technique is used to estimate q in response to the value of q, and what values are used for parameters such as v or d or the frequency of updating q. In this way a flexible and adaptive technique of estimating q may be achieved, in one embodiment. Claimed subject matter is not limited to the above or any techniques of estimating q and adapting the manner in which q is estimated in response to a value of q.

In some embodiments, as the value of q is estimated, the technique of encoding the occurrences of the symbol string, or in one embodiment the binary symbol, may also be adapted. In some embodiments of Mode N of combinatorial encoding, an encoder and decoder may adapt the word or block length n to achieve a best or a sufficiently or substantially good compression according to the calculations outlined above, or based on rules derived therefrom, or according to other rules devised for a purpose in various embodiments. Claimed subject matter is not to be limited to any one set of conditions or rules under which the value of n may be changed.

Similarly, in some embodiments of Mode R of combinatorial encoding, an encoder and decoder may adapt the specified number of occurrences r to achieve a best or a sufficiently or substantially good compression according to the calculations outlined above, or based on rules derived therefrom, or according to other rules devised for a purpose in various embodiments. Claimed subject matter is not to be limited to any one set of conditions or rules under which the value of r may be changed.

In some embodiments, a particular technique of encoding itself may be changed in response to the value of q. For example a mode of combinatorial encoder as described herein may achieve, in some embodiments, relatively very efficient coding over a wide range of values of q, but for very small values of q the possible combinations s may be relatively very large, too large to desirably store in a table or too large to desirably compute on the fly.

In an embodiment of Mode N, an encoder and decoder may decide to use a less than best value of n in order to avoid the possibility of an excessively large number of patterns s. Alternatively, in other embodiments of Mode N, such an encoder and decoder may decide to change the technique of coding either r or s or both. In particular embodiments, in response to certain combinations of q and r said encoder and decoder may decide to send s by plain symbols. Similarly In an embodiment of Mode R, such an encoder and decoder may decide to use a less than best value of r in order to avoid the possibility of an excessively large number of patterns s. Alternatively, in other embodiments of Mode R, such an encoder and decoder may decide to change the technique of encoding either n or s or both. In particular embodiments, in response to certain combinations of q and n they may decide to send s by plain symbols.

Alternatively, in other embodiments, an encoder and decoder may decide to cease using a combinatorial encoding technique, e.g., as described herein and switch to some other technique, at least temporarily. This may happen, in some embodiments, if the value of q is determined to be very close to 0.5 so that sending the binary symbols as plain '0' or '1' may be sufficiently accurate and would be a relatively very low complexity strategy. Alternatively, in other embodiments, if q is relatively very small, the encoder and decoder may decide at least temporarily to use a different technique of encoding altogether such as Golomb or Arithmetic encoding.

In one embodiment of Mode N, an encoder may be instructed to use a particular block size (n) if compressing a particular sequence of data. Alternatively, in another embodiment of Mode N, such an encoder may be given the value of q either estimated or calculated or otherwise determined and may determine the value of n by any of the techniques described above. It is understood that other means of obtaining or estimating the value of q are within the scope of claimed subject matter.

In other embodiments of Mode N, an encoder may determine the best value of n to use by reference to a table of previously calculated settings. In yet another embodiment of Mode N, such an encoder may carry out the calculations or other process which determines the best or preferred or otherwise determined value of n. In one embodiment of Mode N, for example, the preferred value of n might be a fixed value for all data, or at least over a particular range of values of q. For example, in one specific illustrative embodiment of Mode N, for q between 0.2 and 0.8, a desired value of n might be 6.

In one embodiment of Mode N, it may be desirable for a decoder that is to be used with an encoder also to use the same setting of the binary word length n to decode a binary data sequence correctly. In one embodiment of Mode N, a decoder may also use the same encoding technique or techniques. In various embodiments, such encoding techniques might already be known to a decoder, or, in other embodiments, calculated or estimated or otherwise determined by such a decoder, or, in yet more embodiments, the techniques might be communicated to a decoder. In one embodiment of Mode N, a way of doing this may comprise communicating the value of n directly. Various techniques of determining the value of n to be used by a decoder may be used and claimed subject matter is not to be limited to any particular technique.

Similar considerations apply to Mode R of combinatorial encoding. In one embodiment of Mode R, an encoder may be instructed to use a particular specified number of occurrences (r) if compressing a particular sequence of data. Alternatively, in another embodiment of Mode R, an encoder may be given the value of q either estimated or calculated or otherwise determined and may determine the value of r by any of the techniques described above. It is understood that other means of obtaining or estimating the value of q are within the scope of claimed subject matter.

In other embodiments of Mode R, an encoder may determine the best value of r to use by reference to a table of previously calculated settings. In yet another embodiment of Mode R, an encoder may carry out the calculations or other process which determines the best or preferred or otherwise determined value of r. In one embodiment of Mode R, for example, a value of r may comprise a fixed value for all data, or at least over a particular range of values of q. For example, in one specific illustrative embodiment of Mode N, for q between 0.2 and 0.8, a desired value of r might be 6.

In one embodiment of Mode R, it may be desirable for a decoder that is to be used with a particular encoder also to use the same setting of the binary word length r to decode a binary data sequence correctly. In one embodiment of Mode R, a decoder may also use the same encoding technique or techniques. In various embodiments, the encoding techniques might already be known to the decoder, or, in other embodiments, calculated or estimated or otherwise determined by the decoder, or, in yet more embodiments, the techniques might be communicated to the decoder. In one embodiment of Mode R, a way of doing this may comprise communicating the value of r directly. Various techniques of determining the value of r to be used by such a decoder may be used and claimed subject matter is not to be limited to any particular technique.

Some mathematical considerations involved in selecting the data length n in a specific illustrative embodiment of Mode N of combinatorial encoding will now be described. This will be followed by a similar mathematical description of Mode R. It will be seen as a result of these considerations that Mode N may be chosen in some circumstances, and Mode R may be chosen in other circumstances, taking into account the expected theoretical efficiency of each mode, and other practical considerations.

Considering firstly Mode N, it is understood that this are is merely one specific illustrative embodiment to which claimed subject matter is not limited. In one embodiment of Mode N of combinatorial encoding, a code of a binary word may comprise two parts, a first binary symbol code, or selection code, to select r which specifies the number of occurrences of the binary symbol in the word and a second binary symbol code, or pattern code, to specify s which selects which of the $_nC_r$ patterns of r bits occurs in the word.

The encoding of s may be taken as requiring exactly the theoretical cost in this specific illustrative embodiment of Mode N of combinatorial encoding. This may be achievable in practice at least by looking up the pattern in a tabulated form of Pascal's triangle as illustrated at 400 in FIG. 2, or by some other method. In one embodiment, all values of s from 1 to $_nC_r$ may be equally likely, so the number of bits required to encode a particular value of s is therefore $\log_2(_nC_r)$. The probability of a particular value of r may be expressed as:

$$_nC_r p_q(r) = {_nC_r} q^r (1-q)^{n-r}$$

and so the cost of encoding s, i.e. the pattern cost which can be achieved in this example is $$\sum_{r=0}^{n} {_nC_r} q^r (1-q)^{n-r} \log 2(_nC_r)$$

For example, in this embodiment, if n were 6, applying the above formula shows that the ideal pattern cost would be 2.79 bits, to two decimal places.

In this specific example embodiment of Mode N of combinatorial encoding, a simple Variable Length Code (VLC) may be used for the first code which selects a value of r between 0 and n. It is understood that this is merely one illustrative embodiment, and other embodiments may utilize other techniques. Claimed subject matter is not limited to this one embodiment.

In this embodiment of Mode N of combinatorial encoding, a Variable Length Code (VLC), which in many cases and various embodiments may be equivalent to a Huffman Code, may select the most probable value of r by a single bit. Either binary '1' or binary '0 may be used as the terminating bit for the VLC, and in either case the opposite, binary '0' or binary '1' may be used prior to the terminating bit. A number of bits including the terminating bit determines the value communicated by the VLC. In this embodiment, a cost of selecting the second most probable value of r will be 2 bits, either 10 or 01, and similarly a cost of selecting the third most probable value of r will be three bits, either 110 or 001, and so on. In this embodiment, to calculate the cost for a particular value of q, the probabilities of each value of r which are $_nC_r p_q(r) = {_nC_r} q^r (1-q)^{n-r}$ are calculated and sorted into descending order.

For example, with q=0.25 and n=6, the probabilities are given by the table below:

| | | | R | | | | |
|---|---|---|---|---|---|---|---|
| | 0 | 1 | 2 | 3 | 4 | 5 | 6 |
| Probabilities | 0.1780 | 0.3560 | 0.2966 | 0.1318 | 0.0330 | 0.0044 | 0.0002 |

And sorted into descending order these are:

| | | | R | | | | |
|---|---|---|---|---|---|---|---|
| | 1 | 2 | 0 | 3 | 4 | 5 | 6 |
| Probabilities | 0.3560 | 0.2966 | 0.1780 | 0.1318 | 0.0330 | 0.0044 | 0.0002 |

Continuing the current example, the number of bits assigned to each for the VLC is:

| | | | R | | | | |
|---|---|---|---|---|---|---|---|
| | 1 | 2 | 0 | 3 | 4 | 5 | 6 |
| Probabilities | 0.3560 | 0.2966 | 0.1780 | 0.1318 | 0.0330 | 0.0044 | 0.0002 |
| Bits | 1 | 2 | 3 | 4 | 5 | 6 | 7 |

The theoretical cost of the VLC for this illustrative non-limiting embodiment of Mode N of combinatorial encoding, in which q=0.25 and n=6, may be obtained by adding up the corresponding probabilities multiplied by the number of bits used by the VLC to encode them. This comes to 2.2034 bits, as shown by 2.2034 bits=0.3560+(2*0.2966)+(3*0.1780)+(4*0.1318)+(5*0.0330)+(6*0.0044)+(7*0.0002). In one embodiment, the ideal theoretical cost of selecting r may be:

$$\sum_{r=0}^{n} {_nC_r} q^r (1-q)^{n-r} \log 2({_nC_r} q^r (1-q)^{n-r})$$

When n=6 this theoretical cost may be 2.0787. Therefore, the VLC selection cost, in this illustrative embodiment, is 6.0% greater than the ideal theoretical cost. However in this embodiment, adding both the first selection cost for r and the second pattern costs gives a practical costs using the VLC of 4.9923 bits to encode six bits compared to the theoretical ideal total cost of 4.8677 bits. Therefore, it is seen that in this example embodiment the coder may achieve a compressed number of bits which is only 2.6% above the theoretical minimum possible.

Shown in the table below is the calculation of the efficiency of one embodiment of Mode N of combinatorial encoding in which an encoder is using a first VLC code for r and a second ideal code for pattern selection s. This table illustrates an embodiment in which the range of values of q comprises values between 0.05 and 0.5, and in which the range of values of n comprises values from 1 to 35. For every q value there is a "best" value of n shown as bold type. However, it is understood that in various other embodiments of Mode N of combinatorial encoding, there may be another preferred value for n, based upon any of various criteria. The numbers shown in the body of the table are the percentage by which the predicted number of bits exceeds the theoretical minimum for this one illustrative embodiment of Mode N of combinatorial encoding. It is seen that as q gets smaller, encoding with the desired value of n gets closer and closer to the ideal, but this occurs, in this embodiment, at larger and larger values of n, meaning that relatively very large numbers of patterns may be required in this embodiment if r is not very small.

| | q | | | | | | | | | |
|---|---|---|---|---|---|---|---|---|---|---|
| | 0.05 | 0.1 | 0.15 | 0.2 | 0.25 | 0.3 | 0.35 | 0.4 | 0.45 | 0.5 |
| | Entropy | | | | | | | | | |
| | 0.29 | 0.47 | 0.61 | 0.72 | 0.81 | 0.88 | 0.93 | 0.97 | 0.99 | 1 |
| n | Percentage (%) of Inefficiency | | | | | | | | | |
| 1 | 266.6 | 134.5 | 88.6 | 66.2 | 54.1 | 47.5 | 44.5 | 44.2 | 46.1 | 50 |
| 2 | 108.6 | 47.1 | 27.5 | 19.1 | 15.6 | 14.6 | 13.6 | 11.2 | 10.9 | 12.5 |
| 3 | 60.1 | 22.8 | 12.4 | 9 | 8.5 | 5.9 | 5.7 | 4.8 | 4.7 | 6.3 |
| 4 | 37.8 | 12.8 | 7.1 | 6.2 | 4.1 | 3.9 | 3.2 | 3.9 | 3 | 3.9 |
| 5 | 25.5 | 8 | 5.1 | 3.5 | 3.2 | 2.9 | 2.8 | 3.1 | 2.6 | 3.5 |
| 6 | 18.1 | 5.5 | 3.9 | 3 | 2.6 | 2.6 | 2.9 | 2.8 | 2.8 | 3.3 |
| 7 | 13.2 | 4.2 | 2.7 | 2.3 | 2.7 | 2.8 | 2.9 | 2.8 | 3 | 3.4 |
| 8 | 9.9 | 3.6 | 2.5 | 2.5 | 2.6 | 2.7 | 2.9 | 3.1 | 3.3 | 3.5 |
| 9 | 7.7 | 3.3 | 2.3 | 2.5 | 2.7 | 3 | 3.2 | 3.4 | 3.5 | 3.7 |
| 10 | 6 | 2.5 | 2.1 | 2.4 | 2.8 | 3.1 | 3.4 | 3.5 | 3.7 | 3.8 |
| 11 | 4.9 | 2.1 | 2.3 | 2.6 | 3 | 3.2 | 3.4 | 3.6 | 3.8 | 3.9 |

-continued

| | q | | | | | | | | | |
|---|---|---|---|---|---|---|---|---|---|---|
| | 0.05 | 0.1 | 0.15 | 0.2 | 0.25 | 0.3 | 0.35 | 0.4 | 0.45 | 0.5 |
| | | | | | Entropy | | | | | |
| | 0.29 | 0.47 | 0.61 | 0.72 | 0.81 | 0.88 | 0.93 | 0.97 | 0.99 | 1 |
| n | | | | | Percentage (%) of Inefficiency | | | | | |
| 12 | 4 | 2 | 2.3 | 2.6 | 3 | 3.4 | 3.6 | 3.7 | 3.8 | 4 |
| 13 | 3.4 | 2.1 | 2.3 | 2.8 | 3.2 | 3.4 | 3.8 | 3.8 | 3.9 | 4.1 |
| 14 | 3 | 1.9 | 2.4 | 2.9 | 3.3 | 3.6 | 3.8 | 4 | 4 | 4.2 |
| 15 | 2.7 | 1.8 | 2.5 | 3 | 3.4 | 3.7 | 3.9 | 4.1 | 4.1 | 4.3 |
| 16 | 2.5 | 1.9 | 2.5 | 3.1 | 3.5 | 3.8 | 4 | 4.1 | 4.2 | 4.3 |
| 17 | 2.4 | 2.1 | 2.6 | 3.1 | 3.6 | 3.9 | 4.1 | 4.2 | 4.3 | 4.4 |
| 18 | 2.4 | 2.1 | 2.7 | 3.3 | 3.6 | 3.9 | 4.1 | 4.2 | 4.4 | 4.4 |
| 19 | 2.3 | 2.1 | 2.8 | 3.4 | 3.7 | 4 | 4.2 | 4.4 | 4.4 | 4.5 |
| 20 | 2 | 2.1 | 2.8 | 3.4 | 3.8 | 4 | 4.2 | 4.4 | 4.5 | 4.5 |
| 21 | 1.8 | 2.2 | 2.9 | 3.5 | 3.8 | 4.1 | 4.3 | 4.4 | 4.5 | 4.6 |
| 22 | 1.7 | 2.3 | 3 | 3.5 | 3.9 | 4.2 | 4.3 | 4.4 | 4.5 | 4.6 |
| 23 | 1.6 | 2.3 | 3 | 3.6 | 4 | 4.2 | 4.4 | 4.4 | 4.5 | 4.6 |
| 24 | 1.6 | 2.4 | 3.1 | 3.6 | 4 | 4.2 | 4.4 | 4.5 | 4.5 | 4.6 |
| 25 | 1.6 | 2.4 | 3.2 | 3.7 | 4 | 4.2 | 4.4 | 4.5 | 4.5 | 4.6 |
| 26 | 1.7 | 2.4 | 3.2 | 3.7 | 4 | 4.3 | 4.5 | 4.5 | 4.6 | 4.7 |
| 27 | 1.7 | 2.5 | 3.3 | 3.7 | 4.1 | 4.3 | 4.4 | 4.5 | 4.6 | 4.7 |
| 28 | 1.7 | 2.6 | 3.3 | 3.8 | 4.1 | 4.3 | 4.4 | 4.5 | 4.6 | 4.7 |
| 29 | 1.6 | 2.7 | 3.4 | 3.8 | 4.1 | 4.3 | 4.5 | 4.6 | 4.6 | 4.7 |
| 30 | 1.6 | 2.6 | 3.4 | 3.8 | 4.1 | 4.4 | 4.5 | 4.6 | 4.7 | 4.7 |
| 31 | 1.5 | 2.7 | 3.4 | 3.9 | 4.2 | 4.4 | 4.5 | 4.6 | 4.6 | 4.7 |
| 32 | 1.6 | 2.7 | 3.5 | 3.9 | 4.2 | 4.4 | 4.5 | 4.6 | 4.6 | 4.7 |
| 33 | 1.6 | 2.8 | 3.5 | 3.9 | 4.2 | 4.4 | 4.5 | 4.6 | 4.6 | 4.7 |
| 34 | 1.7 | 2.8 | 3.5 | 3.9 | 4.2 | 4.4 | 4.5 | 4.6 | 4.6 | 4.7 |
| 35 | 1.8 | 2.8 | 3.6 | 4 | 4.2 | 4.4 | 4.5 | 4.6 | 4.6 | 4.7 |
| Min % | 1.5 | 1.8 | 2.1 | 2.3 | 2.6 | 2.6 | 2.8 | 2.8 | 2.6 | 3.3 |
| "best" n | 31 | 15 | 10 | 7 | 6 | 6 | 5 | 6 | 5 | 6 |

In one embodiment of Mode N of combinatorial encoding, the illustrated technique may be relatively very efficient and convenient if the probability of a symbol, q, is between 0.2 and 0.5. In embodiments where the symbol string is a binary value, the number of patterns occurring at q are the same as at (1-q), except that they are the reverse, e.g., obtained by substituting '1' for '0' or vice versa. This means that one or more example embodiments may yield particularly good performance and use convenient numbers of patterns $_nC_r$ for q between 0.2 and 0.8.

However, in embodiments of Mode N of combinatorial encoding in which the probability q of the binary symbols is relatively very small, a better encoding may be obtained using a large value of n. However in most cases there is at least one most efficient choice of n for a given q. With q=0.05 the binary symbol string is quite rare, occurring one in every 20 bits of data, and the most efficient word or block length n is 31, in this embodiment of Mode N of combinatorial encoding. Unfortunately, for embodiments involving relatively large values of r this will lead to relatively very large numbers of patterns $_{31}C_r$. However, upon further examining this embodiment, it can be seen that of the probabilities of different numbers of '1' bits occurring among the 31, there is a 33% chance that r=0, i.e. all the bits will be zeros, and all values of r greater than eight have very small probabilities of occurrence, less than 1 in 10,000. The number of patterns $_{31}C_8$ is 7,888,725, for this embodiment, which may be relatively quite large but not impossible either to store or to calculate.

In various embodiments of Mode N of combinatorial encoding, a number of strategies may be used, possibly in various embodiments the strategies may be used in combination. Firstly, in one embodiment, if the value of $_nC_r$ becomes inconveniently large, the block may be sent simply as n bits, not coded. This may be a relatively rare occurrence and would reduce the overall efficiency of the coder only slightly. Secondly, in another embodiment of Mode N of combinatorial encoding, a value of n smaller than the desired may be used. For example with q=0.05, n=16 could be used and the predicted performance of the coder, in the illustrative embodiment shown in the table, is still only 2.5% worse than the theoretical optimum. With n=16, 44% of the blocks are all zeros, and all values of r greater than 6 have probability of occurrence less then 1 in 10,000. The number of patterns $_{16}C_6$ is 8008 which is neither impossible, in some embodiments, to either store or generate on the infrequent occasions that r=8 arises. In some embodiments, these strategies may be used in combination, for example using n=16 and sending 16 bits uncoded whenever r>4 would still be within 3% of the optimum and ensure that there are never more than $_{16}C_4$=1820 patterns to choose from.

It can be seen from the table that for q between 0.2 and 0.5 the most efficient choice is 5 or 6 or 7, which is a short word or block. In one embodiment, for q=0.5 perfect coding may be obtained just by sending the bits, but it is again interesting that embodiments disclosed herein may only be 3.3% worse than the theoretical cost.

In one embodiment of Mode N of combinatorial encoding, it is seen that for a given probability q it is possible to select the first and second coding techniques and the word or block length n to give a predicted compression which is lowest, e.g., closest to the theoretical minimum. In some embodiments of Mode N of combinatorial encoding, said selection may be done subject to any other constraint such as limit on n or any other characteristic of the technique or another constraint.

The description of the choice of parameters for combinatorial encoding now turns to consideration of Mode R. As shall be described in more detail below, in a similar specific example embodiment of Mode R of combinatorial encoding a Golomb Code may be used for the value of a length of data n which contains a specified number of occurrences r of a selected symbol string. In such an embodiment Mode R of combinatorial encoding, a data length n may be Golomb encoded by an exponent value E and a residual value R, the exponent value being encoded substantially according to a variable length code (VLC), again, as described in more detail below. This method of encoding is similar to the hybrid Huffman/Golomb code as taught by Monro in U.S. patent application Ser. No. 11/422,316. It is understood that this is merely one illustrative embodiment Mode R of combinatorial encoding, and other embodiments may utilize other techniques. Claimed subject matter is not limited to this one embodiment.

Golomb encoding is well-known and described in Golomb, S W: 'Run-length encodings', *IEEE Trans. Inf. Theory*, 1966, 7, (12), pp. 399-401. Golomb Codes are simply one example of data encoding. Therefore, while this illustrative embodiment Mode R of combinatorial encoding is described in terms of Golomb encoding, it should be clear that it is intended that claimed subject matter not be limited in scope simply to embodiments using Golomb codes (GCs). Other approaches to encoding a first symbol string code n for a length of data containing r occurrences of a selected symbol string may be employed and provide satisfactory results. Nonetheless, continuing with Golomb encoding as one example, GCs may be used for run length coding, but, in principle, may be used as general purpose codes that may be used to encode any symbol, or sequence of symbols, as an integer numeral or a sequence of integer numerals. To do this a unique integer numeral is assigned to each symbol and each symbol is then encoded by Golomb encoding the corresponding numeral. GCs have an advantage that the range of numerals need not be known or constrained in advance. This is ideal for the current illustrative embodiment Mode R of combinatorial encoding because the data length n is a positive, non-zero numeral and in theory is unconstrained, in that it may take any value from the specified number of occurrences r to infinity.

n one particular example, a Golomb Code of a data length n, modulo K (where K is the 'base' in this example) may be defined by a pair of numerals (E, R) as follows:

E=the exponent fix($\log_K(n)$), where fix( ) denotes here a truncation operation, that is, rounding to the next lowest integer numeral.

R=n$-K^E$, is referred to here as a "residual."

The value of n, therefore, may be recovered from the Golomb code (E, R) by $n = K^E + R.$ It is noted, however, that $\log_K(0)$ may provide a mathematical quirk in that K raised to any power does not provide zero. However in this example embodiment no such difficulty will arise as the data length n is always positive and greater than zero.

At times, out of convenience, for example, K=2, so that a Golomb Code, for example, may provide a form of binary floating point representation of variable length, with exponent E and residual R of variable length E bits. This is the form of Golomb code that will be used in this illustrative, non limiting, example embodiment.

In this particular embodiment of Mode R of combinatorial encoding, for example, a Variable Length Code (VLC) may be employed to make substitutions for the exponent E of a Golomb code in which short codes may be used for more frequently occurring symbols and longer codes for less frequently occurring symbols. In this way, the average length of a code may be reduced. One well-known example of a VLC comprises Huffman encoding, although many other examples exist. For example, Fano/Shannon encoding comprises a VLC, as does the Morse code, which substitutes short codes for frequently occurring letters like E (one dot) and longer ones for others like X (dash dot dot dash). Of course, claimed subject matter is not limited in scope to these examples. These are provided merely for purposes of illustration.

In this embodiment of Mode R of combinatorial encoding the Variable Length Code (VLC), which in many cases and various embodiments may be equivalent to a Huffman Code, may select the most probable value of E by a single bit. Either binary '1' or binary '0' may be used as the terminating bit for the VLC, and in either case the opposite, binary '0' or binary '1' may be used prior to the terminating bit. The number of bits including the terminating bit determines the value communicated by the VLC. In this embodiment of Mode R of combinatorial encoding, the cost of selecting the second most probable value of E will be two bits, either 10 or 01, and similarly the cost of selecting the third most probable value of E will be three bits, either 110 or 001, and so on. It will be evident to one skilled in the art that this simple VLC may be in some circumstances not the same as a Huffman code, but being simpler it serves to illustrate the excellent performance of this particular, non-limiting, example embodiment. If anything, the use of a Huffman code for E, may only result in improved performance.

In this embodiment of Mode R of combinatorial encoding, to calculate the cost for a particular value of q, a range of values of n from the specified value of r to some large value is considered. Over such a range of n, a much smaller range of values of the exponent E in the Golomb code for n will occur. For each E the number of bits in the residual R is also E. Over the range of n to be considered, the probability of each value of n which is $_{n-1}C_{r-1}p_q(r) = _{n-1}C_{r-1}q^r(1-q)^{n-r}$ is calculated, as is the Golomb Code (E, R). The probabilities of each E are summed and sorted into descending order. For example, with q=0.20 and r=4, the probabilities of each E are given by the table below.

| | Range of n | | | | | | | |
|---|---|---|---|---|---|---|---|---|
| | 1 | 2-3 | 4-7 | 8-15 | 16-31 | 32-63 | 64-127 | 128-255 |
| Exponent E | 0 | 1 | 2 | 3 | 4 | 5 | 6 | 7 |
| Probabilities | 0 | 0 | .033 | .318 | .541 | .106 | .001 | .000 |
| R Bits | 0 | 1 | 2 | 3 | 4 | 5 | 6 | 7 |

Sorted into descending order of probabilities these are:

| | Range of n | | | | | | | |
|---|---|---|---|---|---|---|---|---|
| | 1 | 2-3 | 4-7 | 8-15 | 16-31 | 32-63 | 64-127 | 128-255 |
| Exponent E | 4 | 3 | 5 | 2 | 6 | 7 | 0 | 1 |
| Probabilities | .541 | .318 | .106 | .033 | .001 | 0 | 0 | 0 |
| E Bits | 1 | 2 | 3 | 4 | 5 | 6 | — | — |
| R Bits | 4 | 3 | 5 | 2 | 6 | 7 | 0 | 1 |

The theoretical cost of the simple VLC for this illustrative non-limiting embodiment of Mode R of combinatorial encoding, in which q=0.20 and r=4, may be obtained by adding up the corresponding probabilities multiplied by the number of bits used to encode them. Accordingly, the average cost of the exponent E may be determined from the above data by the sum $E$ cost=0.541+0.318*2+0.106*3+0.033*4+ 0.001*5=1.64 bits Similarly the average cost of the residual R is $R$ cost=0.541*4+0.318*3+0.106*5+0.033*2+ 0.001*6=3.72 bits So that the average cost of the first symbol string code n is 1.64+3.72=5.36 bits. In this embodiment of Mode R of combinatorial encoding, the theoretical cost of encoding n by a perfect coding method is $$-\sum_{k=r}^{\infty} p_q^*(k)\log_2(p_q^*(k))$$

which for q=0.2 and r=4 is 5.08 bits. This practical embodiment of Mode R of combinatorial encoding, therefore, uses only an extra 0.24 bits on average in coding r=4 occurrences of the symbol string code, i.e. 0.06 bits per occurrence, which one skilled in the art would consider to be extremely efficient.

To illustrate further how close this simple, practical, and achievable embodiment of Mode R of combinatorial encoding comes to ideal encoding of a sequence of symbol strings, account is also taken of the second symbol string code. The second symbol string code s, which specifies which of the $_{n-1}C_{n-1}$ patterns has occurred, and it is always possible to achieve the ideal cost $\log_2(_{n-1}C_{r-1})$ bits at least by looking up the pattern in a tabulated form of Pascal's triangle as illustrated at 400 in FIG. 2, or by some other method. The average cost of the second symbol string code is the sum, $$-\sum_{k=r}^{\infty} p_q^*(k)\log_2(_{k-1}C_{r-1})$$

which in the present example with q=0.20 and r=4, is easily computed as 9.36 bits.

Adding these costs together, it is seen that the average cost of encoding the r=4 occurrences of the selected symbol string is 5.36+9.36=14.72 bits. With perfect encoding of the second symbol string code, which is achievable as discussed previously, this would be 14.44 bits, so in this specific example of Mode R of combinatorial encoding, the encoding is very close to perfect, costing only 1.9% more bits than the ideal for this specific instance of the present illustrative, non-limiting embodiment of Mode R of combinatorial encoding. This nearly ideal performance that can be obtained using claimed subject matter in a practical situation is an excellent result, but is by no means an isolated example as will be illustrated.

Carrying out similar calculations to the above, the table below summarizes the performance of the present, non-limiting embodiment of Mode R the combinatorial encoder with specified occurrences using a Golomb coder to encode the data length n with VLC exponent E, over a range of values of r and q:

It can be seen from the table that for q between 0.05 and 0.50 the most efficient choice of r is 4 or 5 or 6, which except for the smallest probabilities leads to convenient numbers of patterns s. Although with q=0.05 the number of patterns s at the peak (most likely) value of n is nearly 500,000, this may still be a feasible approach to compression as will be discussed. Predicted performance may be better than with r smaller, and is particularly better than with r=1, which would be equivalent to a simple run length encoder as would be evident to one skilled in data compression.

It is evident from these results that the present illustrative embodiment of Mode R of combinatorial encoding gives excellent results for values of q which are 0.25 or less. This is an important range for many data compression tasks such as audio, image, or video encoding. In embodiments where the symbol string is a binary value, the number of patterns occurring at q are the same as at (1−q), except that they are the reverse, i.e. obtained by substituting '1' for '0' or vice versa. This means that embodiments disclosed herein also give particularly good performance and use convenient numbers of patterns $_{n-1}C_{r-1}$ for q between 0.75 and 1.0.

However, in embodiments of Mode R of combinatorial encoding in which the probability q of the binary symbols is very small, a better theoretically predicted encoding may be obtained using a large value of r. With q=0.05 the binary symbol string is quite rare, occurring one in every 20 symbols of data, and the most likely length of data containing r=4 occurrences is found to be 60 as tabulated above. Fortunately $_{60}C_4$ is 487,635 which a manageable number in modern digital computers where integers in a range up to $2^{32}$ may be conveniently expressed. However it may or may not be convenient to store vast tables of such numbers, or to compute them as required by some other means. For embodiments of Mode R of combinatorial encoding involving large values of n or r this may lead to very large numbers of patterns $_{n-1}C_{r-1}$. It may be possible that some means of generating the pattern number s would still be practical, but no such method has hitherto been discovered.

Similarly, for even smaller values of q, as may occur in practical situations, it may be necessary to constrain r to a value which is less than the best value as might be calculated by the methods used above.

In various embodiments of Mode R of combinatorial encoding, a number of strategies may be used, and possibly in various embodiments the strategies may be used in combination. Firstly, in one embodiment, if the value of $_{n-1}C_{r-1}$ becomes inconveniently large, a value of r smaller than the desired may be used. For example with q=0.05, r=2 could be

| | | | | | q | | | | | |
|---|---|---|---|---|---|---|---|---|---|---|
| | 0.05 | 0.1 | 0.15 | 0.2 | 0.25 | 0.3 | 0.35 | 0.4 | 0.45 | 0.5 |
| | | | | | Entropy | | | | | |
| | 0.29 | 0.47 | 0.61 | 0.72 | 0.81 | 0.88 | 0.93 | 0.97 | 0.99 | 1 |
| r | | | | | Percentage (%) of Inefficiency | | | | | |
| 1 | 6.7 | 7.5 | 7.9 | 8.4 | 8.5 | 9.0 | 9.6 | 10.8 | 11.7 | 13.3 |
| 2 | 1.5 | 2.0 | 2.5 | 2.9 | 3.7 | 4.3 | 5.4 | 6.2 | 8.4 | 10.4 |
| 3 | 1.1 | 1.4 | 1.7 | 1.9 | 3.1 | 3.2 | 4.8 | 5.4 | 6.2 | 7.9 |
| 4 | 0.9 | 1.3 | 1.7 | 2.0 | 2.9 | 3.0 | 3.8 | 4.3 | 5.8 | 8.1 |
| 5 | 1.0 | 1.4 | 2.0 | 2.0 | 2.3 | 3.5 | 3.6 | 4.0 | 5.0 | 5.9 |
| 6 | | | | | 2.1 | 2.3 | 2.6 | 3.8 | 4.4 | 4.5 | 5.2 |
| Min % | 0.9 | 1.3 | 1.7 | 1.9 | 2.3 | 2.6 | 3.6 | 4.0 | 4.5 | 5.2 |
| "best" r | 4 | 4 | 4 | 4 | 5 | 5 | 5 | 5 | 6 | 6 |
| Peak n | 60 | 30 | 20 | 15 | 16 | 14 | 12 | 10 | 12 | 10 | used and the predicted performance of the coder, in the illustrative embodiment shown in the table, is still only 1.5% worse than the theoretical optimum. It is noted that using r=2 in this situation is still significantly better than using r=1. One advantage of the presently illustrated embodiment lies in the efficient encoding of a pattern s when r is greater than 1. However, for even smaller probabilities the best strategy may be to revert to r=1 in which case no pattern is required to be encoded and the Golomb coder is working as a traditional run length encoder in which the advantages a combinatorial encoder are not being exploited. It is clear from the calculations tabulated above that, provided the pattern s can be encoded, the present subject matter in this illustrative embodiment may outperform a Golomb encoder with VLC exponent used with r=1 as a simple run length encoder. Although the comparisons have not been made herein, it is also possible that particular embodiments may outperform any currently known run length coder, particularly with low probabilities q.

In one embodiment of Mode R of combinatorial encoding, it is seen that for a given probability q it is possible to select the number of specified occurrences r and the first and second coding techniques to give the predicted compression which is lowest, i.e. closest to the theoretical minimum. In some embodiments, this may be done subject to any other constraint such as a limit on n or a limit on r or a limit on $_{n-1}C_{r-1}$ or any other characteristic of the technique or another constraint.

Calculations described or similar to those described above in regard to the specific illustrative embodiments of both Mode N and Mode R of combinatorial encoding, may be performed for other techniques of encoding the first symbol string codes n or r. Similarly, in another embodiment, an arithmetic code may be considered. With an arithmetic code the results might be predicted theoretically or by simulation. More generally several coding techniques might also be evaluated and the results noted. Many techniques might be used, in various embodiments, to form the first and second binary symbol code and claimed subject matter is not limited to any particular technique for forming the first binary symbol code or the second binary symbol code.

From the above discussion it may be seen that for a particular known or estimated or assumed value of q, a best the best or preferred or otherwise determined method of encoding may be selected as by actions 1030 and 1060 of FIG. 1. Mode N of combinatorial encoding may be selected by action 1060 for values of q close to 0.5. Mode R of combinatorial encoding may be by action 1060 selected for values of q which are farther from 0.5. In addition, a completely different method of encoding may be selected by action 1030 for values of q which are close to 0 or 1. More generally several encoding techniques might also be evaluated and the results noted. These are but non-limiting illustrations of methods of choosing a coding method and the choice of encoding method is not so limited.

From these results for a particular value of q, or by carrying out similar calculations or by reference to calculations previously carried out or by some other method, a choice of Mode N or Mode R of combinatorial encoding may be made. Similarly, a value of n or of r may be determined and/or techniques of coding either or both of the first code for r or n and the second code for s may be selected for a data sequence.

A specific illustrative example embodiment of a set of rules for efficient encoding of binary symbols might include the following;

If the estimated or otherwise determined value of q is greater than or equal to 0.47 and less than or equal to 0.53, do not choose combinatorial encoding by action 1030, and at action 1040 choose to send the binary symbols as plain bits;

If the estimated or otherwise determined value of q is greater than or equal to 0.25 and less than 0.47, or greater than 0.53 and less than or equal to 0.75 select Mode N of combinatorial encoding at action 1060, select a specified value of n at action 1070 according to the methods discussed Huffman encode the value of r at action 1090, and code s at action 1130 by a preferred technique.

If the estimated or otherwise determined value of q is greater than or equal to 0.1 and less than 0.25, or greater than 0.75 and less than or equal to 0.9, select Mode R of combinatorial encoding by action 1030, select a specified value of r at action 1100 according to the methods discussed, code the value of n at action 1120 by Golomb encoding with Huffman encoded exponent, and code s at action 1130 by a preferred technique.

If the estimated or otherwise determined value of q is less than 0.1 or greater than 0.9, code the distance between occurrences of the binary symbol by Golomb encoding with adaptive Huffman exponents, perhaps as disclosed by Monro in U.S. patent application Ser. No. 11/422,316, although the scope of claimed subject matter is not limited in this respect. This is equivalent to selecting r=1 in Mode R of combinatorial encoding, which a skilled practitioner of data compression would recognize as a traditional form of Run Length Coding (RLC) of the occurrences of a symbol string.

The above specific illustrative example embodiment is merely given for the purposes of illustration and such a scheme or any other scheme is not meant to limit the scope of claimed subject matter. Many such combinations may be chosen in any particular embodiment and claimed subject matter is not limited to the embodiments and examples discussed herein.

Prior to this point, the discussion of claimed subject matter has concentrated mainly on the binary case, where the symbol string coded is the symbol '1' or '0'. There now follows considerations that apply to the more general case of Combinatorial coding, through two further specific example embodiments. Each is considered firstly for Mode N of combinatorial encoding followed by secondly Mode R or combinatorial encoding As illustrated by Action 1020 of FIG. 1, in some embodiments a symbol string may be selected for encoding. In the illustrative embodiment just described, the symbol string comprises a binary symbol string. In other embodiments, occurrences of more lengthy and/or complex symbol strings may be sought. As described in more detail below, such symbol strings may comprise symbol strings having a fixed, predefined form, or alternatively, may comprise symbol strings having flexibility, such as, in form, length, and/or composition, for example. In various embodiments, the extent of flexibility may be predefined or it may be calculated with some dependence at least in part upon some characteristic or characteristics of the data. Some further example symbol strings are set out below and may include one or more of:

any letter, symbol or character a, such as, for example, "x" (This may include a single symbol position);
any bigraph $a_1$, $a_2$, such as "st";
any combination $a_1$, $a_2$ $a_3$, such as "str"; and
any longer combination $a_1$, $a_2$ $a_3$ ... $a_n$, such as "st___ng" where the underscores represent single symbol positions.

In one embodiment, illustrated by Action 1170 of FIG. 1, after positions of a first symbol string have been determined, there may be more symbol strings to encode, so that encoding may return to action 1020 so that positions of a second symbol string in a list of possible or known symbol strings may be determined, and so on for as many symbol strings as are to be encoded.

Gradually, in this manner, a set of data may, in one embodiment, be encoded. As encoding proceeds, an encoder may communicate to a decoder information about symbol strings that have been located, such as position(s), in real time for some embodiments. Alternatively in other embodiments, encoded data may be stored locally as a compressed representation.

In one example embodiment of mode N of combinatorial encoding, a process for encoding may be expressed in pseudo-code as follows:

```
For A = Symbol Strings
    Indicate R = Number of Occurrences of A in Length N
    Indicate the pattern S of R Occurrences in Length N
End
```

Similarly in one example embodiment of mode R of combinatorial encoding, a process for encoding may be expressed in pseudo-code as follows:

```
For A = Symbol Strings
    Indicate N = Length of data with R occurrences of A
    Indicate the pattern S of R Occurrences in Length N
End
```

Second Example

As a second illustrative, non-limiting, example embodiment, consider a short sequence S of eight symbol strings S1 to S8. For purposes of illustration, symbol strings here comprise a fragment of text, although claimed subject matter is not limited in scope in this respect. Such fragments are short and, furthermore, symbol strings may not comprise text at all and still be within the scope of claimed subject matter. A space between the two words also comprises a symbol string in this example, as illustrated below:

| S: 'the test' | | | | | | | |
|---|---|---|---|---|---|---|---|
| S1 | S2 | S3 | S4 | S5 | S6 | S7 | S8 |
| t | h | e | 'space' | t | e | s | t |

Deliberately in this example embodiment the letters chosen are among the most common ones to occur in English text.

Second Example Mode N

The encoding of this sequence is first of all described using Mode N of the combinatorial encoder, with n=8. By this method, the different symbols that occur are coded one at a time by determining the number of occurrences r of each and encoding the number of occurrences r and the pattern of occurrences s according to claimed subject matter.

Of course, claimed subject matter is not limited to this second example embodiment of Mode N of combinatorial encoding or to any one particular embodiment. This example is simply an illustration for explanatory purposes. Many other potential embodiments of Mode N of combinatorial encoding are intended to be included within the scope of claimed subject matter.

In this simple example of Mode N of combinatorial encoding, first the symbol 'h' may be selected as a symbol string for encoding. There is one occurrence of 'h' in the eight symbols of the example. To encode the positions of 'h, the first symbol string code r is therefore 1. There are Error! Objects cannot be created from editing field codes possible patterns of 1 positions for 'h' in the eight symbols. By reference to FIG. 2 in the table at 400, it can be seen that $_8C_1$ is eight. There are eight possible patterns, all equally probable, and therefore having a theoretical cost of $\log_2 8$ bits, i.e. 3 bits. It is always the case that $_nC_1$ is n.

Continuing with the example of Mode N of combinatorial encoding, an encoder and decoder may, in this illustrative embodiment, either have a table of all eight possible patterns of one bit among eight, or, in another embodiment, this particular pattern may be generated and identified. It is noted that this does not differ fundamentally from the binary situation. The positions not occupied by 'h' may all be considered to be '0' if encoding the positions occupied by 'h' as '1'. The pattern sought for 'the test' is therefore 0100 0000, and there may be a number $s_h$ identifying this pattern which depends on the order in which the patterns are stored or generated. The code for 'h' is therefore $(1, s_h)$.

Encoding, in this embodiment of Mode N of combinatorial encoding, may then move on to 'space' and similarly encode it by $(1, s_{space})$, and then encode 's' by $(1, s_s)$.

At this point all the symbols occurring once have been encoded, and there remain the symbols 'e' and 't'. The next one selected may be 'e' in which case there are two occurrences, so that the number of patterns is twenty-eight. In the code for 'e', $(2, s_e)$, $s_e$ may indicate one of these twenty-eight symbols. Finally in coding 't', the code will be $(3, s_t)$. The collected code for this message is therefore:

$1, s_h, 1, s_{space}, 1, s_s, 2, s_e, 3, s_t$

In other embodiments of Mode N of combinatorial encoding, the symbols to be encoded may have been selected in any order, and at this point in the explanation of the illustrative embodiment of Mode N of combinatorial encoding no particular technique of selection has been shown to be preferred; however it will now be shown that the order of selection can affect the compression performance, in various embodiments.

In one embodiment of Mode N of combinatorial encoding, compression may be improved still further by a technique analogous to "significance switching." More specifically, here, for each successive symbol string that is encoded, positions to be encoded become fewer as more and more symbol strings become determined by position. This additional information regarding position may be employed to provide additional compression.

It is noted that, in some instances, as soon as a symbol has been encoded, the number of unknown positions is reduced. In the example above, putting 'x' for a known position, the unknown positions reduce as follows:

| 0100 0000 | 0x01 0000 | 0x0x 0010 | 0x1x 01x0 | 1xxx 1xx1 |
|---|---|---|---|---|
| Scan for h | Scan for space | Scan for s | Scan for e | Scan for 't' |

Third Example Mode N

An advantage may be gained by taking account of the reducing number of unknown data positions. In a third example illustrative embodiment of Mode N of combinatorial encoding, this may entail effectively by skipping over the unknown positions when the pattern is applied.

In coding 'h' in this third example illustrative embodiment of Mode N of combinatorial encoding, there is no difference, one pattern from $_8C_1=8$ is selected by $s_h$. However in coding 'space', both the coder and decoder will know, in this embodiment, that there are only seven unknown positions. So that the selected pattern can be based on one bit from the seven unknown bits, i.e. one pattern from $_7C_1=7$ may be selected by $s_{space}$. The theoretical cost of this is therefore reduced to $\log_2 7=2.8$ bits compared to the second illustrative embodiment of Mode N of combinatorial encoding. There is no such thing as 0.8 of a bit, of course, but on average in a long message it may be possible to achieve this by using an efficient technique of encoding s.

Similarly in encoding 's', the number of combinations to select the pattern from may be reduced again, to $_6C_1=6$, with a theoretical cost of $\log_2 6=2.6$ bits.

A large advantage of this Skipping approach may now be seen in encoding the two occurrences of 'e'. To encode the two positions of 'e', one of $_5C_2=10$ patterns is to be selected with an expected cost of $\log_2 10=3.3$ bits. Compared to the previous second example of Mode N of combinatorial encoding in which the data length was always eight, this has been reduced from 28 patterns in the second example illustrative embodiment of Mode N of combinatorial encoding which would have cost an expected $\log_2 28=4.8$ bits.

An even larger advantage may be gained. Assuming the encoder and decoder, in this third example embodiment of Mode N of combinatorial encoding, know that they have now reached the final symbol string, and that it is 't', then the cost of encoding the three occurrences of 't' is zero bits. In some embodiments a technique of knowing this is useful, as will be explained below.

The advantage gained form this Skipping approach is tabulated below:

| | Code | Theoretical s Cost without 'Skipping' (Second example embodiment) | Theoretical s Cost with 'Skipping' (Third example embodiment) |
|---|---|---|---|
| h | 1, $s_h$ | 3 | 3 |
| space | 1, $s_{space}$ | 3 | 2.8 |
| s | 1, $s_s$ | 3 | 2.6 |
| e | 2, $s_e$ | 4.8 | 3.3 |
| t | 3, $s_t$ | 5.8 | 0 |

This of course is a relatively very simple third example, non-limiting, illustrative embodiment of Mode N of combinatorial encoding. In other embodiments, an encoder could choose symbol strings for coding in order to reduce the cost of encoding the pattern selection s. In the example given this may be by encoding the rarest symbols first but in a real application a more complex approach may be justified. This may not be a consideration in encoding binary data because the number of '0' patterns may always be the same as the number of '1' patterns for any given value of the first code r, because the number of patterns with n−r bits is $_nC_{n-r}$ which may be always the same as $_nC_r$.

However with more than two symbols, it may become advantageous to minimize the cost of sending the pattern selection s.

Second Example Mode R

Discussion now returns to the second specific example of encoding a sequence containing several different symbols by describing Mode R of the combinatorial encoder, with r=2. By this method, the different symbols that occur are encoded one at a time by determining a data length n containing the specified number of occurrences r of each and encoding the data length n and the pattern of occurrences s according to claimed subject matter.

As with Mode N, a short fragment of text will be encoded,

| S: 'the test' | | | | | | | |
|---|---|---|---|---|---|---|---|
| S1 | S2 | S3 | S4 | S5 | S6 | S7 | S8 |
| t | h | e | 'space' | t | e | s | t |

In this second example of Mode R of combinatorial encoding a specified number of occurrences r is used to illustrate again the advantage of always choosing a shortest data length n that contains r occurrences, and what is done towards the end of a data sequence if there are insufficient occurrences of a symbol string to make up the specified r occurrences.

In this second example of Mode R of combinatorial encoding, the symbol 'h' is selected as the first symbol string for encoding. There is one occurrence of 'h' in the eight symbols of the example. Therefore to indicate that there is only one occurrence of 'h' which is insufficient to satisfy the specified value of r=2, the first symbol string code is taken as n=9. This may tell a decoder in this embodiment of Mode R of combinatorial encoding that there is only one occurrence of 'h', and the second symbol string code s will indicate the pattern of data, in this case a selection of one of the eight possible patterns of 1 'h' among eight symbols which may be called $s_8$. By reference to FIG. 1 in the table at 400, it can be seen that $_8C_1$ is 8. There are eight possible patterns, all equally probable, and therefore having a theoretical cost of $\log_2 8$ bits, i.e. three bits. It is always the case that $_nC_1$ is n.

As previously, an encoder and decoder may, in this second illustrative example embodiment of Mode R of combinatorial encoding, either have a table of all eight possible patterns of one bit among eight, or, in another embodiment, they may have a means of generating and identifying this particular pattern. There are many possible methods of ordering the $_nC_r$ possible patterns of r bits from n, and claimed subject matter is not limited to any particular method of encoding the pattern s. It is emphasized once more that this does not differ fundamentally from the binary situation. The positions not occupied by 'h' could all be considered to be '0' if encoding the positions occupied by 'h' as '1'. The pattern sought for 'the test' is therefore 0100 0000, and there may be a number $s_8$ identifying this pattern which depends on the order in which the patterns are stored or generated. The code for 'h' in this second example embodiment of Mode R of combinatorial encoding is therefore (9, $s_8$).

Encoding, in this second example embodiment of Mode R of combinatorial encoding, may then move on to 'space' and similarly encode it by (9, $s_8$), and then encode 's' by (9, $s_8$). For all of the symbols encoded so far in this second example embodiment of Mode R of combinatorial encoding, the first symbol string is 9, which is one longer than the length of the data to be encoded. As in the previous example of encoding with Mode R of combinatorial encoding, a first symbol string which is one longer than the length of the data to be encoded indicates that there is one less occurrence of the symbol string than the specified value of r. Specifically, one occurrence occurs in length eight even though the specified number r is two. The first symbol string code is therefore 9. By this means it is seen that the encoder can operate effectively if this situation occurs.

At this point in this second illustrative example of Mode R of combinatorial encoding all the symbols occurring once have been encoded, and there remain the symbols 'e' and 't'. The next one selected may be 'e' in which case there are two occurrences. An encoder seeks a length n which contains r=2 occurrences of 'e' for each symbol string code pair it generates. The symbol string 'e' is in positions three and six. The first symbol string code for this pair of symbol strings 'e' could be any value of n from 6 to 8. However applying the convention that the shortest length n is selected, the first symbol string code would be 6 and the second symbol string code would select a pattern of one bit from 5, i.e. $s_5$. It is then necessary to carry the encoding two positions beyond the end of the data by sending a first symbol string code n=4, which indicates that the position is carried two positions beyond the end of the data. A decoder in such an embodiment can deduce that there are no 'e' symbol strings in positions 7 and 8, so that there is no pattern to transmit.

Alternatively a different embodiment of Mode R of combinatorial encoding could be sending other than the shortest possible value of n, for example here n=8 which would bring the position to the end of the data. The number of patterns of two positions among eight however is $_8C_2$, which is 28 and the second symbol string code will be $s_{28}$. Two alternative codes for 'e' are therefore firstly (6, $s_5$) followed by (4, $s_0$) where so may not be transmitted, or secondly (8, $s_{28}$).

It may depend on the statistics of a particular encoding task and the methods chosen to code n and s whether one of these is more efficient than the other. There is a third feasible code for 'e' which one skilled in the art may recognize as (7, $s_{21}$) followed by (3, $s_0$). Any one of these codes might be used in embodiments of Mode R of combinatorial encoding and claimed subject matter is not limited to these or any other choices.

Returning to the example embodiment of Mode R of combinatorial encoding, the encoder then moves to the symbol 't' which occurs three times, at positions 1, 4, and 8. Recalling that the number of occurrences is specified as r=2, this may illustrate the use of one symbol string code pair for the first r=2 specified occurrences of 't', and a second symbol string code taking encoding to the end of the data in which there is only one 't' occurring. To encode the first two occurrences of 't', the first symbol string code could be any value of n from 4 to 7, because all of those lengths contain two occurrences of 't'. For convenience the shortest value is taken, although claimed subject matter is not limited to any particular choice of n where several are available. The decoder may know from n=4 that position 4 is a 't', so that a pattern code $s_3$ may select one of the three possible patterns of one position from three.

Having encoded the specified r=2 occurrences of 't', the encoder is now at position 5 in the data, and by coding n=5 the encoder may indicate that there is one further occurrence of a 't', because n=5 carries it one position beyond the end of the data. Also, no second symbol string code s is required by an intelligent decoder because there is only one possible pattern of one position occupied among one possible position for the final 't'. Therefore a possible code for 't' is (4, $s_3$) followed by (5, $s_0$)

To summarize, in this example embodiment of Mode R of combinatorial encoding the complete code is h: (9, $s_8$)
space: (9, $s_8$)
s: (9, $s_8$).
e: (6, $s_5$) followed by (4, $s_0$)
t: (4, $s_3$) followed by (5, $s_0$).

In the above second illustrative example of Mode R of combinatorial encoding, an encoding of a symbol string ends if the end of the data is reached exactly or indicated by over-running the end of the data in cases where there are insufficient occurrences of a symbol string to provide the specified r occurrences. There are a number of alternative methods of determining where a symbol string has been encoded, and claimed subject matter is not limited to any particular method of indicating or detecting the end of processing of a symbol string and the commencement of processing a new symbol string. Nevertheless, a method using an 'escape' or ESC symbol is described below. Also, Monro in co-pending U.S. patent application Ser. Nos. 11/777,022, 11/777,100 and 11/777,130 teaches several methods of detecting the end of processing of a symbol string. In an embodiment of Mode R of combinatorial encoding, several methods of indicating or detecting the end of processing of a symbol string and the commencement of processing a new symbol string could be employed. Claimed subject matter is not limited to these or any other method of indicating or detecting the end of processing of a symbol string and the commencement of processing a new symbol string.

In other embodiments of Mode R of combinatorial encoding, the symbols to be encoded could have been selected in any order, and at this point in the explanation of the presently illustrated embodiment no particular method of selection has been shown to be preferred; however it will now be shown that the order of selection can affect compression performance, in various embodiments.

In one embodiment of Mode R of combinatorial encoding, compression may be improved still further by a method analogous to "significance switching." More specifically, here, for each successive symbol string that is encoded, remaining positions to be encoded become fewer as the positions of more and more symbol strings become determined. This additional information regarding position may be employed to provide additional compression.

It is noted that, in some instances, as soon as a symbol has been encoded, the number of unknown positions is reduced. In this second illustrative example embodiment of Mode R of combinatorial encoding, this can be illustrated by putting 'x' for a known position that can be skipped, '0' for an unknown position and '1' for the positions of the symbol string that is being encoded, as follows:

| 0100 0000 | 0x01 0000 | 0x0x 0010 | 0x1x 01x0 | 1xxx 1xx1 |
|---|---|---|---|---|
| Scan for h | Scan for space | Scan for s | Scan for e | Scan for 't' |

Third Example Mode R

An advantage may be gained in a third illustrative example embodiment of Mode R of combinatorial encoding by taking account of the reduction in the number of unknown data position, by skipping over the unknown positions if n is determined and the pattern s is encoded, again specifying r=2 for the purposes of illustration, In encoding 'h' in this third example illustrative embodiment of Mode R of combinatorial encoding, no positions are previously known so that there is no difference in the encoding. Therefore to indicate that there is only one occurrence of 'h' which is insufficient to satisfy the specified value of r=2, the first symbol string code is taken as n=9 as before. This may tell a decoder in this embodiment that there is only one occurrence of 'h', and the second symbol string code $s_8$ may indicate a selection of one of the eight possible patterns of one 'h' among eight symbols.

However, in moving on to encoding 'space', both an encoder and decoder may know, in this third illustrative example embodiment of Mode R of combinatorial encoding, that there are only seven unknown positions. To indicate that there is only one occurrence of 'space' in these seven positions, an encoder uses n=8. So that the selected pattern can be based on one bit from the seven unknown bits, i.e. one pattern from $_7C_1=7$ may be selected by $s_7$. The theoretical cost of this is therefore reduced to $\log_2 7=2.8$ bits from the three bits that it was in the second illustrative embodiment of Mode R of combinatorial encoding. There is no such thing as 0.8 of a bit, of course, but on average in a long message it may be possible to achieve this by using an efficient method of coding s. Similarly in encoding 's', there are six unknown positions but only one occurrence of 's', so n=7 is encoded. A number of combinations to select the pattern from may be reduced again, to $_6C_1=6$, with a theoretical cost of $\log_2 6=2.6$ bits compared with three bits in the second illustrative example embodiment of Mode R of combinatorial encoding.

A large advantage of this Skipping approach can now be seen in encoding the two occurrences of 'e'. There are now five unknown positions, with the second 'e' as the fourth of these. To encode the two positions of 'e', n is encoded as 4, and one of $_3C_1=3$ patterns is to be selected with an expected cost of $\log_2 3=1.6$ bits. Compared to the previous second illustrative example embodiment of Mode R of combinatorial encoding in which the data length was always eight, this has been reduced from five patterns which would have cost an expected $\log_2 5=2.3$ bits. It remains necessary to move to the end of the data to indicate the end of processing of the symbol string 'e', for which there is only one unknown position. Encoding n=3 may indicate that there are no more 'e' symbols by moving the position 2 places beyond the end of the data, followed in principle by so, which as in particular embodiments may not be transmitted as it is always one. In the second illustrative example embodiment of Mode R of combinatorial encoding previously, this was indicated by n=4 followed by so, so an additional advantage may have been gained here, which would, however, depend on the statistics of n in the two embodiments.

An even larger advantage may be now gained. Assuming the encoder and decoder, in this particular embodiment of Mode R of combinatorial encoding, know that they have now reached the final symbol string, and that it is 't', then the cost of encoding the three occurrences of 't' is zero bits. Of course some method of knowing this is advantageous, as will be explained below.

The advantage of this Skipping approach with r=2 is clear from the summary below:

| Code | Theoretical s Cost without 'Skipping' (Second example embodiment) | Theoretical s Cost with 'Skipping' (Third example embodiment) |
|---|---|---|
| h | 9, $s_8$ | 3 | 3 |
| space | 8, $s_7$ | 3 | 2.8 |
| s | 7, $s_6$ | 3 | 2.6 |
| e | 4, $s_3$, 2, $s_0$ | 2.3 | 1.6 |
| t | — | 1.6 | 0 |

This of course is a very simple example, non-limiting, third illustrative example embodiment of Mode R of combinatorial encoding. In other embodiments, an encoder may choose symbol strings for encoding in order to reduce the cost of encoding the pattern selection s. In the example given A fourth illustrative example embodiment of combinatorial encoding is now introduced in which is considered how the selection of symbol strings by action 1020 of FIG. 1 might be made. This is done firstly for Mode N of combinatorial encoding, and then secondly for Mode R.

This may be by encoding the rarest symbols first but in a real application a more complex approach may be justified. This may not be a consideration in encoding binary data because the number of '0' patterns is always the same as the number of '1' patterns for any given value of the first code r, because the number of patterns with n–r bits is $_nC_{n-r}$ which is always the same as $_nC_r$.

Symbol String Selection

The discussion now returns to considerations that apply to the selection of symbol strings at action 1020 of FIG. 1 by either Mode N or Mode R of combinatorial encoding.

It is possible that, in one embodiment of combinatorial encoding, when the end of a symbol string group is determined by whichever technique, a decoder may not know what the next symbol string is to be. Such as, for example if the sequence of symbol strings to be coded has not been predetermined. In one embodiment of combinatorial encoding, the identity of the new symbol might be encoded as soon as the end of group occurs. This however is just one possibility and the technique is not to be limited in this respect. For example, in one embodiment of combinatorial encoding, the entire communication could be carried out without knowing what the symbol strings are. In one such embodiment, a decoder may simply assign its own choice of temporary tokens to be substituted with actual symbol strings at some future time.

However, it may also be desirable in some circumstances to employ a similar approach if the length of a set of data and/or number of symbol strings is not known. Various approaches may be possible in situations where the length of a set of data being coded, for example, is not known and claimed subject matter is not limited in scope to a particular approach. For example, in one embodiment of combinatorial encoding, this might be handled by having a standard length. Alternately in another embodiment, length information may be prefixed to coded information. However, if multiple sets of data are being encoded and most have the same length, to prefix length may be inefficient from a compression standpoint. Likewise, continuing with this notion, for a long communication of data, if a standard length is employed to sub-divide the data, variation from a standard length may, in one embodiment, be handled by communicating or encoding a set of data at the end smaller than the standard length.

One embodiment of combinatorial encoding may include partitioning the total length of a data set before encoding. If there is a standard partition length, an encoder and decoder may determine how many partitions there are, and the length of final partition if it is less than the standard length. For example in one embodiment, if a set of data 102 symbol strings long is being encoded and the standard length of a partition is five, then twenty-one partitions are present with the final one having a length of two. Again, as previously discussed, the total length may be included in the data code in many ways and the examples given are not intended to be restrictive. Claimed subject matter is intended to include these example approaches as well as other possible approaches.

Likewise, several approaches are also possible with respect to handling symbol strings. For example, as previously illustrated, in one embodiment of combinatorial encoding, a predetermined order of symbol strings may be employed. However, alternately, symbol strings may be ordered relative to their frequency of occurrence if known or capable of being determined or approximated. For example, using English simply as an illustrative example, this might the following order: 'e' 't' 'a' 'o' 'i' 'n' 's' 'h', or indeed the reverse of this order, and so on. A "space" may be included in such order as its statistics indicate in a sample. Also, there may be symbol strings that do not occur, which may form an empty symbol string group to be signalled. With such an approach, both an encoder and the decoder have an order of symbol strings.

Another approach may include an embodiment of combinatorial encoding in which encoders explicitly may prefix a set of data, for example, with a symbol string. Likewise in other embodiments, a symbol string may alternately be postfixed or otherwise embedded so that a decoder may make appropriate determinations from encoded data. It is likewise possible that, in other embodiments, a system may employ two modes, one in which a predetermined order of symbol strings is communicated and another in which symbol strings are prefixed or otherwise embedded. These modes could occur in any order and mode switching may be indicated, in one embodiment, by a special symbol used for that purpose.

Fourth Example

A set of symbol strings may be, in one embodiment of combinatorial encoding, evaluated with respect to a set of data in some order which may or may not be predetermined. Suppose, for the purpose of illustration, as a fourth example embodiment, symbol strings here have predetermined order 'e' 't' 'a' 'o' 'i' 'n' 's' 'h' 'r' 'd' 'space' 'l' 'u', Apart from the position assigned to 'space' this corresponds to the frequency of letter normally encountered in English text. After 'space' there are a further 16 letters to consider of which only the first two are shown here, although, of course, claimed subject matter is not limited in scope to this example or to any particular example.

Fourth Example

Symbol String Jumping—Mode N

For this particular fourth example embodiment of Mode N of combinatorial encoding, a technique is desired to indicate that there are no instances of a symbol string. One way of doing this, in a particular embodiment, would be to code r as zero whenever a symbol string does not occur. Applied to the previous third example of Mode N of combinatorial encoding (in which the data block is the phrase "the test"), and taking the symbol strings in this order, the code becomes:

2, $s_e$, 3, $s_t$, 0, 0, 0, 0, 1, $s_s$, 1, $s_h$, 0, 0, 1, $s_{space}$, 0, 0, 0, In doing so, while it may be reasonable to code r=0 to jump over a reasonable number of symbol strings, the advantage of ordering the symbols to reduce the total cost of sending s for each symbol string has been lost. Instead, one embodiment might take the symbols in REVERSE order, becoming . . . 0, 0, 0, 1, $s_{space}$, 0, 0, 1, $s_h$, 1, $s_s$, 0, 0, 0, 0, 3, $s_t$, 2, $s_e$ Or, omitting the 'e' as being the final symbol . . . 0, 0, 0, 1, $s_{space}$, 0, 0, 1, $s_h$, 1, $s_s$, 0, 0, 0, 0, 3, $s_t$ In general, in instances where data is sparse, there may be many empty symbol string groups, and it can be wasteful to send a long sequence of the r=0 codes to indicate the successive empty symbol string groups.

An improvement might be made, in one embodiment of Mode N of combinatorial encoding, by introducing a further symbol to be used in the symbol string code positions where r is expected, which we might call ESC1. ESC1 may always be followed by a symbol j indicating an integer value, which may represent a number of symbol strings to jump. If j were 0, no symbol strings may be skipped. A value of j>0 may, in this embodiment, jump forward through the symbol string sequence and a value of j<0 may, in one embodiment, move through the symbol string sequence backwards. Continuing the current second example of Mode N of combinatorial encoding (in which the data block is the phrase "the test"), and assuming that the text which is being encoded consists only of the twenty-six letters of the English alphabet plus 'space', it is noted that when scanning the symbols in reverse order of frequency of occurrence in normal English, sixteen are not used. The example can therefore be prefixed by ESC1 16. The example embodiment with ESC1 used in place of multiple values of r=0 is:

ESC1, 16, 1, $s_{space}$, ESC1, 2, 1, $s_h$, 1, $s_s$, ESC1, 4, 3, $s_t$

Assuming it is better however to code 'e' before 't', the embodiment may use ESC1 to jump backwards:

ESC1, 16, 1, $s_{space}$, ESC1, 2, 1, $s_h$, 1, $s_s$, ESC1, 5, 2, $s_e$, ESC1, -1, 3, $s_t$ ESC1 may also be used, in one embodiment of Mode N of combinatorial encoding, to jump to the end of a list of symbols, or in the case where the order is not predetermined, two ESC1 symbols in a row could be used, in one embodiment of Mode N of combinatorial encoding, to indicate that the coding is finished, allowing the decoder to fill out any unknown positions with the final symbol string selected. ESC1 may, in one embodiment of Mode N of combinatorial encoding, provide a mechanism for jumping through a predetermined list of symbol strings. There are many variations that could be used, and claimed subject matter is not to be limited to any particular effect of ESC1. It is also understood that ESC1, may be represented by any symbol or indication and is not limited to a particular encoding.

In further embodiments of Mode N of combinatorial encoding, a further Escape symbol ESC2 may be introduced to occur in the positions where either or both of r or ESC1 are expected, after which a symbol string could be given explicitly. This may be used with or without a predetermined order of selecting symbol strings. In embodiments of Mode N of combinatorial encoding, without a predetermined order it could before every symbol string specify the symbol string that comes next. If used with embodiments with a predetermined order ESC2 could be used to take a symbol string out of order, after which the scanning might, in some embodiments of Mode N of combinatorial encoding, continue in order, of after which the scanning might return to the next symbol string it might have taken had the ESC2 not been given. ESC2 may be used in some embodiments of Mode N of combinatorial encoding as a mechanism for forcing a particular symbol string to be selected. There are many variations that could be used, and the subject matter is not to be limited to any particular effect of ESC2. It is also understood that ESC2, may be represented by any symbol or indication and is not limited to a particular encoding.

Any form or type of encoding to encode values of r or s or ESC1 or j or ESC2 and claimed subject matter is not limited to a particular form or type. For example in some embodiments of Mode N of combinatorial encoding, a Huffman encoder, a Golomb coder, a binary arithmetic coder, or other techniques including those as yet undisclosed might be employed, to provide a few examples. Of course, these are simply examples and claimed subject matter is not limited in scope to such examples.

Fourth Example

Symbol String Jumping—Mode R

Returning now to Mode R of combinatorial encoding, as before in this particular fourth example embodiment, a technique is desired to indicate that there are no instances of a symbol string. One way of doing this, in a particular embodiment of Mode R of combinatorial encoding, would be to code n as zero whenever a symbol string does not occur. Applied to the previous third illustrative example embodiment of Mode R of combinatorial encoding (in which the data block is the phrase "the test" and skipping of previously determined position has been used), and taking the symbol strings in this different order, the code becomes:

(6, $s_5$), (4, $s_0$), 0. 0. 0. 0. (4, $s_3$), (3, $s_2$), 0, 0, (2, $s_1$), 0, 0

In doing so, while it may be reasonable to code n=0 to jump over a reasonable number of symbol strings, the advantage of ordering the symbols to reduce the total cost of sending s for each symbol string has been lost. Instead, one embodiment of Mode R of combinatorial encoding might take the symbols in REVERSE order, becoming ... 0, 0, 0, (9, $s_8$), 0, 0, (8, $s_7$), (7, $s_6$), , 0, 0, 0, 0, (3, $s_2$), (3,$s_2$), (2, $s_1$), (2,$s_0$)

(space)   ( h )( s )    ( t )( e )

Or, omitting the 'e' as being the final symbol

... 0, 0, 0, (9, $s_8$), 0, 0, (8, $s_7$), (7, $s_6$), , 0, 0, 0, 0, (3, $s_2$), (3,$s_2$)

(space)   ( h )( s )    ( t )

In general, in instances where data is sparse, there may be many empty symbol string groups, and it can be wasteful to send a long sequence of the r=0 codes to indicate the successive empty symbol string groups.

An improvement might be made, in one embodiment of Mode R of combinatorial encoding, by introducing a further symbol to be used in the symbol string code positions where n is expected, which we might call ESC1. ESC1 may always be followed by a symbol j indicating an integer value, which is the number of symbol strings to jump. If j were 0, that would be the same as j=0. A value of j>0 may, in this embodiment, jump forward through the symbol string sequence and a value of j<0 would, in one embodiment, move through it backwards. Continuing the previous example (in which the data block is the phrase "the test"), and assuming that the text which is being encoded consists only of the twenty-six letters of the English alphabet plus 'space', it is noted that if scanning the symbols in reverse order of frequency of occurrence in normal English, sixteen are not used. The example can therefore be prefixed by ESC1 16. The example embodiment with ESC1 used in place of multiple values of r=0 is:

ESC1, 16, (9, $s_8$), ESC1, 2, (8, $s_7$), (7, $s_6$), ESC1, 4, (3, $s_2$), (3,$s_2$), (space)   ( h )( s )    ( t )

Assuming it is better however to code 'e' before 't', the embodiment could use ESC1 to jump backwards:

ESC1, 16, (9, $s_8$), ESC1, 2, (8, $s_7$), (7, $s_6$), ESC1, 4, (4, $s_2$), (3,$s_0$), (space)   ( h )( s )    ( e )

ESC1 could also be used, in one embodiment of Mode R of combinatorial encoding, to jump to the end of a list of symbols, or in the case where the order is not predetermined, two ESC1 symbols in a row could be used, in one embodiment, to indicate that the encoding is finished, allowing the decoder to fill out any unknown positions with the final symbol string selected. ESC1 may, in one embodiment, provide a mechanism for jumping through a predetermined list of symbol strings. There are many variations that could be used, and the subject matter is not to be limited to any particular effect of ESC1. It is also understood that ESC1, may be represented by any symbol or indication and is not limited to a particular encoding.

In further embodiments of Mode R of combinatorial encoding, a further Escape symbol ESC2 could be introduced to occur in the positions where either or both of n or ESC1 are expected, after which a symbol string could be given explicitly. This could be used with or without a predetermined order of selecting symbol strings. In embodiments, without a predetermined order it could before every symbol string specify the symbol string that comes next. If used with embodiments with a predetermined order ESC2 could be used to take a symbol string out of order, after which the scanning might, in some embodiments, continue in order, of after which the scanning might return to the next symbol string it might have taken had the ESC2 not been given. ESC2 may be used in some embodiments as a mechanism for forcing a particular symbol string to be selected. There are many variations that could be used, and claimed subject matter is not to be limited to any particular effect of ESC2. It is also understood that ESC2 may be represented by any symbol or indication and is not limited to a particular encoding.

Any form or type of encoding to code the values of n or s or ESC1 or j or ESC2 and claimed subject matter is not limited to a particular form or type. For example in some embodiments, a Huffman encoder, a Golomb encoder, a binary arithmetic encoder, or other methods including those as yet undisclosed might be employed, to provide a few examples. Of course, these are simply examples and claimed subject matter is not limited in scope to such examples.

Symbol String Selection

In still another possible embodiment, an encoder and decoder may adopt a method of constructing new symbol strings from symbol strings already received. This level of flexibility may permit an encoder to select or change symbol strings and modes of communication to improve compression. In an example embodiment, it might well be the case that not all predefined symbol strings are used, in which case, to avoid signalling a large number of empty groups by repeating the ESC1 j symbols, there might be a new symbol string which signals "No More Groups" or "End of Data", for example. This possibility was introduced above as was the possibility that two successive occurrences of the ESC1 symbol might serve this purpose.

In some embodiments, side information might accompany a data set. For example, in the case of text, font, size, weight, colour and/or style might comprise such side information. This may be communicated or encoded any number of ways. In one embodiment, side information may be inserted in encoded data in any position so that a decoder may appropriately associate it with a symbol string. In another embodiment, it might be desirable to handle side information combined with a symbol string as a symbol string itself, hence forming additional groups. For example, an italic 'e' may form a separate symbol string from normal 'e', as one simple example. Likewise, in an embodiment, a special symbol may be employed to switch between different embedding styles or approaches, if desired.

Embodiments in accordance with claimed subject matter may be applied to encoding of data of all types, including non-numeric data, such as symbolic data, for example, converted into numerical form by any convenient mapping prior to application of encoding. As is noted, some embodiments may perform well for run length encoding, although it will, of course, be understood that claimed subject matter is not limited to that application. It is intended that embodiments of claimed subject matter be applied to any one of a number of different types of data encoding. Therefore, claimed subject matter is not intended to be limited in terms of the type of data to which it may be applied.

Figure 3:
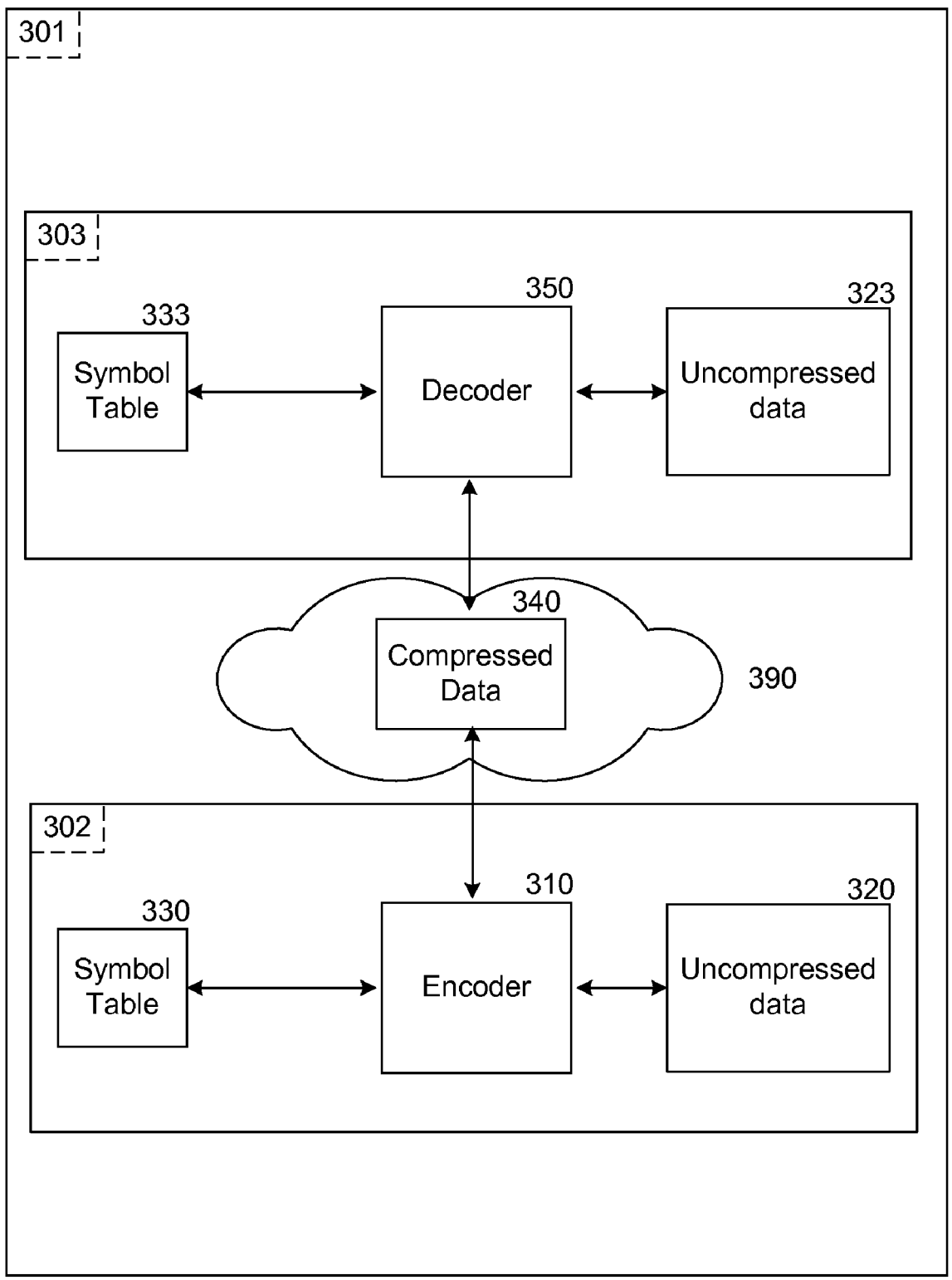
FIG. 3 is a schematic diagram illustrating an example embodiment of a system and an apparatus.

FIG. 3 is a block diagram illustrating an example embodiment of a system 301 comprising an encoding apparatus 302 and a decoding apparatus 303. In one embodiment, the system may include the encoding apparatus, the decoding apparatus and a wireless network 390. Other embodiments may comprise one or more other network types, and/or one or more other interconnection medium.

In one embodiment, encoding apparatus 302 may include an encoder 310 which may be capable of performing the example embodiments described above and illustrated in FIGS. 1 & 2. Encoder 310 may take uncompressed data 320 and encode it, or a portion of it, into compressed data 340. In one embodiment, the encoding may be facilitated by a symbol table 330. In one embodiment, the encoder apparatus may transmit the compressed data to a decoder apparatus. For an embodiment, encoder 310 may comprise a symbol string selector capable of selecting a symbol string to encode, and may also comprise a first symbol string code generator capable of generating a first symbol string code indicative of a length of data containing a specified number of occurrences of the selected symbol string. Encoder 310 may further comprise a second symbol string code generator capable of generating a second symbol string code indicative of the pattern of occurrences of the selected symbol string, as well as a combiner capable of combining the first and second symbol string codes into a compressed data code. However, this is merely an example embodiment of a coder, and the scope of claimed subject matter is not limited in this respect.

In one embodiment, the decoding apparatus 303 may include a decoder 350, which may be capable of performing the reverse of the example embodiments described above and illustrated in FIGS. 1 & 2. Decoder 350 may take compressed data 340 and decode it, or a portion of it, into uncompressed data 323. In one embodiment, the decoding may be facilitated by a symbol table 333. In one embodiment, the decoder apparatus may receive the compressed data from an encoder apparatus.

It is noted, of course, that claimed subject matter is not limited to particular embodiments. Therefore, in addition to covering methods for coding and/or decoding of data, claimed subject matter is also intended to cover, for example, software incorporating such methods and to coders and/or decoders (whether implemented in hardware or software, or a combination of hardware and software). Claimed subject matter is also intended to include a video or audio codec embodying such methods and/or a video or audio compression system whereby data may be encoded according to a method as described or claimed. For example, embodiments may include transmitting data across a communications channel for reconstruction be a decoder at the far end. Likewise, alternatively, in another embodiment in accordance with claimed subject matter coded data may be stored rather than transmitted. Thus, claimed subject matter is intended to cover these as well as other embodiments.

Embodiments described herein are not limited to any particular hardware or software configuration; they may find applicability in any computing or processing environment. Embodiments may be implemented in hardware, software, firmware or a combination thereof. Embodiments may be implemented in programs executing on programmable machines such as mobile or stationary computers, personal digital assistants, and/or similar devices that each include a processor, a storage medium readable or accessible by the processor (including volatile and non-volatile memory and/or storage elements), at least one input device, and one or more output devices. Program code may be applied to data entered using the input device to perform the functions described and to generate output information. The output information may be applied to one or more output devices.

Programs may be implemented in a high level procedural or object oriented programming language to communicate with a processing system. Programs may also be implemented in assembly or machine language.

A program may be stored on a storage medium or device, e.g. compact disk read only memory (CD-ROM), digital versatile disk (DVD), hard disk, firmware, non-volatile memory, magnetic disk or similar medium or device, that is readable by a general or special purpose programmable machine for configuring and operating the machine if the storage medium or device is read by the computer to perform the procedures described herein. The system may also be considered to be implemented as a machine-readable or accessible storage medium, configured with a program, where the storage medium so configured causes a machine to operate in a specific manner. Other embodiments are within the scope of the following claims.

Figure 4:
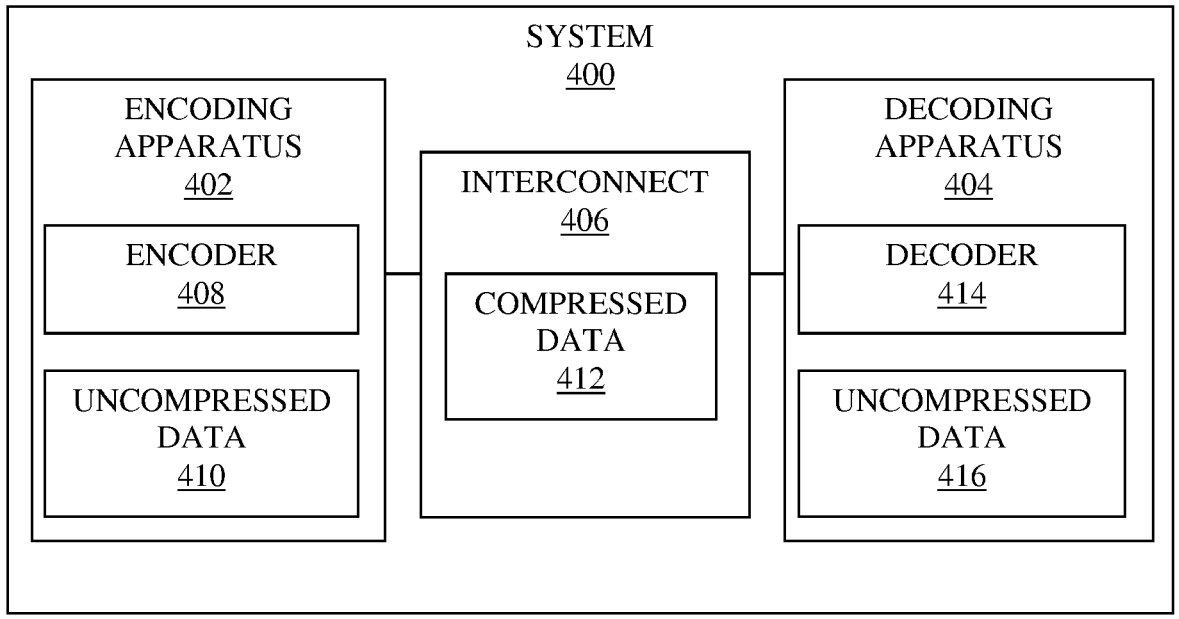
FIG. 4 is a schematic diagram of an example embodiment of a system comprising an encoding apparatus and a decoding apparatus coupled via an interconnect.

FIG. 4 is a block diagram illustrating an example embodiment of a system 400 comprising an example embodiment of an encoding apparatus 402 and a decoding apparatus 404 in accordance with claimed subject matter. In one embodiment, system 400 may include encoding apparatus 402, decoding apparatus 404 and an interconnect 406. An interconnect may comprise, for example, one or more portions of a network, an interconnect between two or more devices in a computing platform, an interconnect between functional units of a device and/or an interconnect between two dies sharing a single package, as just a few examples. For example, system 400 may have encoding apparatus 402 and decoding apparatus 404 located within a single device and performing communications within the device.

In an embodiment, encoding apparatus 402 may include an encoder 408 which may be capable of performing one or more techniques as described above and/or as illustrated in FIGS. 1-3. As part of the technique, encoder 408 may take uncompressed data 410 (e.g. stored in a memory) and encode it, or a portion of it, into compressed data 412. In one embodiment, encoding apparatus 402 may transmit compressed data 412 to decoding apparatus 404, such as within a single device, over an interconnect, and/or the like.

In an embodiment, decoding apparatus 404 may include a decoder 414, which may be capable of performing one or more techniques as described above and/or as illustrated in FIGS. 1-3. As part of the technique decoder 414 may take compressed data 412 and decode it, or a portion of it, into uncompressed data 416. System 400 described above is not limited to any particular hardware or software configuration and all or part of system 400 may find applicability in any computing or processing environment such as is described below in connection with FIG. 5, for example.

Figure 5:
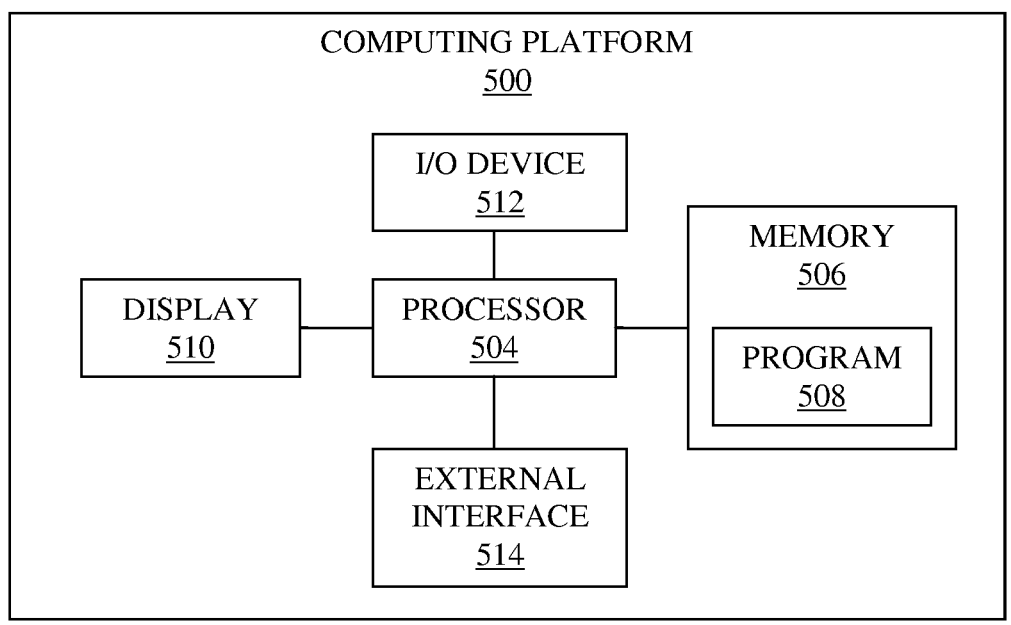
FIG. 5 is a schematic diagram of an example embodiment of a computing platform.

Referring to FIG. 5, a block diagram of a an example computing platform 500 according to one or more embodiments is illustrated, although the scope of claimed subject matter is not limited in this respect. Computing platform 500 may include more and/or fewer components than those shown in FIG. 5. However, generally conventional components may not be shown, for example, a battery, a bus, and so on.

Computing platform 500, as shown in FIG. 5 may be utilized to embody tangibly a computer program and/or graphical user interface by providing hardware components on which the computer program and/or graphical user interface may be executed. Computing platform 500 may be utilized to embody tangibly all or a portion of embodiments described herein. Such a procedure, computer program and/or machine readable instructions may be stored tangibly on a computer and/or machine readable storage medium such as a compact disk (CD), digital versatile disk (DVD), flash memory device, hard disk drive (HDD), and so on. As shown in FIG. 5, computing platform 500 may be controlled by processor 504, including one or more auxiliary processors (not shown). Processor 504 may comprise a central processing unit such as a microprocessor or microcontroller for executing programs, performing data manipulations, and controlling the tasks of computing platform 500. Auxiliary processors may manage input/output, perform floating point mathematical operations, manage digital signals, perform fast execution of signal processing algorithms, operate as a back-end processor and/or a slave-type processor subordinate to processor 504, operate as an additional microprocessor and/or controller for dual and/or multiple processor systems, and/or operate as a coprocessor and/or additional processor. Such auxiliary processors may be discrete processors and/or may be arranged in the same package as processor 504, for example, in a multicore and/or multithreaded processor; however, the scope of the scope of claimed subject matter is not limited in these respects.

Communication with processor 504 may be implemented via a bus (not shown) for transferring information among the components of computing platform 500. A bus may include a data channel for facilitating information transfer between storage and other peripheral components of computing platform 500. A bus further may provide a set of signals utilized for communication with processor 504, including, for example, a data bus, an address bus, and/or a control bus. A bus may comprise any bus architecture according to promulgated standards, for example, industry standard architecture (ISA), extended industry standard architecture (EISA), micro channel architecture (MCA), Video Electronics Standards Association local bus (VLB), peripheral component interconnect (PCI) local bus, PCI express (PCIe), hyper transport (HT), standards promulgated by the Institute of Electrical and Electronics Engineers (IEEE) including IEEE 488 general-purpose interface bus (GPIB), IEEE 696/S-100, and so on, although the scope of the scope of claimed subject matter is not limited in this respect.

Other components of computing platform 500 may include, for example, memory 506, including one or more auxiliary memories (not shown). Memory 506 may provide storage of instructions and data for one or more programs 508 to be executed by processor 504, such as all or a portion of embodiments described herein, for example. Memory 506 may be, for example, semiconductor-based memory such as dynamic random access memory (DRAM) and/or static random access memory (SRAM), and/or the like. Other semiconductor-based memory types may include, for example, synchronous dynamic random access memory (SDRAM), Rambus dynamic random access memory (RDRAM), ferroelectric random access memory (FRAM), and so on. Alternatively or additionally, memory 506 may be, for example, magnetic-based memory, such as a magnetic disc memory, a magnetic tape memory, and/or the like; an optical-based memory, such as a compact disc read write memory, and/or the like; a magneto-optical-based memory, such as a memory formed of ferromagnetic material read by a laser, and/or the like; a phase-change-based memory such as phase change memory (PRAM), and/or the like; a holographic-based memory such as rewritable holographic storage utilizing the photorefractive effect in crystals, and/or the like; and/or a molecular-based memory such as polymer-based memories, and/or the like. Auxiliary memories may be utilized to store instructions and/or data that are to be loaded into memory 506 before execution. Auxiliary memories may include semiconductor based memory such as read-only memory (ROM), programmable read-only memory (PROM), erasable programmable read-only memory (EPROM), electrically erasable read-only memory (EEPROM), and/or flash memory, and/or any block oriented memory similar to EEPROM. Auxiliary memories also may include any type of non-semiconductor-based memories, including, but not limited to, magnetic tape, drum, floppy disk, hard disk, optical, laser disk, compact disc read-only memory (CD-ROM), write once compact disc (CD-R), rewritable compact disc (CD-RW), digital versatile disc read-only memory (DVD-ROM), write once DVD (DVD-R), rewritable digital versatile disc (DVD-RAM), and so on. Other varieties of memory devices are contemplated as well.

Computing platform 500 further may include a display 510. Display 510 may comprise a video display adapter having components, including, for example, video memory, a buffer, and/or a graphics engine. Such video memory may be, for example, video random access memory (VRAM), synchronous graphics random access memory (SGRAM), windows random access memory (WRAM), and/or the like. Display 510 may comprise a cathode ray-tube (CRT) type display such as a monitor and/or television, and/or may comprise an alternative type of display technology such as a projection type CRT type display, a liquid-crystal display (LCD) projector type display, an LCD type display, a light-emitting diode (LED) type display, a gas and/or plasma type display, an electroluminescent type display, a vacuum fluorescent type display, a cathodoluminescent and/or field emission type display, a plasma addressed liquid crystal (PALC) type display, a high gain emissive display (HGED) type display, and so forth, although the scope of claimed subject matter is not limited in this respect.

Computing platform 500 further may include one or more I/O devices 512. I/O device 512 may comprise one or more I/O devices 512 such as a keyboard, mouse, trackball, touch-pad, joystick, track stick, infrared transducers, printer, modem, RF modem, bar code reader, charge-coupled device (CCD) reader, scanner, compact disc (CD), compact disc read-only memory (CD-ROM), digital versatile disc (DVD), video capture device, TV tuner card, touch screen, stylus, electroacoustic transducer, microphone, speaker, audio amplifier, and/or the like.

Computing platform 500 further may include an external interface 514. External interface 514 may comprise one or more controllers and/or adapters to prove interface functions between multiple I/O devices 512. For example, external interface 514 may comprise a serial port, parallel port, universal serial bus (USB) port, and IEEE 1394 serial bus port, infrared port, network adapter, printer adapter, radio-frequency (RF) communications adapter, universal asynchronous receiver-transmitter (UART) port, and/or the like, to interface between corresponding I/O devices 512. External interface 514 for an embodiment may comprise a network controller capable of providing an interface, directly or indirectly, to a network, such as, for example, the Internet.

What is claimed is:

1. A method comprising:
    selecting a symbol string to encode from a portion of data to encode;
    determining an estimated probability of said selected symbol string; and
    selecting an encoding technique for encoding at least part of said selected symbol string from among two or more encoding techniques based, at least in part, on said estimated probability, said encoding techniques include at least one combinatorial encoding technique, wherein if a combinatorial encoding technique is selected for encoding said at least part of said symbol string, the method further comprises:
    generating a first symbol string code;
    generating a second symbol string code indicative of a pattern of occurrences of said selected symbol string; and
    combining said first and second symbol string codes into a compressed data code.

2. The method of claim 1, and further comprising:
    selecting from among encoding techniques including Huffman and Golomb encoding techniques if a combinatorial encoding technique is not be used for encoding said selected symbol string.

3. The method of claim 1, wherein said generating said first symbol string code comprises:
    determining a selected length of data from said portion of data; and
    determining a number of occurrences of said selected symbol string in said selected length of data,
    and wherein said second symbol string code is indicative of said number of occurrences.

4. The method of claim 3, and further comprising selecting said selected length of data based, at least in part, on said probability.

5. The method of claim 1, wherein said generating said first symbol string code comprises:
    determining a specified number of occurrences of said selected symbol string in said selected data length; and
    determining a length of data of said selected portion containing said specified number of occurrences of said selected symbol string,
    and wherein said second symbol string code is indicative of said length of data.

6. The method of claim 5, and further comprising selecting said specified number of occurrences based, at least in part, on said probability.

7. The method of claim 1, wherein said selected symbol string comprises binary symbols.

8. An article comprising:
    a storage medium comprising machine-readable instructions stored thereon which are executable by a computing platform to:
    select a symbol string to encode from a portion of data to encode;
    determine an estimated probability of said selected symbol string;
    select an encoding technique for encoding at least part of said selected symbol string from among two or more encoding techniques based, at least in part, on said estimated probability, said encoding techniques include at least one combinatorial encoding technique; and if a combinatorial encoding technique is selected for encoding said at least part of said symbol string said instructions:
    generate a first symbol string code;
    generate a second symbol string code indicative of a pattern of occurrences of said selected symbol string; and
    combine said first and second symbol string codes into a compressed data code.

9. The article of claim 8, wherein said instructions are further executable by said computing platform to:
    select from among encoding techniques including Huffman and Golomb encoding techniques if a combinatorial encoding technique is not be used for encoding said selected symbol string.

10. The article of claim 9, wherein said instructions are further executable by said computing platform to:
    determine a specified number of occurrences of said selected symbol string in said selected data length; and
    determine a length of data of said selected portion containing said specified number of occurrences of said selected symbol string,
    and wherein said second symbol string code is indicative of said length of data.

11. The article of claim 10, wherein said instructions are further executable by said computing platform to select said specified number of occurrences based, at least in part, on said probability.

12. The article of claim 8, wherein said instructions are further executable by said computing platform to:
    determine a selected length of data from said portion of data; and
    determine a number of occurrences of said selected symbol string in said selected length of data,
    and wherein said second symbol string code is indicative of said number of occurrences.

13. The article of claim 8, wherein said selected symbol string comprises binary symbols.

14. An apparatus comprising:
    a memory to store uncompressed data; and
    an encoder, said encoder being adapted to:
    select a symbol string to encode from a portion of data to encode;
    determine an estimated probability of said selected symbol string;
    select an encoding technique for encoding at least part of said selected symbol string from among two or more encoding techniques based, at least in part, on said estimated probability, said encoding techniques include at least one combinatorial encoding technique, wherein if a combinatorial encoding technique is selected for encoding said at least part of said symbol string said instructions, said encoder is further adapted to:

generate a first symbol string code;

generate a second symbol string code indicative of a pattern of occurrences of said selected symbol string; and combine said first and second symbol string codes into a compressed data code.

15. The apparatus of claim 14, wherein said encoder is further adapted to:

select from among encoding techniques including Huffman and Golomb encoding techniques if a combinatorial encoding technique is not be used for encoding said selected symbol string.

16. The apparatus of claim 14, wherein said encoder is further adapted to:

determine a selected length of data from said portion of data; and determine a number of occurrences of said selected symbol string in said selected length of data, and wherein said second symbol string code is indicative of said number of occurrences.

17. The apparatus of claim 16, wherein said encoder is further adapted to:

determine a specified number of occurrences of said selected symbol string in said selected data length; and determine a length of data of said selected portion containing said specified number of occurrences of said selected symbol string, and wherein said second symbol string code is indicative of said length of data.

18. The apparatus of claim 17, wherein said encoder is further adapted to select said specified number of occurrences based, at least in part, on said probability.

19. A method comprising:

receiving an encoded symbol string;

determining which encoding technique of a plurality of encoding techniques is used to encode said encoded symbol string, said plurality of encoding techniques including at least one combinatorial encoding technique, wherein said encoding technique is selected based, at least in part, on a probability associated with said symbol string; and decoding at least a portion of said encoded symbol string based, at least in part, on said determined encoding technique, wherein if a combinatorial encoding technique is used to encode said encoded symbol string said decoding further comprising:

identifying first and second symbol string codes in a compressed data code in said encoded symbol string; and associating a pattern of occurrences of a selected symbol string associated with at least one of said first and second symbol string codes.

20. An apparatus comprising:

a decoder, said decoder being adapted to:

determine which encoding technique of a plurality of encoding techniques is used to encode said encoded symbol string, said plurality of encoding techniques including at least one combinatorial encoding technique, wherein said encoding technique is selected based, at least in part, on a probability associated with said symbol string, and decode at least a portion of said encoded symbol string based, at least in part, on said determined encoding technique, wherein if a combinatorial encoding technique is used to encode said encoded symbol string said decoder is further adapted to:

identify first and second symbol string codes in a compressed data code in said encoded symbol string; and associate a pattern of occurrences of a selected symbol string associated with at least one of said first and second symbol string codes; and a memory to store uncompressed data based, at least in part, on said decoded portion of said encoded symbol string.

* * * * *